(12) United States Patent
Araki et al.

(10) Patent No.: US 6,888,621 B2
(45) Date of Patent: May 3, 2005

(54) MASK-HOLDING APPARATUS FOR A LIGHT EXPOSURE APPARATUS AND RELATED SCANNING-EXPOSURE METHOD

(75) Inventors: Yasuo Araki, Yokohama (JP); Noriaki Tokuda, Kawasaki (JP); Masahiko Yasuda, Kawasaki (JP); Shinji Mizutani, Kawasaki (JP); Hiroaki Narushima, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/429,868

(22) Filed: May 6, 2003

(65) Prior Publication Data

US 2003/0197841 A1 Oct. 23, 2003

Related U.S. Application Data

(60) Division of application No. 10/377,737, filed on Mar. 4, 2003, which is a continuation of application No. 09/721,758, filed on Nov. 27, 2000, now abandoned, which is a continuation of application No. 09/385,963, filed on Aug. 30, 1999, now abandoned, which is a continuation of application No. 08/946,735, filed on Oct. 9, 1997, now abandoned, which is a continuation-in-part of application No. 08/821,529, filed on Mar. 21, 1997, now abandoned.

(30) Foreign Application Priority Data

| Mar. 22, 1996 | (JP) | 08-093145 |
| May 20, 1996 | (JP) | 08-148585 |
| Oct. 11, 1996 | (JP) | 08-289305 |
| Oct. 29, 1996 | (JP) | 08-303682 |
| Oct. 29, 1996 | (JP) | 08-303683 |
| Oct. 29, 1996 | (JP) | 08-303684 |

(51) Int. Cl.$^7$ .................. G03B 27/62; G03B 27/42; G03F 9/00
(52) U.S. Cl. .................. 355/75; 355/53; 430/5
(58) Field of Search .................. 355/75, 53, 30, 355/72, 76, 91, 93, 55; 430/5; 356/399, 400, 401

(56) References Cited

U.S. PATENT DOCUMENTS

| 3,488,120 | A | | 1/1970 | Nagel |
| 4,963,921 | A | | 10/1990 | Kariya et al. |
| 5,164,974 | A | | 11/1992 | Kariya et al. |
| 5,204,711 | A | * | 4/1993 | Takubo et al. ........ 355/53 |
| 5,253,012 | A | | 10/1993 | Chiba et al. |
| 5,296,893 | A | | 3/1994 | Shaw et al. |
| 5,742,376 | A | | 4/1998 | Makinouchi |
| 5,825,463 | A | | 10/1998 | Hara et al. |
| 5,883,703 | A | | 3/1999 | Knirck et al. |
| 5,894,056 | A | | 4/1999 | Kakizaki et al. |
| 6,172,738 | B1 | | 1/2001 | Korenaga et al. |

* cited by examiner

*Primary Examiner*—Peter B. Kim

(57) ABSTRACT

An exposure apparatus for exposing a substrate with an image of a pattern formed on a mask, including an illumination system or irradiation for illuminating or irradiating the mask with exposure light. A projection optical system is included for projecting, onto the substrate, an image of the pattern illuminated by the exposure light. The mask is securely supported on a movable mask stage. In one example, a mask holder is provided for supporting the mask from below. A pressing member is also included for applying, from above, a prescribed force to the mask, outside of the points supported by the mask holder.

37 Claims, 40 Drawing Sheets

| MASK THICKNESS | ΔZ | ΔX |
|---|---|---|
| 6.4 mm (0.25") | 0.6 μm | 35 nm |
| 3.0 mm (0.12") | 2.5 μm | 70 nm |
| 2.3 mm (0.09") | 4.5 μm | 95 nm |

MASK-HOLDING APPARATUS FOR A LIGHT EXPOSURE APPARATUS AND RELATED SCANNING-EXPOSURE METHOD

CROSS-REFERENCE TO RELATED APPLICATIONS

This is a divisional of U.S. Ser. No. 10/377,737, filed Mar. 4, 2003, now pending, which is a continuation of U.S. Ser. No. 09/721,758 filed on Nov. 27, 2000, now abandoned; which is a continuation of U.S. Ser. No. 09/385,963 filed Aug. 30, 1999, now abandoned; which is a continuation of U.S. Ser. No. 08/946,735 filed Oct. 9, 1997, now abandoned; which is a continuation-in-part of U.S. Ser. No. 08/821,529 filed on Mar. 21, 1997, now abandoned. This application claims the benefit of Japanese Patent Application No. 8-93145 filed on Mar. 22, 1996, No. 8-148585 filed on May 20, 1996, No. 8-289305 filed on Oct. 11, 1996, No. 8-303682 filed on Oct. 29, 1996, No. 8-303683 filed on Oct. 29, 1996 and No. 8-303684 filed on Oct. 29, 1996, the disclosures of which are incorporated herein by reference.

BACKGROUND OF THE INVENTION

Field of the Invention

The present invention relates to an exposure system for projection-exposing the image of a pattern formed in a mask (reticle) onto a substrate. More particularly, the present invention relates to an exposure system and mask-holding apparatus for fabrication of devices such as semiconductor integrated circuits and liquid crystal display elements.

In exposure systems used to fabricate devices such as semiconductor integrated circuits and liquid, crystal display elements; a mask is illuminated or irradiated by illumination light emitted from illumination optics to transfer the image of a pattern formed in the mask, through projection optics, onto a photosensitive substrate (wafer, etc.).

In recent years there have been substantial increases in the levels of integration (circuit density) of semiconductor devices. This has imposed increasingly strict requirements on the systems used to fabricate these devices. These include requirements for finer detail in the patterns formed on the wafers, and for more layers of superimposed patterns exposed on one wafer. In other words, these systems are required to form extremely fine-line width patterns in the exposure mask, and to expose multiple superimposed layers of different patterns on the wafer (semiconductor substrate) in precise registration.

To accommodate these finer mask patterns, exposure systems are now using projection optics with higher numerical apertures (NA=0.55–0.6); and are using shorter-wavelength exposure light ($\lambda$=248 nm, etc.).

Both of these actions, however, decrease the depth of focus, DF, at the wafer plane. The relationship between depth of focus, DF, and light wavelength, $\lambda$, is expressed by the following equation (A):

$$DF=k_2 \times \lambda/(NA)2 \tag{A}$$

where $k_2$ is a proportionality constant.

FIG. 29 shows a mask support mechanism in a conventional type of exposure system. As shown in FIG. 29, a mask 112 is supported in a horizontal state by a mask holder 111. Provided on the mask holder 111 are fixtures (platens) 114 and 116, to which the mask 112 is held fast by vacuum-induced suction.

In such prior mask support mechanisms, however, the mask 112 is supported only at its outer edge. This arrangement caused the mask to sag from its own weight, as shown in FIG. 30(A).

When the mask pattern is exposed on a wafer, this sag causes problems with lateral distortion of the pattern image, curvature of the image plane, and reduced depth of focus.

The effects of such mask sag will be discussed further with reference to FIG. 31. As shown in FIG. 31, the sagging of the mask under its own weight produces a displacement $\Delta Z$ in the focusing direction (the Z direction of the optical axis of the projection optics), and a displacement $\Delta X$ (and $\Delta Y$) in a plane perpendicular to the Z axis (a horizontal plane). The reduced depth of focus due to today's high NA projection optics and short wavelength exposure light, however, has made the tolerance range for displacement in the focusing direction ($\Delta Z$) extremely small. Also, in order to obtain the required overlay precision between layers of patterns formed on the wafer, the $\Delta X$ ($\Delta Y$) tolerance, the tolerance for shifting in the horizontal plane of the mask, must also be extremely tight.

The amount of sag in the mask 112 due to its own weight is mainly a function of the thickness and size (area) of the mask. FIG. 32 shows the results of calculations to determine how $\Delta Z$ and $\Delta X$ (the displacements of the pattern of the mask 112 in the Z and X directions) are influenced by mask thickness. For these calculations, the mask 112 was assumed to be made of transparent quartz and supported in two places at its outer edge. The exposure light was assumed to be in the ultraviolet to deep ultraviolet range.

The 6.4 mm-thick (0.25-inch) masks now widely used in high-volume production, for example, would experience 0.6 $\mu$m of $\Delta Z$ displacement (displacement in the focusing direction), and 35 nm of $\Delta X$ displacement in the X direction. In comparison, a 2.3 mm-thick (0.09-inch) mask would have 4.5 $\mu$m of displacement in the focusing direction $\Delta Z$, and 95 nm of $\Delta X$ displacement. Thus if the projection optics has a reduction ratio of 1/5, and a 2.3 mm-thick mask is used, the displacement in the focusing direction ($\Delta Z$) would be 180 nm (4.5 gm/25) at the wafer.

Thus from equation (A), with an Wine light source used for exposure light ($\lambda$=0.365 $\mu$m), $k_2$=0.7, and NA=0.6, this 180 nm of displacement in the Z direction would take, up ¼ of the depth-of-focus tolerance. Under the same conditions, $\Delta X$, the mask displacement in the X direction (95 nm) would be 19 nm (95 nn/5). For a semiconductor device design using a 350-nm line width, this amount of displacement would consume more than 15% of the overlay tolerance usually required (⅓ of the line width).

If semiconductor devices continue to become larger at the rate they have been in recent years, it can be expected that the current mainstream mask size of six inches square could soon increase to seven or even nine inches square. A larger area mask means a corresponding increase in the amount of sag in the wafer due to its weight. A simple fix for this problem, then, might seem to be to increase the thickness. There are limiting factors on the thickness of the mask material (mask blank), however. These include the difficulty in obtaining the required accuracy from the mask generation system (electron beam exposure system) used to make the mask.

Recently, expansion of the mask due to its irradiation by the exposure or illumination light has also started to be seen as a serious problem. When the mask is irradiated with exposure light, it heats up and expands. When the outer edge of an expanding mask is held tightly against the mask holder by suction, as shown in FIG. 30(B), this sag becomes even worse. When a mask has thermal displacement (distortion and shifting), its pattern will stretch, and in some cases, the mask will even shift with respect to the mask holder. When the exposure ends and the mask is no longer being irradiated by exposure light, the mask temperature drops, and the pattern starts to contract. External vibration can also cause mispositioning. When these kinds of expanding, contracting, slipping, and twisting displacements occur, they cause scaling, offset, and rotational mispositioning of the projected pattern image. Once these problems go beyond a certain point, satisfactory exposures can no longer be performed.

Further increases in mask temperature can result in transfer of heat to the mask holder 111, distorting it as shown in FIG. 30(C). When the holder becomes distorted, it puts stress on the mask, distorting the mask pattern and the projected image. Mask holder distortion can also cause mask mispositioning in the form of offset and rotation of the projected pattern image.

Also used recently are "step-and-scan" systems, in which both the mask and the photosensitive substrate are synchronously scanned with respect to the exposure illumination light as the mask pattern image is exposed on the substrate. In step-and-scan exposure systems, the mask holder with the mask on it is mounted on a movable mask stage, and the substrate is mounted on a movable substrate stage. On the mask stage, as shown in FIG. 29, the mask is held fast against the mask holder at a portion of its outer edge, by vacuum suction. The mask stage and the substrate stage are synchronously moved as the image of the transfer pattern formed on the mask is exposed on the photosensitive substrate. To obtain the desired throughput in step-and-scan systems, the stages must be moved at high speeds and accelerations.

Driving the mask stage fast, however, can cause mispositioning of the mask on the holder. (Rapid acceleration and deceleration of the mask stage causes the mask to slip on its holder with the force of inertia). Also, if an image reduction optical system is used, mask slippage becomes even more of a problem because the mask has to move farther than the substrate, by a factor equal to the reduction ratio. (In a 1/5×image reduction system the mask stage has to move 5 times as far as the substrate stage).

If the system uses an interferometer movement mirror on the mask stage to measure the mask position, for example, any mispositioning of the mask on the mask holder will throw off the position of the mask relative to the interferometer movement mirror. This kind of mask mispositioning is not only a mask stage problem, but will also degrade the overlay accuracy of the pattern with respect to the substrate.

It is an objective of the present invention to provide a mask-holding apparatus and exposure apparatus that can make good projection exposures of mask patterns on substrates.

It is a further objective of the present invention to provide a mask-holding apparatus and. exposure apparatus that can reduce distortion and mispositioning of masks.

SUMMARY OF THE INVENTION

To accomplish the above objectives, a mask holding apparatus incorporating the principles of the present invention provides support members for supporting the mask from below, and pressing members for applying, from above, a prescribed force to the mask, outside of the support points of the support members.

Also, an exposure apparatus incorporating the principles of the present invention provides an illumination system for shining exposure light on the mask. A projection optical system is included for projecting, onto the substrate, an image of the pattern illuminated by this light. A mask holder is provided for supporting the mask from below, as is a pressing member for applying, from above, a prescribed force to the mask, outside of the points supported by the mask holder.

In a scanning-type exposure apparatus incorporating the principles of the present invention, the configuration places counterweights on the sides of the mask that run substantially parallel to the direction of travel of the mask.

According to a preferred embodiment of the present invention, the sagging of the mask due to its own weight is corrected by applying a prescribed force to the mask from above, outside of the support points of the support members. That is, the weight of the mask applies force having its moment in a direction toward the center of the mask, with the support points of the support members acting as fulcrums. The weight of a pressing member on the other hand, applies force having its moment in a direction away from the center of the mask, with the support points acting as fulcrums. This cancels out the sag in the mask due to its weight.

The exposure apparatus incorporating the principles of the present invention is capable of reducing the positioning error of the mask pattern image as it is projected onto the substrate. This enables a highly precise imaging state to be achieved. Alignment accuracy is also improved.

In the scanning-type exposure apparatus embodying the present invention, the width of the illumination light in the direction of travel (the scanning direction) is the width across the narrower dimension of the slit-shaped illumination light. This width is small enough to allow the mask sag in the scan direction to be ignored. Thus for practical purposes, the sagging of the mask due to its own weight can be corrected by placing counterweights only at the edge of the mask on the sides along the direction of travel. This minimizes the weight that must be added to the mask, and thereby avoids adding any more inertial mass than necessary to be overcome when the mask is moved.

Also, to accomplish the stated objectives, an exposure apparatus incorporating the principles of the present invention comprises a holding member on which the mask is loaded, an airtight member for forming airtight space between the mask and the holding member, and an adjustment system for adjusting the air pressure within the airtight space such that the mask will be held fast to the holding member.

An embodiment of the present invention provides a configuration in which an airtight space is formed between the mask and the holding member, and the mask is held fast to the holding member by adjusting the pressure in. this airtight space. This configuration allows that portion of the surface of the mask that is being drawn against the holding member to be increased to a much larger area, including the area in which the transfer pattern is formed. That is, it can be enlarged to an area just slightly smaller than the area of the mask itself, thus greatly increasing the force with which the mask is held to the holder.

The pertinent relationships can be expressed by the following equations (1) and (2):

$$F_k = ma \tag{1}$$

$$F_h = N\mu \tag{2}$$

where $F_k$ is the force of inertia when the mask is moved, $F_h$ is the holding force exerted on the mask due to its friction with the holding member, m is the mass of the mask, N is the vertical reactive force acting on the mask, a is the acceleration of the mask when it is moved, and $\mu$ is the coefficient of friction between the mask and the holding member.

For the mask not to be shifted due to the force of inertia when it is moved, the condition of the following equation (3) must be met:

$$F_k < F_h \quad (3)$$

From (1), (2), and (3), the following equation (4) can be derived:

$$a < N\mu/m \quad (4)$$

Thus it becomes apparent that since m, the mass of the mask, and $\mu$, the coefficient of friction between the mask and the holding member are nearly constant, the value of acceleration (a) can be increased (while still maintaining $F_k < F_h$) by increasing N. Also, for the case in which the mask is held against the holding member by vacuum-induced suction; N is given by the following equation (5):

$$N = S(P_o - P_v) \quad (5)$$

where

S is the area to which suction is applied, $P_o$ is the outside pressure, and $P_v$ is the vacuum pressure.

In the apparatus incorporating the principles of the present invention, S (the mask's area of suction against the holding member) can be considered the equivalent of an area enlarged to just slightly smaller than the mask surface area. As a result, from equations (4) and (5) above, a (the maximum permissible acceleration during movement of the mask) can be increased over that possible with other mask-holding systems.

Also, to accomplish the stated objectives, an exposure apparatus incorporating the principles of the present invention comprises a holding member for holding a mask, a clamping apparatus for clamping the mask to the holding member by magnetic force, and an exposure system for transferring an image of a pattern on a mask being held on the holding member to a substrate.

In such an embodiment of the present invention, because the mask is held fast to the holding member by magnetic force, the mask can be held to the holding member more tightly than is possible with conventional systems in which only a portion of the mask is held by vacuum induced suction. This reduces problems with the mask slippage, even when the mask is moved at high speeds. When changing the mask, for example, a pressing member can be retracted upwardly by causing an electromagnet to repel a permanent magnet. Once a new mask has been loaded on the holding member, the electromagnet can be caused to attract the permanent magnet, so that the pressing member can be pulled in by the attractive force between the electromagnet and the permanent magnet, thus clamping the mask onto the holding member. When doing this, the amount of holding force applied to the mask can be controlled by adjusting the amount of current flowing in the electromagnet.

To accomplish the stated objectives, in a projection exposure apparatus incorporating the principles of the present invention, the mask holder that holds the mask is made of a material having a coefficient of thermal expansion substantially equal to that of the mask.

Thus, as the mask is distorted by thermal expansion, the mask holder distorts a corresponding amount. This reduces the thermal distortion, and thereby provides satisfactory projection of the mask pattern.

To accomplish the stated objectives, a projection exposure apparatus incorporating the principles of the present invention comprises a holding apparatus for holding a mask in a prescribed position without touching it, and an exposure system for exposing, on a substrate, the image of the pattern of a mask held by the holding apparatus. Since the mask is held without touching the holder the flow of heat from the mask to the holder is cut off, and thermal shape distortion of the holder is reduced. This enables deformation of the mask due to shape distortion of the holder to be controlled.

In an embodiment of the present invention, the projection exposure apparatus comprises a displacement detection system for detecting any displacement of the mask; a computer for computing changes in the image of the pattern of the mask projected on the substrate to be exposed, based on the detection results of the displacement detection system; and a correction system for correcting the pattern image changes computed by the computer. When displacement of the mask from thermal expansion due to the exposure process occurs, the corresponding displacement of the projected mask image is computed, and the pattern image corrected based on the results of these computations.

Accordingly, a projection exposure apparatus incorporating the principles of the present invention can comprise a displacement detection system for detecting displacement of a mask, and a correction system for correcting the position of the mask to cancel the displacement of the mask as detected by the displacement detection system. When displacement of the mask from thermal expansion due to the exposure process occurs, the position of the mask is corrected to cancel this displacement, and the image of the mask pattern can therefore be accurately exposed on the substrate.

Further features of the present invention relate to mask holding structures and methods which utilize electrostatic attraction between the mask and the mask holder either in conjunction with or separate from the above-noted pressure applications.

BRIEF DESCRIPTION OF THE DRAWINGS

The above and other objects, features, and advantages of the present invention will become more apparent from the following detailed description taken with the accompanying drawings, in which:

FIG. 17, including FIG. 17(A) is an oblique view, and FIG. 17(B) is a cross-sectional view taken along the line XVII—XVII of FIG. 17(A);

FIG. 20 including FIG. 20(A) is an oblique view, FIG. 20(B) is a cross-sectional view taken along the line XX—XX of FIG. 20(A), and FIG. 20(C) is an oblique view;

FIG. 26 including

FIG. 30, including

DETAILED DESCRIPTION OF THE PREFERRED EMBODIMENTS

Figure 1:
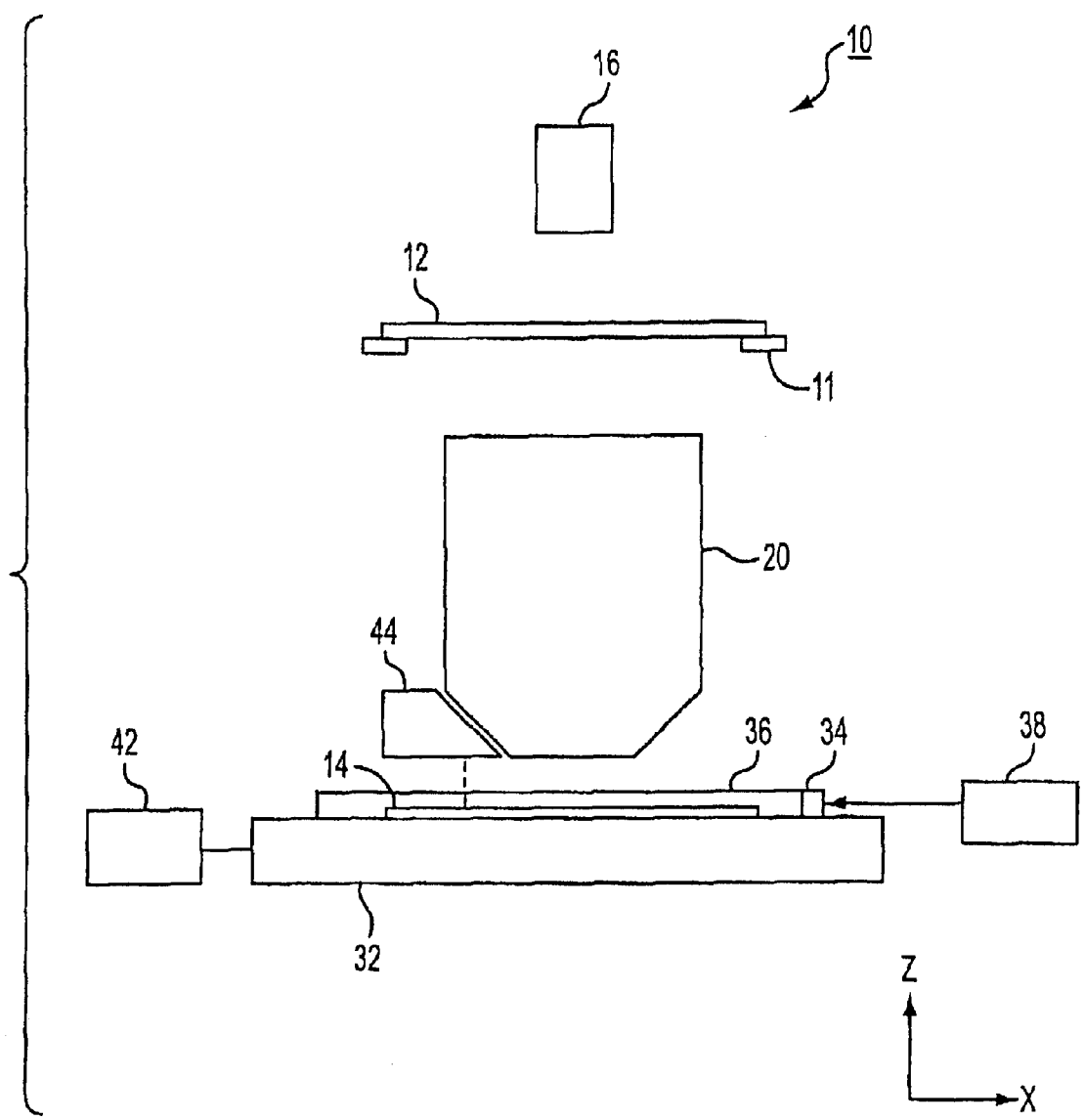
FIG. 1 is a simplified schematic elevational view showing the configuration of the projection exposure apparatus of a first embodiment of the present invention.

Referring to the drawings, FIG. 1 shows projection exposure apparatus 10 of a first embodiment of the present invention. Apparatus 10 is a projection exposure apparatus (stepper) for projection-exposing a pattern formed in a reticle or mask 12 onto a substrate or a wafer 14.

In FIG. 1, the reticle 12 is held fast to a reticle holder 11 by vacuum-induced suction. An exposure light source included in an illumination optical system 16 generates the exposure light, which illumination optical system 16 emits so as to evenly irradiate or illuminate the pattern surface of the reticle 12. The reticle 12 is made of a material such as fused quartz, and has the pattern to be exposed formed on its bottom surface. The reticle holder 11, which is made of ceramic, etc., supports the reticle 12 in a horizontal position. The details of the support mechanism of the reticle 12 are not shown in FIG. 1.

When the pattern formed on the reticle 12 is illuminated by the exposure light, its image is projected through a projection lens system 20 onto a wafer 14. The wafer 14 is held fast to a wafer stage 32 by vacuum-induced suction. Interferometric measurement reflector mirrors 34 and 36 are attached to the wafer stage 32. The reflector mirror 34 and an interferometer 38 are set up to measure the X-axis position of the wafer stage 32. That is, the interferometer 38 directs a measurement laser beam at the reflector mirror 34 and the fixed mirrors (not illustrated) located in the lens barrel of the projection optical lens system 20. The X position of the wafer stage 32 is then measured based on the interference of the light reflected from these fixed mirrors and the reflector mirror 34. The Y position (the position along the axis perpendicular to the page) is measured by the reflector mirror 36 and another interferometer (not shown).

The wafer stage 32 is constructed so that it can be moved in three dimensions (X, Y and Z) by a wafer drive system 42. An alignment microscope 44 is located on the side of the projection lens 20. The alignment microscope 44 is an off axis microscope (on a different optical axis from that of the projection lens 20). It is used for sensing alignment marks (not illustrated) formed on the wafer 14. When the wafer 14 is being positioned relative to the reticle 12, the coordinate position of the wafer 14 is determined by performing a "least squares" approximation, for example, based on the sensed positions of the alignment marks. The baseline magnitude (the distance between the optical axes of the projection lens 20 and the alignment microscope 44) is measured. This baseline magnitude is the amount the wafer stage 32 must be moved to begin an exposure. That is, the wafer is aligned on the alignment microscope axis and then moved to the projection lens to perform the exposure.

Figure 2:
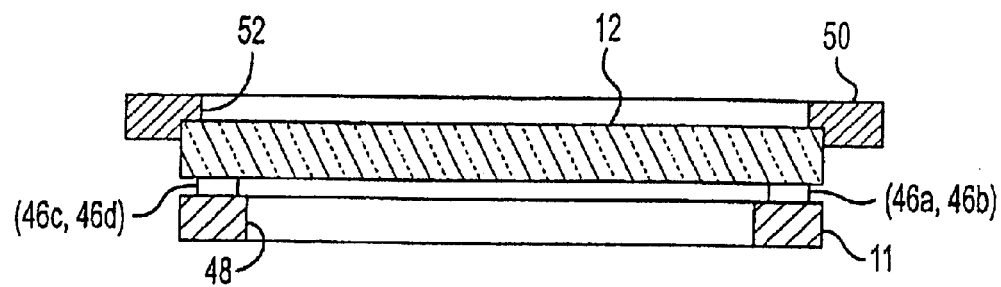
FIG. 2 is a cross-sectional view of a reticle support mechanism schematically shown in FIG. 1.
Figure 3:
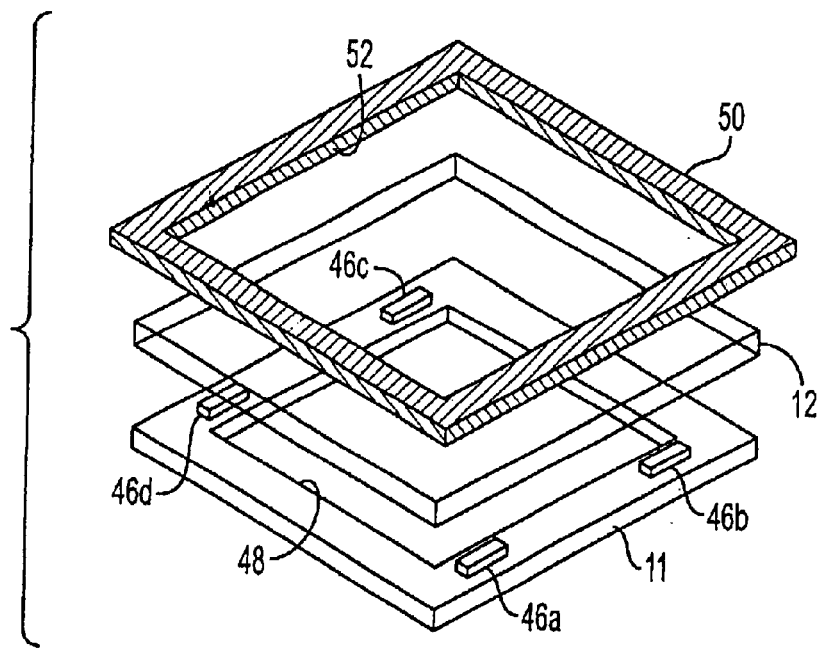
FIG. 3 is an exploded perspective view of the reticle support mechanism of FIG. 2.
Figure 4:
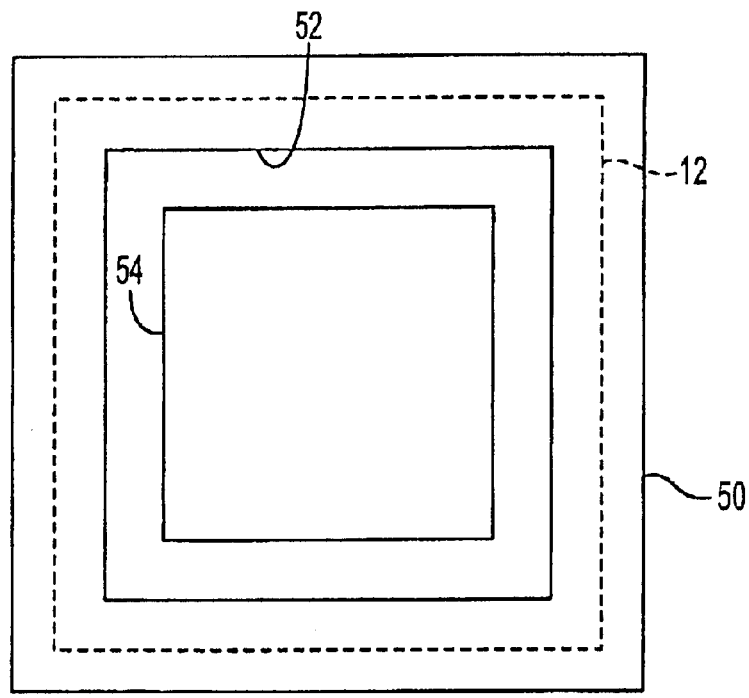
FIG. 4 is a plan view of the reticle support mechanism of FIG. 1 and FIG. 2.

FIGS. 2, 3, and 4 show the detailed construction of the support mechanism of the reticle 12. The reticle 12 is held fast to the reticle holder 11, through four platens (support members) 46a, 46b, 46c, and 46d, by vacuum induced suction (FIGS. 2 and 3). Platens 46a, 46b, 46c, and 46d are placed at the four corners of the rectangular frame of the reticle holder 11 such that they support the reticle 12 by its outer edge. An aperture 48 is formed in the middle of the wafer holder 11, to allow light shining on an illumination area (pattern area) 54 (see FIG. 4) of the reticle 12 to pass on through.

A counterweight 50 is a rectangular frame shaped like a picture frame and is placed over the reticle 12 to exert a downward force on the reticle 12, outside of the platens 46a, 46b, 46c, and 46d. An aperture 52 is formed in the middle of the counterweight 50 to allow exposure light to pass through to the illumination area 54 of the reticle 12. Preferably, the material used for the counterweight 50 is a metal with a relatively high specific gravity.

Figure 5:
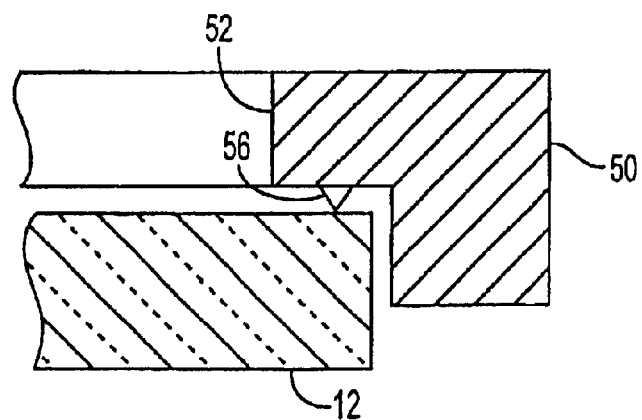
FIG. 5 is an enlarged view of a portion of FIG. 2.

FIG. 5 is an enlarged view of a portion of FIG. 2 showing how contact is made between the weighting points of the counterweight 50 and the reticle 12. As can be seen from this drawing, contact is made through tabs 56, formed on the counterweight 50 so that the applied force will be concentrated in small areas on the reticle 12.

Figure 6:
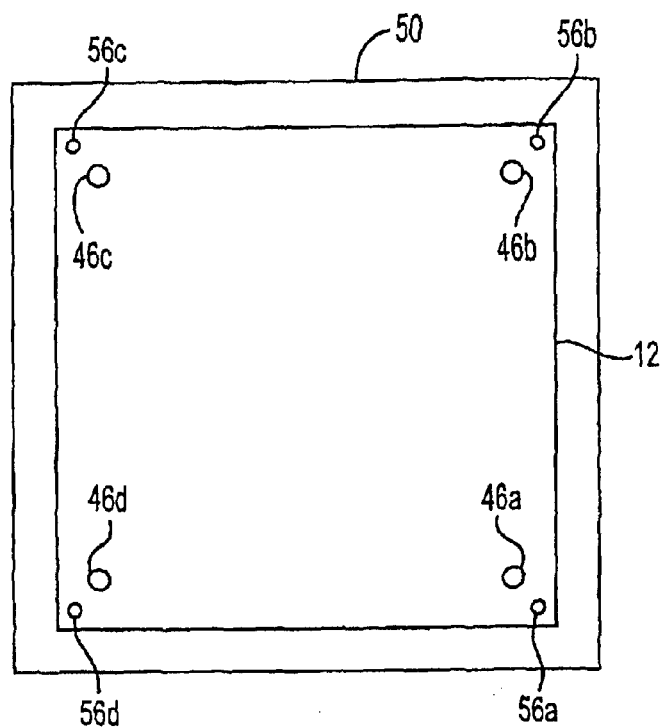
FIG. 6 is a plan schematic view of the reticle support mechanism of the first embodiment to explain the relationship between weighting points and support points.

As shown in FIG. 6, four tabs (56a, 56b, 56c, and 56d) are provided on the counterweight 50, arranged so that the downward force will be applied at the four corners of the reticle 12, as shown in FIG. 6. For simplification, the innermost edges of the counterweight 50 are not shown in FIG. 6 so that tabs 56a, 56b, 56c, and 56d can be clearly seen.

FIG. 6 shows the typical top-view placement of the platens and the tabs. As shown in FIG. 6, the tabs 56a, 56b, 56c, and 56d, are placed on extensions of lines connecting the platens 46a, 46b, 46c, and 46d, respectively, to the center of the reticle 12 (radial lines).

Figure 7:
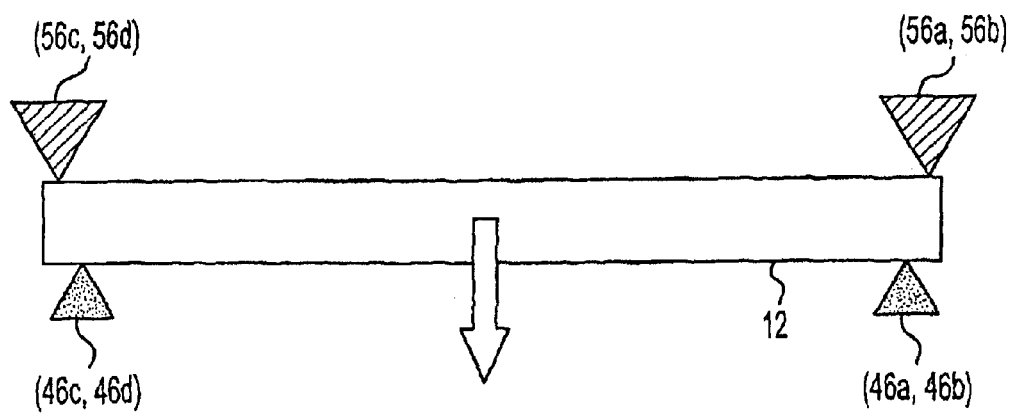
FIG. 7 is a schematic drawing to explain the operation of the reticle support mechanism of the first embodiment.

FIG. 7 shows the typical side-view placement of the platens and the tabs. As shown in FIG. 7, the weighting points (tabs 56a, 56b, 56c, and 56d) are placed slightly outside of the platens 46a, 46b, 46c, and 46d, respectively, such that the weight of the counterweight 50 will correct for the weight of the reticle 12 that is causing it to sag. That is, the weight of the reticle 12 applies force having its moment in a direction toward the center of the reticle 12, with the platens 46a, 46b, 46c, and 46d as the respective fulcrums. The weight of the counterweight 50, on the other hand, applies force having its moment in a direction away from the center of the reticle 12, with the platens 46a, 46b, 46c, and 46d as the respective fulcrums. This cancels out the sag flexure in the reticle 12 due to its own weight. In other words, the tendency of the center of the reticle 12 to sag is corrected by an opposing tendency to lift it.

The weight of the counterweight 50 and the locations of the tabs 56a, 56b, 56c, and 56d are set based on the actual sag in the reticle 12 due to its own weight.

The amount of sag in the reticle 12 can be determined by calculating it from the reticle 12 material, its thickness and size (area), and the placement of the platens 46a, 46b, 46c, and 46d. The counterweight 50 can be set in place after the reticle 12 has been mounted on the reticle holder 11; or the reticle 12 may be loaded on the reticle holder 11 with the counterweight 50 already on it. Also, it is not mandatory that there be four tabs on the counterweight 50. There should be at least three, but the exact number may be varied as desired, to suit conditions. Neither is it mandatory that the counterweight 50 be made as a single piece: it can be divided into as many pieces as there are weighting points.

Figure 8:
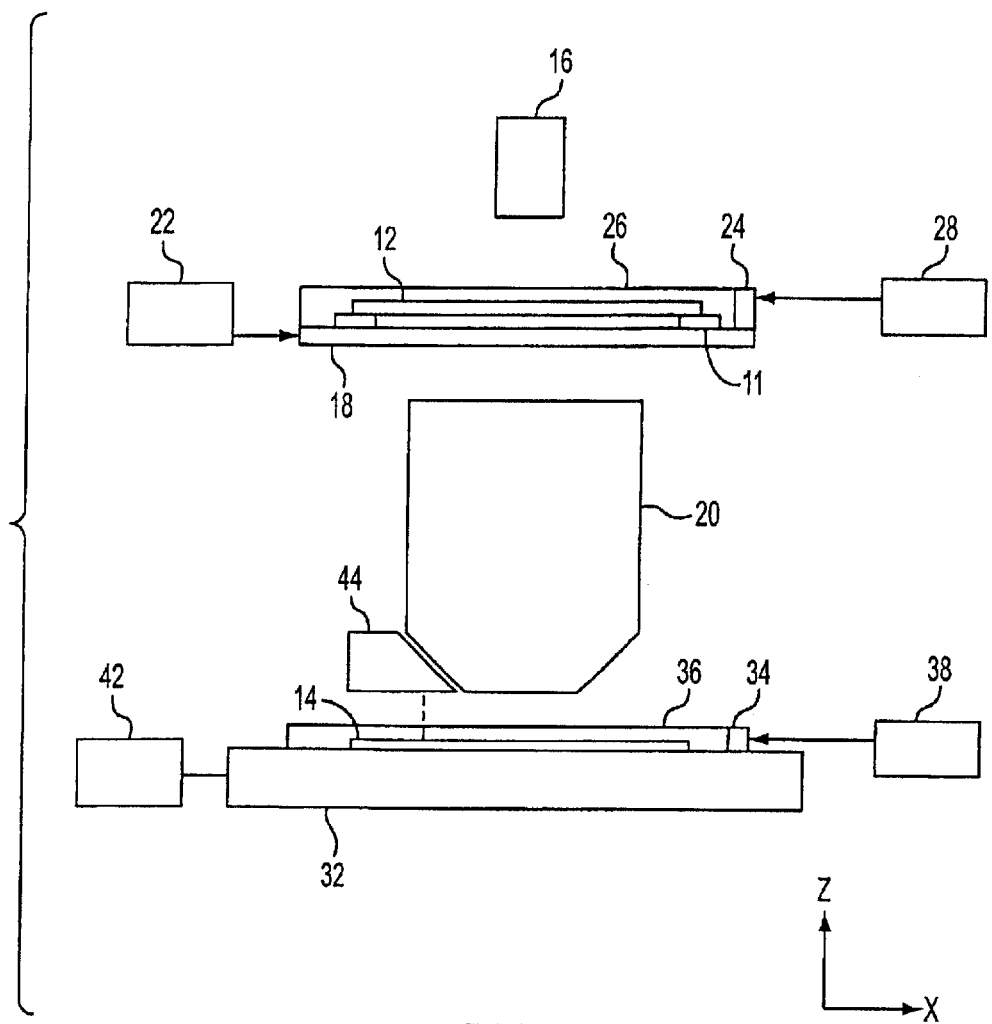
FIG. 8 is a schematic elevational view of a scan-type projection exposure apparatus of a second embodiment of the present invention.

FIG. 8 shows the configuration of the scan-type projection exposure apparatus of a second embodiment of the present invention. Unlike the exposure apparatus of the first embodiment shown in FIG. 1, this projection exposure apparatus uses the step-and-scan technique, in which exposures are performed by moving both the wafer 14 and the reticle 12. The same or corresponding components in this apparatus have the same numbers as they had in FIG. 1. Explanation related to these parts will not be repeated.

As shown in FIG. 8, the reticle 12 is loaded on a reticle stage 18 through the reticle holder 11. The reticle stage 18 can be driven in translation and rotation in the XY plane by a reticle drive system 22, with the optical axis of the projection optical system 20 as the Z axis. The reflector mirrors 24 and 26 are provided on the reticle stage 18 for interferometric measurement of its position. The X position of the reticle stage 18 (its position left to right on the page) is measured by an interferometer 28 and a reflector mirror 24. That is, the measurement laser light from the interferometer 28 is directed at the reflector mirror 24, and the X position of the reticle stage 18 is measured based on light reflected from the reflector mirror 24. Also, the Y position of the reticle stage 18 (its position along the axis perpendicular to the page) is measured by the reflector mirror 26 and another interferometer (not shown in the drawing).

In the step-and-scan projection exposure apparatus shown in FIG. 8, the pattern on the reticle 12 is gradually transferred to the wafer 14 by shining a slit-shaped exposure light 58 (FIG. 9) on the reticle 12 while synchronously moving the reticle stage 18 and the wafer stage 32 in opposite directions. By so scanning the reticle 12 and the wafer 14 in one stroke (one scan) across the slit-shaped exposure light 58, the entire image of the reticle 12 pattern is transferred to the wafer 14 in one exposure.

Figure 9:
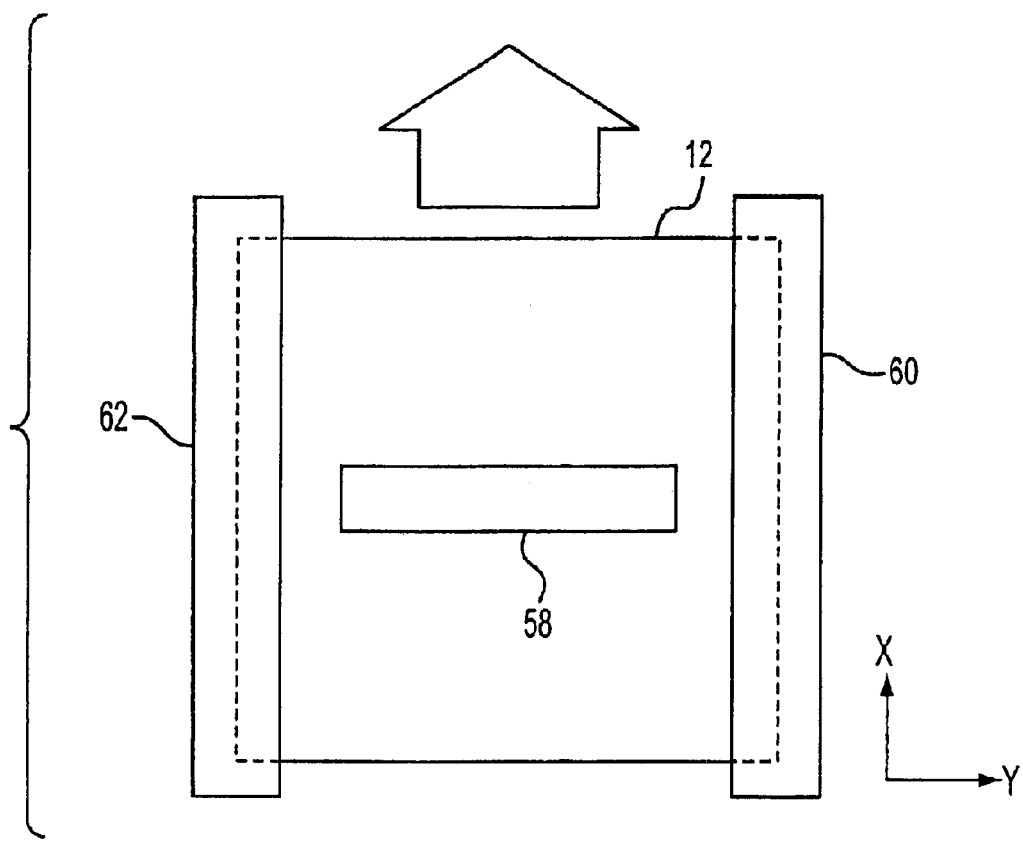
FIG. 9 is a plan view of a reticle support mechanism used in the second embodiment.

FIG. 9 is analogous to FIG. 4 in that it shows the relationship between the reticle 12 and the counterweights 60 and 62 of the second embodiment. That is, the counterweights 60 and 62 are loaded on the two opposing sides of the reticle 12 along the X axis, the direction in which the reticle 12 is moved (the scanning direction). In this embodiment, illumination light 58 is formed into a slit on the reticle 12. This slit is narrow enough in the scanning direction (X direction) so that the sagging of the reticle, 12 (due to its own weight) can be ignored. Thus only the sag in the Y direction (the direction perpendicular to the X direction) needs to be accounted for. The counterweights 60 and 62, then, can be placed as shown in FIG. 9, which allows the weight applied to the reticle 12 to be held to a minimum, avoiding any greater inertial mass than necessary when moving the reticle stage 18. Also, as means of weighting the reticle 12, it might be preferable to apply the prescribed amount of force to the reticle 12 by a static means, such as a spring, or by a mechanically or electrically controlled dynamic constraining mechanism.

Figure 10:
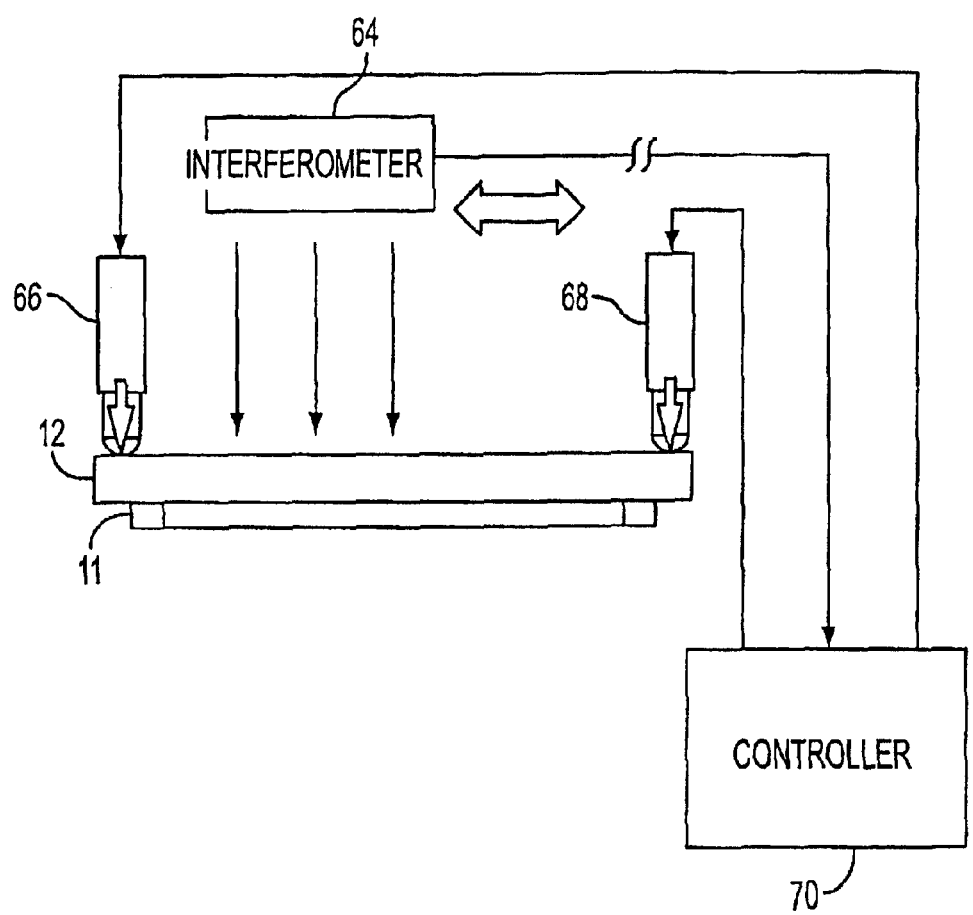
FIG. 10 is a schematic diagram showing the configuration of a reticle support mechanism of a projection exposure apparatus of a third embodiment of the present invention.

FIG. 10 shows the support mechanism of the projection exposure apparatus of a third embodiment of the present invention. This embodiment comprises an interferometer 64 for measuring the flatness of the surface of the reticle 12; piezoelectric elements 66 and 68 for applying a downward force on the outer edge of the reticle 12; and a controller 70, for controlling the piezoelectric elements 66 and 68 based on the output of the interferometer 64. The interferometer 64 is set up so that in addition to measuring the flatness of the surface of the reticle 12, it can also measure how much the reticle 12 is sagging due to its own weight. The piezoelectric elements 66 and 68 are set up so that they can apply a controlled force just outside of the platens (not illustrated) of the reticle holder 11, as was done in the first and second embodiments described above. Using an internal CPU (not illustrated), the controller 70 computes the weighting points and weighting magnitude to be applied to the reticle 12 by the piezoelectric elements 66 and 68, based on the reticle 12 surface flatness data measured by the interferometer 64, and controls the piezoelectric elements 66 and 68 accordingly. For example, multiple piezoelectric elements can be placed around the outer edge of the reticle 12 and the necessary piezoelectric elements selectively driven, based on the actual state of the sag of the reticle 12.

This embodiment not only corrects for the sag in the reticle 12, it also effectively eliminates other problems that show up as reticle 12 surface irregularities: problems, for example, such as less than perfect flatness of the reticle holder 11. For step-and-scan systems, the fact that the weights are not placed directly on the reticle 12 in this embodiment provides another advantage in that it avoids adding any more, inertial mass than necessary.

Next, a fourth embodiment of the present invention will be described. This embodiment applies the principles of the present invention to a scanning projection exposure apparatus for fabricating semiconductor devices.

Figure 11:
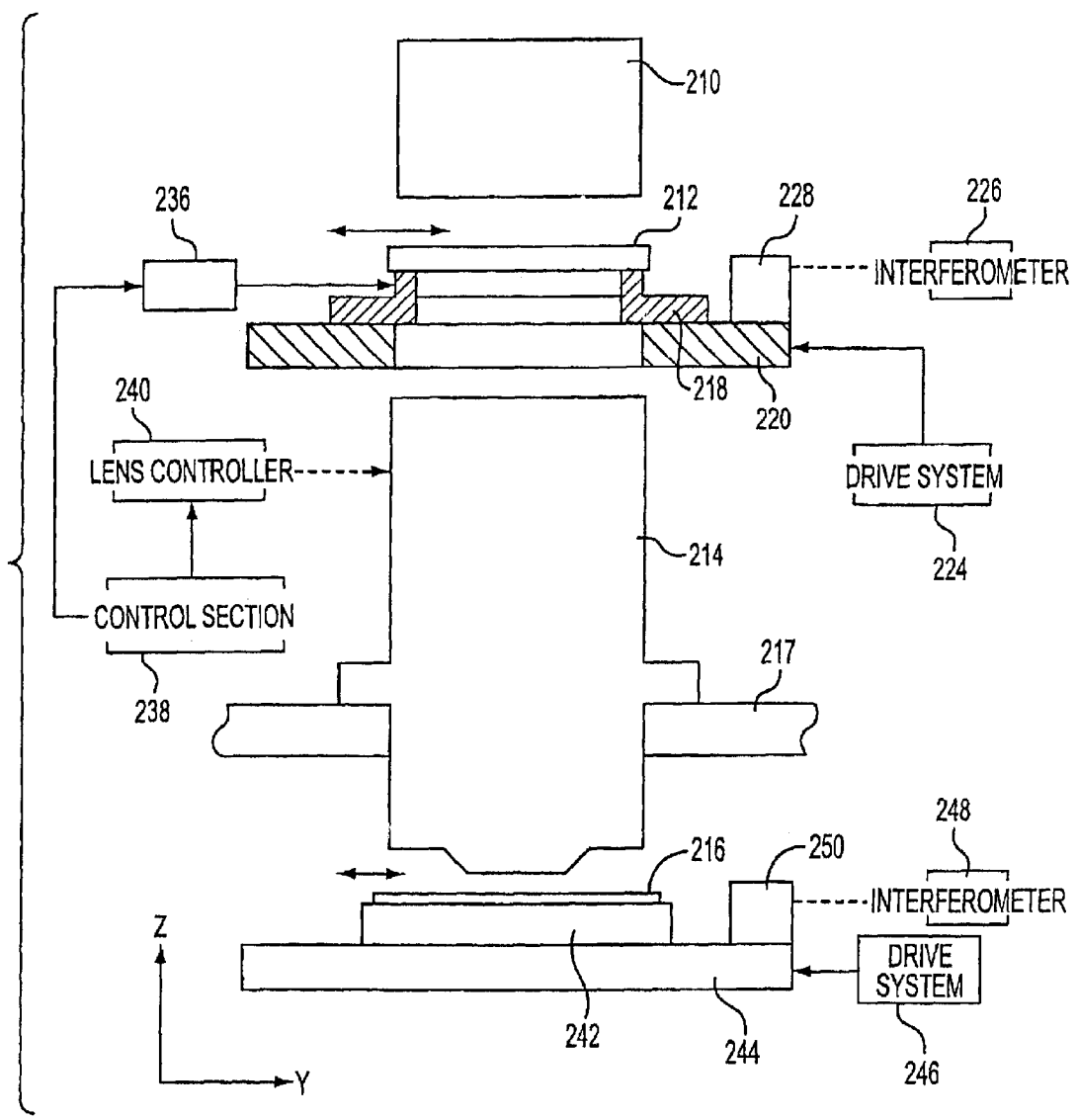
FIG. 11 is a schematic elevational view of a projection exposure apparatus of a fourth embodiment of the present invention.
Figure 12:
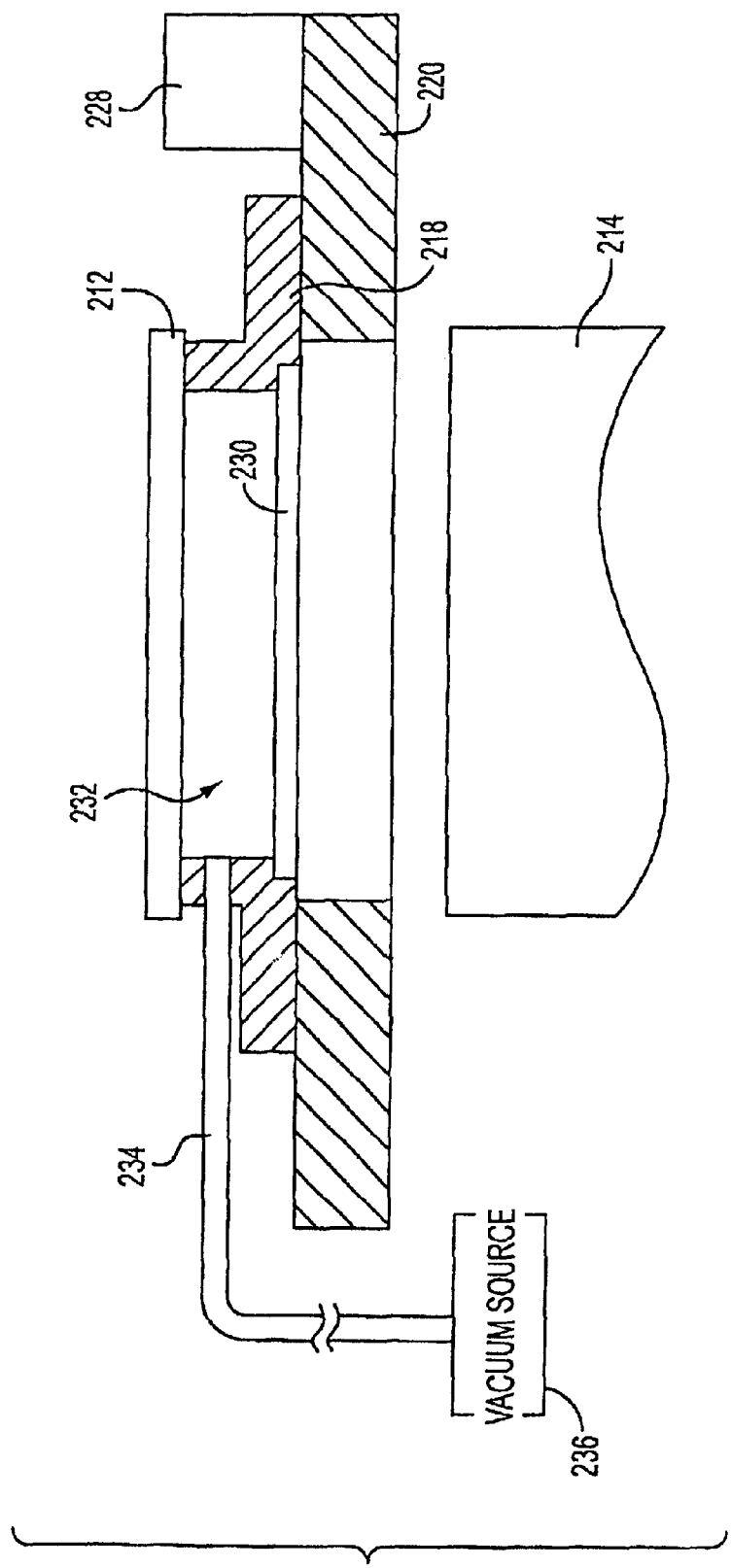
FIG. 12 is an elevational view, partially in cross-section, showing a reticle stage used in the fourth embodiment of FIG. 11.

FIG. 11 shows the overall configuration of the projection exposure apparatus of this fourth embodiment of the present invention, and FIG. 12 shows the reticle stage-related configuration. In this embodiment, the illumination optics direct exposure light through a condenser lens 210 to illuminate or irradiate a reticle 212, in order to transfer the image of the prescribed pattern formed in the reticle 212, through a projection optical system 214, to a wafer 216. The projection optical system 214, which is held rigid with respect to the rest of the apparatus by a frame 217, projects the image of the reticle 212 pattern, at the prescribed reduction ratio (1/4, 1/5, etc.) onto the wafer 216.

The reticle 212 is held fast to a reticle holder 218 at four locations around its outer edge (by vacuum suction), and loaded onto a reticle stage 220 in this state. The reticle stage 220 can be moved in the scan direction (Y direction) at the prescribed speed by a reticle stage drive system 224. Attached to the reticle stage 220 is a movement mirror 228, which reflects a laser beam output by a reticle interferometer 226, to allow constant monitoring of the position of the reticle stage 220 by the reticle interferometer 226. In FIG. 11, only the reticle interferometer 226 and the movement mirror 228, which monitor the Y position (the position in the scanning direction), are shown. In the actual system, however, an interferometer and a movement mirror are also provided for measuring the X position (the position in the non-scanning direction).

As shown in FIG. 12, provided on the bottom of the reticle holder 218 is an aperture glass 230, which, along with the reticle 212 and the reticle holder 218, forms an airtight space 232 to isolate the bottom of the reticle 212 from the outside air. The reason the aperture glass 230 is used to form the airtight space 232 is to make the space transparent to the illumination light. A vacuum source 236, which is connected to the airtight space 232 through a vacuum conduit 234, reduces the pressure within the airtight space 232 to less than the outside pressure to force the reticle 212 tightly against the reticle holder 218. This difference in pressure between the inside and outside of the airtight space 232 distorts the shape of the reticle 212. The resulting imaging error in the projected image of the reticle pattern, however, is corrected by a control section 238, which operates through a lens controller 240 (as shown in FIG. 11) to adjust the imaging state of the projection optical system 214 so as to cancel out the error.

At the bottom end of the projection optics 214, the wafer 216 is held fast to a wafer stage 242 by vacuum suction, and loaded onto a wafer stage 244 in this state. The wafer stage 244 is movable in a plane perpendicular to the optical axis of the projection optical system 214 (XY plane). The wafer stage 244 is driven by a wafer stage drive system 246 such that the motion of the wafer 216 is synchronized with the scanning of the reticle 212. Attached to the wafer stage 244 is a movement mirror 250, which reflects a laser beam output from a wafer interferometer 248. This configuration is set up so that the interference light resulting from the interference of the light reflected from the movement mirror 250 with that reflected from a fixed mirror installed at the bottom end of the projection optical system 214 (not illustrated) can be used to constantly monitor the position of the wafer stage 244. In FIG. 11, only the wafer interferometer 248 and the movement mirror 250, which monitor the Y position are shown. In the actual system, however, an interferometer and a movement mirror are also provided for measuring the X position.

Next, the principles and operation of the fourth embodiment, configured as described above, will be described.

With the reticle 212 being uniformly illuminated by light transmitted and converged by the condenser lens 210, the reticle stage 220 is moved in the scanning direction (Y direction) of the illumination area on the reticle 212. At the same time, the wafer stage 244, with the wafer 216 loaded thereon, is moved in synchronism with the motion of the reticle stage 220, and in the opposite direction. During this time, the relative positions of the reticle 212 and the wafer 216 are being monitored by the reticle interferometer 226, and the wafer interferometer 248, respectively.

The pertinent force relationships, as noted above, can be expressed by the equations:

$$F_k = ma \quad (1)$$

$$F_h = N\mu \quad (2)$$

where $F_k$ is the force of inertia of the reticle 212, $F_h$ is the holding force exerted on the reticle 212 by its friction with the reticle holder 218, m is the mass of the reticle 212, N is the vertical reactive force acting on the reticle 212, a is the acceleration of the reticle 212 motion, and $\mu$ is the coefficient of friction between the reticle 212 and the reticle holder 218.

Then for the reticle 212 not to be shifted by the force of inertia when the reticle stage 220 is moved, the following condition must be met:

$$F_k < F_h \quad (3)$$

From (1), (2), and (3), the following relation can be derived:

$$a < N\mu/m \quad (4)$$

Here, it becomes apparent that since m, the mass of the reticle 212, and M, the coefficient of friction between the reticle 212 and the reticle holder 218, are nearly constant, the acceleration, a, can be increased (while still maintaining $F_k < F_h$) by increasing N. Also, if the reticle 212 is held against the reticle 218 by vacuum induced suction, N is given by the following equation (5):

$$N = S(P_o - P_v) \quad (5)$$

where

S is the area to which suction is applied, $P_o$ is the outside pressure, and $P_v$ is the vacuum pressure.

In the present embodiment, the fact that the air pressure inside the airtight space 232 under the reticle 212 is set lower than the pressure on the outside, allows the surface of the reticle 212 being held against the reticle holder 218 by suction, including the area in which the transfer pattern is formed, to be made larger. That is, S, the suction surface area, can be considered the equivalent of an area enlarged to a just slightly smaller area than that of the entire surface of the reticle 212. As a result, from equations (4) and (5) above, a, the maximum permissible acceleration during movement of the reticle 212, can be increased over that possible with other mask-holding systems. This embodiment also provides an advantage in that isolating the pattern surface of the reticle 212 from outside air protects it from contamination.

Figure 13:
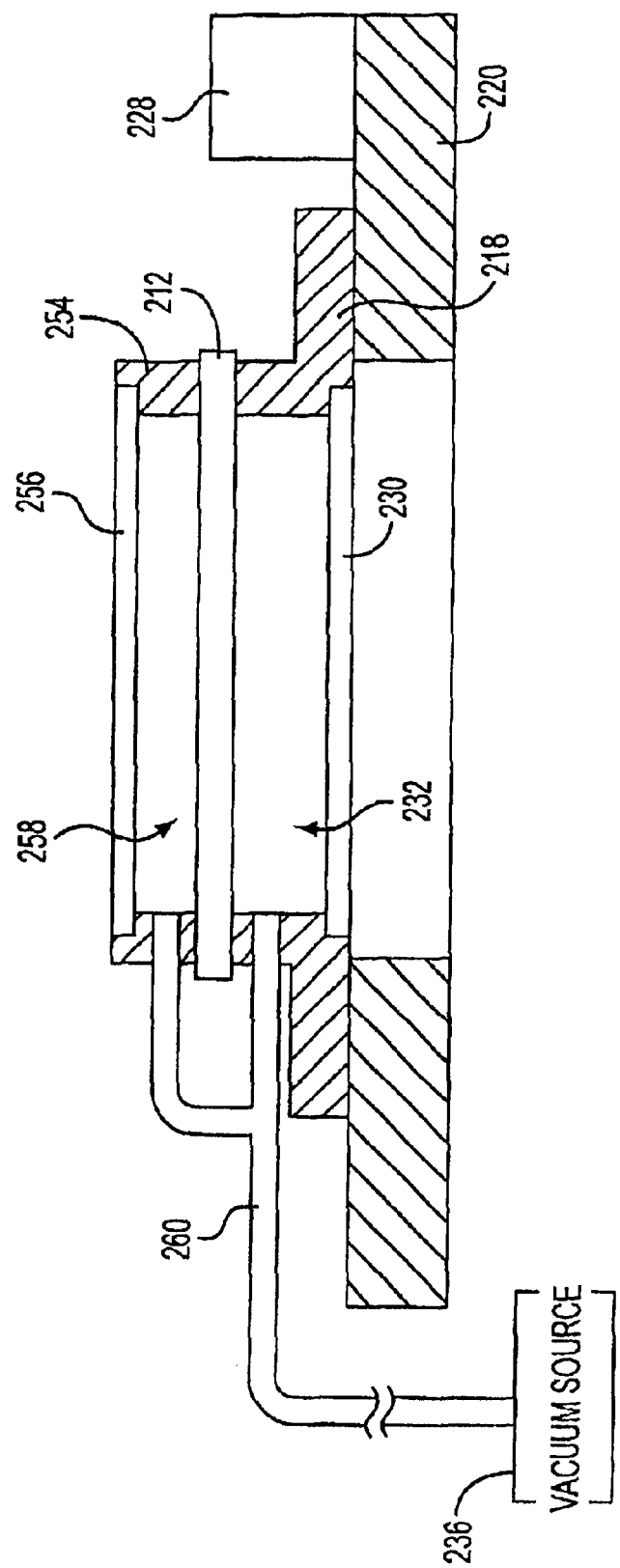
FIG. 13 is an elevational view, partially in cross-section, showing the construction of a reticle stage used in a fifth embodiment of the present invention.

FIG. 13 shows the construction associated with a reticle stage 220 of the projection exposure apparatus of a fifth embodiment of the present invention. The configuration of portions of the projection exposure apparatus of this embodiment not associated with the reticle stage 220 is as shown for the fourth embodiment (FIG. 11). These portions are not illustrated here, and will not be described. The components shown in FIG. 13 that are the same components, or correspond to components in the fourth embodiment, have the same numerals here as they had in FIG. 11.

In FIG. 13 the aperture glass 230 is installed at the bottom of the reticle holder 218 in the floor area. As in the above embodiment, the first airtight space 232 is thus formed between the reticle 212, the reticle holder 218, and the aperture glass 230. Provided on top of the reticle 212 is a bulkhead 254, on top of which (in the ceiling area) is provided an aperture glass 256. A second airtight space 258 is thus formed between the top surface of the reticle 212, the bulkhead 254, and the aperture glass 256.

The first and second airtight spaces 232 and 258 are interconnected by a vacuum conduit 260 such that the air pressure inside the first and second airtight spaces 232 and 258 can be adjusted to less than the outside air pressure by the vacuum source 236. This pressure differential enables the reticle 212 to be held tightly against the reticle holder 218. When this is done, since the first airtight space 232 below the reticle 212 and the second airtight space, 258 above the reticle 212 are interconnected by the vacuum conduit 260, the pressure in the airtight space 232 is the same as that in the airtight space 258. This prevents deformation of the reticle 212 due to any difference in pressure above and below it.

In this embodiment as well, since the air pressure in the airtight spaces 232 and 258 above and below the reticle 212 is set to less than that outside the airtight spaces, the surface of the reticle 212 held against the reticle holder 218 by suction, including the area in which the transfer pattern is formed, can be made larger. That is, S, the suction surface area, can be viewed as the equivalent of an area enlarged to a just slightly smaller area than that of the entire surface of the reticle 212. As a result, from equations (4) and (5) above, a, the maximum permissible acceleration during movement of the reticle 212, can be increased over that possible with other mask holding systems.

Figure 14:
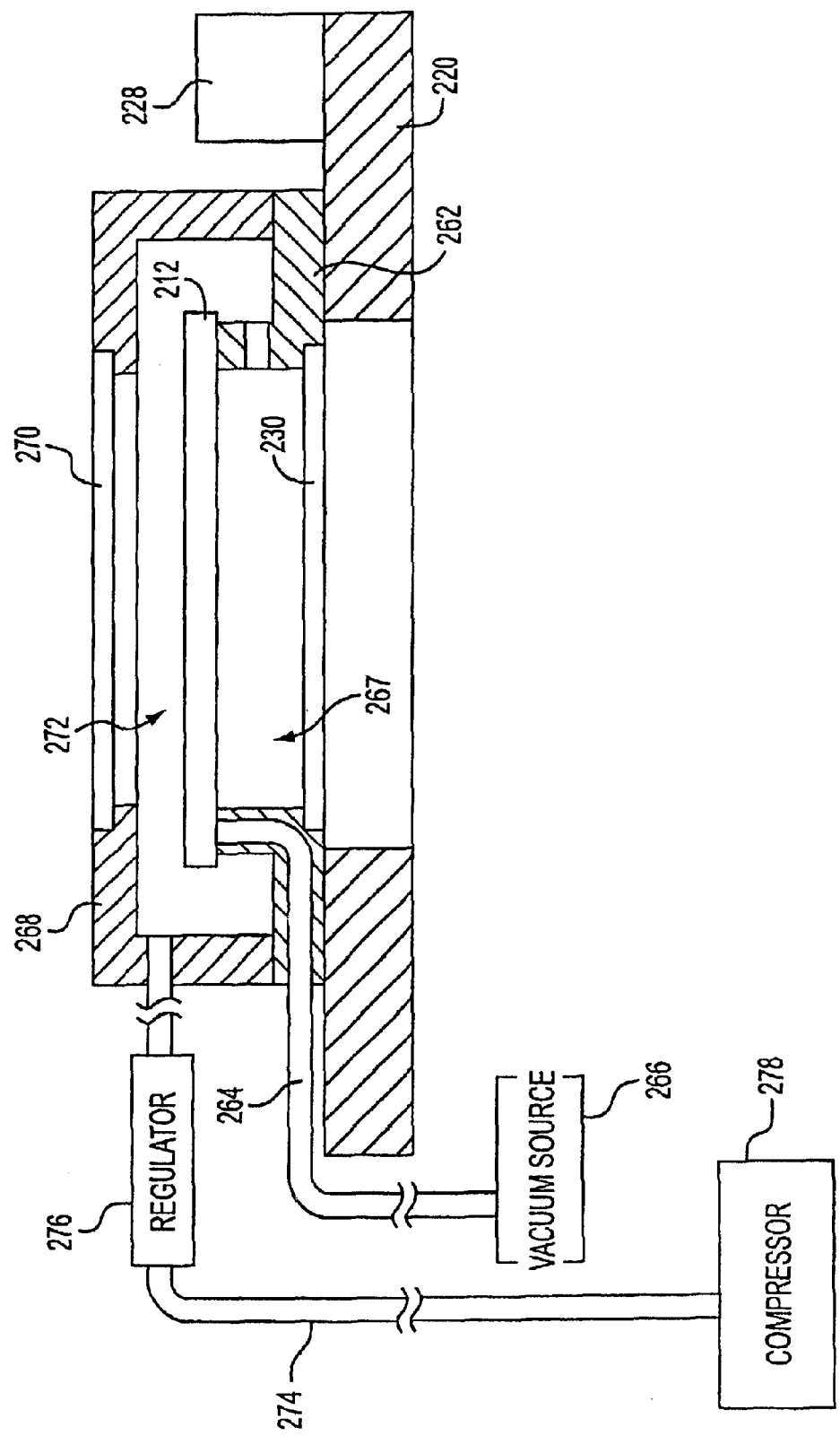
FIG. 14 is an elevational view, partially in cross-section, showing the construction of a reticle stage used in a sixth embodiment of the present invention.

FIG. 14 shows the construction in the vicinity of the reticle stage 220 of the projection exposure apparatus of a sixth embodiment of the present invention. The configuration of portions of the projection exposure apparatus of this embodiment not associated with the reticle stage 220 is as shown for the fourth embodiment, in FIG. 11. These portions are not illustrated here, and will not be described. The components shown in FIG. 14 that are the same components, or correspond to components in the fourth and fifth embodiments, have the same identifying numerals here as they had in earlier figures.

In FIG. 14, a suction hole (not illustrated) is formed in the top surface of a reticle holder 262, on which the reticle 212 is placed, and to which it is held fast by suction created by a vacuum source 266 through a vacuum conduit 264.

The aperture glass 230 is placed on the bottom surface of the reticle holder 262 (its floor area). As in the above fourth and fifth embodiments, a first airtight space 267 is thus formed between the reticle 212, the reticle holder 262, and the aperture glass 230. Provided on top of the reticle 212 is a bulkhead 268, on top of which (in the ceiling area) is provided an aperture glass 270. A second airtight space 272 is thus formed between the top surface of the reticle 212, the bulkhead 268, and the aperture glass 270. The second airtight space 272 is connected through an air conduit 274 and a regulator 276 to a compressor 278. The compressor 278 sets the air pressure in the airtight spaces 272 and 267, above and below the reticle 212, higher than atmospheric pressure. This higher pressure presses the reticle 212 against the reticle holder 262, increasing the holding force with which the reticle 212 is held to the reticle holder 262. With this configuration, then, this holding force can be controlled by using the regulator 276 to control the pressure in the first and second airtight spaces 267 and 272, below and above the reticle 212. For example, the pressure in the second airtight space 272 above the reticle 212 can be set slightly higher than that in the first airtight space 267 below the reticle 212.

In the present embodiment, in addition to setting the air pressure in the airtight spaces 267 and 272 below and above the reticle 212 to a pressure greater than atmospheric pressure, the pressure differential ($P_o$-$P_v$) at the contact surface between the reticle 212 and the reticle holder 262 can also be increased by vacuum suction. As a result, from equations (4) and (5) above, a, the maximum permissible acceleration during movement of the reticle 212, can be increased over that possible with other mask-holding systems.

Figure 15:
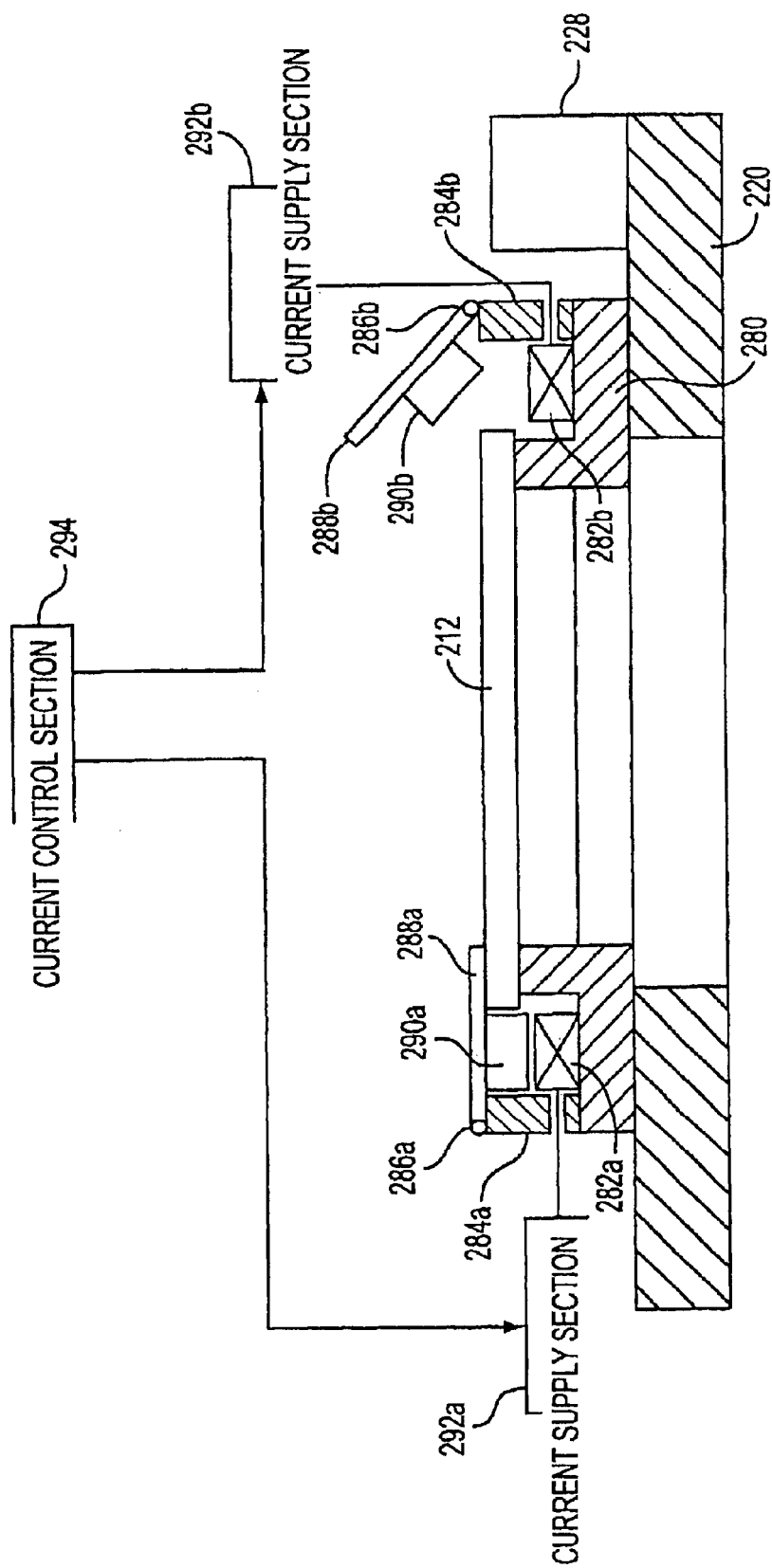
FIG. 15 is an elevational view, partially in cross-section, showing the construction of a reticle stage used in a seventh embodiment of the present invention.

FIG. 15 shows the construction in the vicinity of the reticle stage 220 in the projection exposure apparatus of a seventh embodiment of the present invention. The configuration of portions of the projection exposure apparatus of this embodiment not associated with the reticle stage 220 is as shown for the fourth embodiment, in FIG. 11. These portions are not illustrated here, and will not be described. The components shown in FIG. 15 that are the same components, or correspond to components in the fourth, fifth, and sixth embodiments, have the same identifying numerals here as they had in earlier figures.

In FIG. 15, electromagnets 282a and 282b are installed fixed in position; one on either side of a reticle holder 280 on which the reticle 212 is loaded. Installed on the sides of the electromagnets 282a and 282b, respectively, are support blocks 284a and 284b.

Installed on the support blocks 284a and 284b, respectively, through hinges 286a and 286b, respectively, are reticle clamps 288a and 288b. Installed on the bottoms of the reticle clamps 288a and 288b, respectively, are permanent magnets 290a and 290b. Connected to the electromagnet 282a and 282b, respectively, are current supplies 292a and 292b, which supply electrical current to generate magnetic fields. These components are configured such that when, under control of a current controller 294 electrical current is supplied to the electromagnets 282a and 282b by the current supplies 292a and 292b, respectively, magnetic fields are created above the electromagnets 282a and 282b.

In the embodiment as described above, to remove or insert the reticle 212, the current controller 294 controls the current supplies 292a and 292b to generate magnetic fields in a direction to cause the permanent magnets 290a and 290b to be repelled by the electromagnets 282a and 282b. This causes the reticle clamps 288a and 288b to be ejected upward by the repulsive force between the electromagnets 282a and 282b and the permanent magnets 290a and 290b. With the reticle clamps 288a and 288b in the released (retracted) state, a replacement reticle 212 can be loaded on the reticle holder 280. Then, the current controller 294 controls the current supplies 292a and 292b to generate magnetic fields in a direction to cause the permanent electromagnets 290a and 290b to be attracted to the electromagnets 282a and 282b. This causes the reticle clamps 288a and 288b to be pulled down by the attractive force between the electromagnets 282a and 282b and the permanent magnets 290a, and 290b, clamping the reticle 212 on the reticle holder 280. In this manner, the reticle 212 is secured to the reticle holder 280. The amount of holding force applied to the reticle 212 can be controlled by adjusting the amount of current flowing in the electromagnets 282a and 282b. The current required to develop a given amount of holding force can be reduced by reducing the size of the gap between the electromagnets 282a and 282b and the permanent magnets 290a and 290b.

In FIG. 15, the reticle clamp 288a is shown in a closed position while the reticle clamp 288b is shown in a released position for illustrative purposes only. Normally both reticle clamps would be in the same position.

In this embodiment, the vertical reactive force N can be increased by increasing the magnetic force used to clamp the reticle 212 on the reticle holder 280. Thus from the above equation (4), a, the maximum permissible acceleration during movement of the reticle 212, can be increased over that possible with other mask-holding systems.

Figure 16:
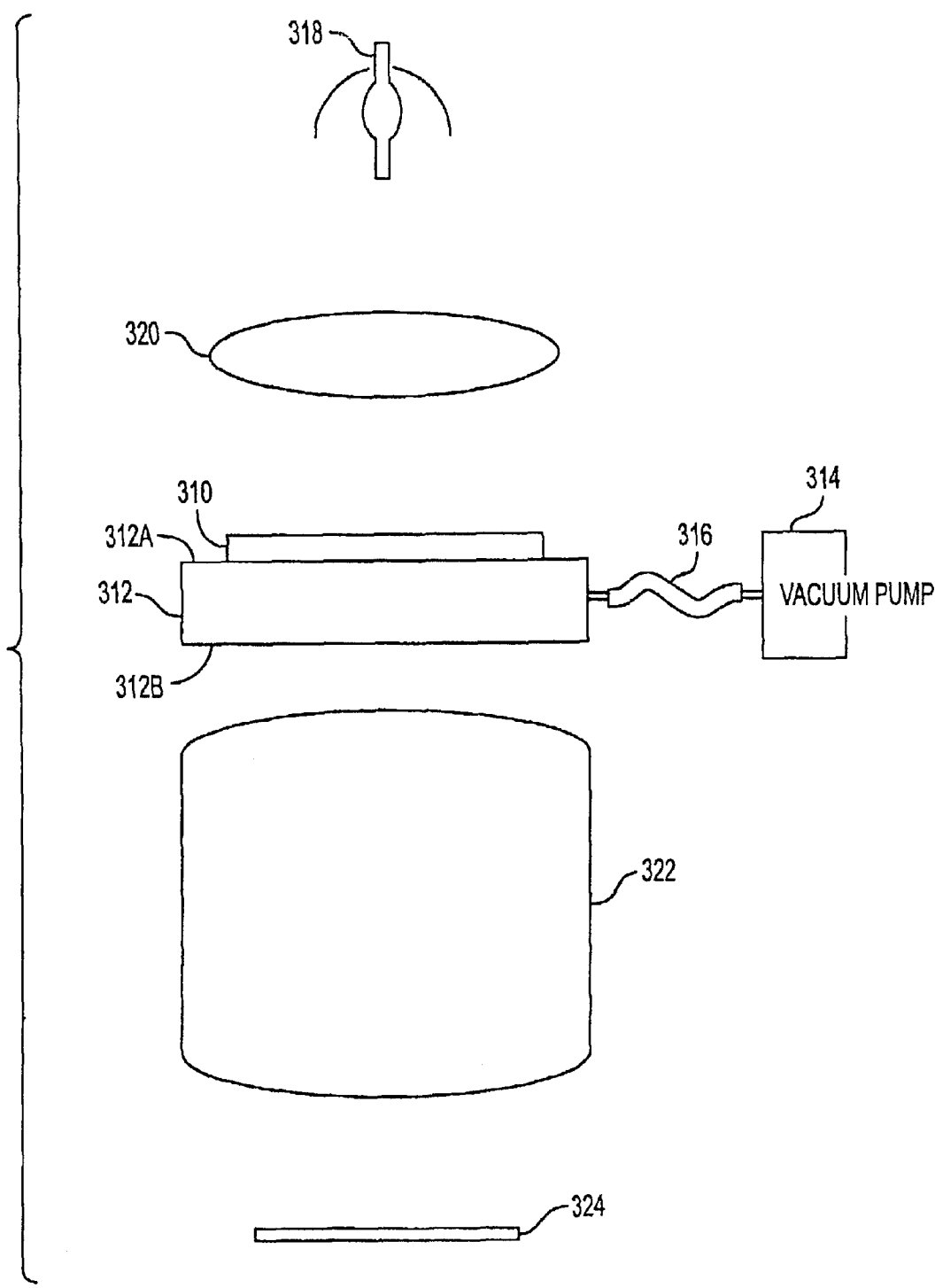
FIG. 16 is a simplified schematic elevational view of a projection exposure apparatus of an eighth embodiment of the present invention.

Next, an eighth embodiment of the present invention will be described with reference to FIG. 16 and FIG. 17. FIG. 16 shows the essential parts of the projection exposure apparatus of this embodiment. In FIG. 16, a mask (reticle) 310 is held in place by a mask holder (reticle holder) 312 of the present embodiment. The mask holder 312 is connected to a vacuum pump 314 through a conduit 316. A light source 318, which emits the exposure light, is provided, above the mask 310. An illumination optical system 320 is provided, between the light source 318 and the mask 310. Placed on the exposure-light-transparent side of the mask 310, with a projection optical system 322 sandwiched therebetween, is a wafer 324 to be exposed.

The exposure operation of this embodiment is the same as that of conventional projection exposure apparatus. That is, exposure light emitted from the light source 318 passes through the illumination optical system 320, illuminating or irradiating the mask 310. The exposure light projects the pattern printed on the mask 310 through the projection optical system 322 onto the wafer 324.

In this embodiment, however, the mask holder 312 has the same physical properties as the mask 310. In particular, it is made of a material that has the same coefficient of thermal expansion as the mask. It is also shaped to reduce sagging due to its own weight: This is done by making the mask holder 312 thicker, and by performing finishing work to make its top and bottom surfaces highly flat and plane-parallel.

Figure 17A:
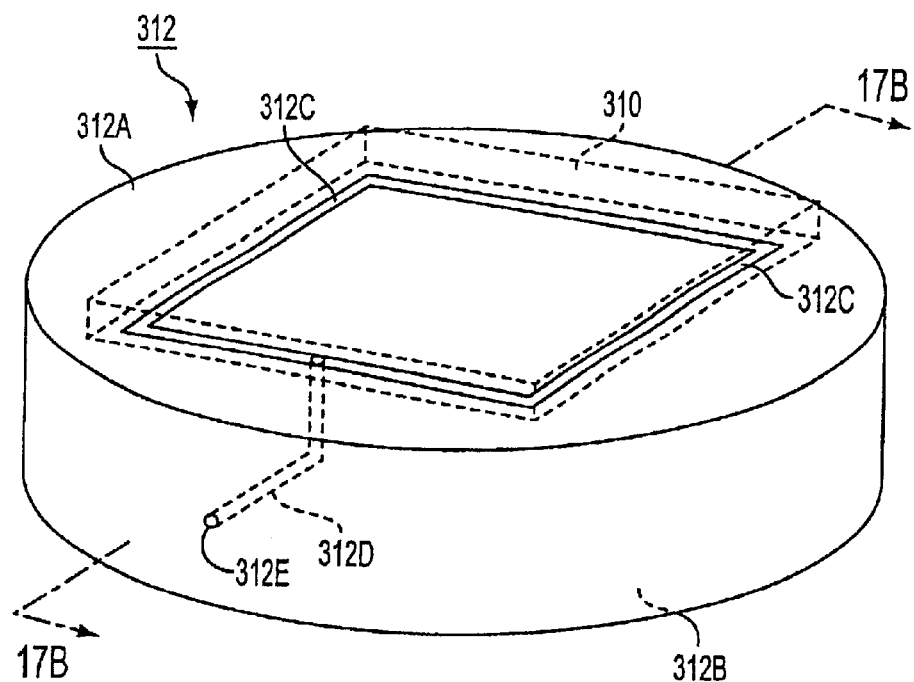
FIGS. 17(A) and 17(B), shows enlarged views of the mask holder portion of the eighth embodiment of the present invention, where
Figure 17B:
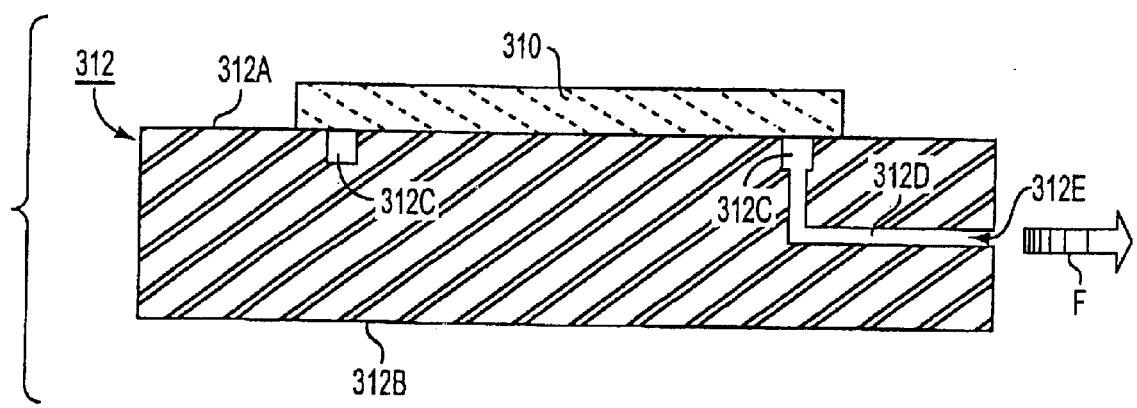

FIG. 17(A) shows an enlarged view of the mask holder 312. FIG. 17(B) is an end view looking in the direction of the arrows along the line XVII—XVII of FIG. 17(A). As shown in FIGS. 17(A) and 17(B), the shape of the mask holder 312 is somewhere between that of a cylinder and a thick disk. The mask 310 is positioned on a top surface 312A of the holder 312 as indicated by the dotted lines. The top surface 312A and bottom surface 312B of the holder 312 are flat, plane-parallel surfaces. A groove (recess) 312C is formed in the top surface 312A, forming a square corresponding to the position of the mask 310. The groove 312C is connected to a suction port 312E, which is formed in the side of the mask holder 312, through an airway 312D, which is formed inside the mask holder 312. A suction port 312E is in turn connected to the vacuum pump 314 through the conduit 316 (mentioned above). In addition, in the present embodiment, the mask holder 312 is made of the same material as the mask 310. Both the mask 310 and the mask holder 312, for example, may be made of quartz.

Next, the operation of this embodiment will be described. The mask 310 is loaded on the top surface 312A of the mask holder 312 as shown in FIGS. 16 and 17 such that the groove 312C is covered all the way around by the mask 312. As discussed above, the top surface 312A of the mask holder 312 is flat. This means that the entire bottom of the mask 310 is in contact with the top surface 312A of the mask holder 312, except for the small area directly over the groove 312C. With the system in this state, if a vacuum is pulled in the slot 312C of the mask holder 312 by the vacuum pump 314 [arrow F, FIG. 17(B)], the mask 310 will be drawn against the mask holder 312 and held fast. This puts the entire pattern area in the center portion of the mask 310 in close contact with the top surface 312A of the mask holder 312. As stated earlier, the mask holder 312 is made thick enough to prevent it from sagging under its own weight. Accordingly, this reduces the sagging of the mask 310 due its own weight to a satisfactory level.

Once the mask 310 has been attached to the mask holder 312 as described above, and certain processes such as alignment have been performed, exposure can begun. The temperature of the mask 310 now rises due to its being flooded with exposure light. As the temperature rises, heat from the mask 310 is transferred to the mask holder 212, and the temperature of the mask holder 312 also rises. In this embodiment, as stated earlier, the mask holder 312 is made of the same material as the mask 310 (quartz, for example), which means that they have the same coefficient of thermal expansion. For this reason, there is good transfer of heat from the mask 310 to the mask holder 312 through the portions of both that are in tight contact, thus minimizing the difference in temperature between them. In addition, the mask 310 and the mask holder 312 will experience about the same level of shape distortion due to temperature change, and will therefore expand and contract together. Accordingly, thermal deformation of—the mask 310 is also reduced to a satisfactory level.

Furthermore, exposure light passes through the pattern portion of the mask 310 and the center of the mask holder 312. Because the top and bottom surfaces 312A and 312B of the mask holder 312 are plane-parallel, however, the presence of the mask holder 312 has no detrimental effect on the exposure operation (the imaging of the pattern).

As in the eighth embodiment described above, the sagging of the mask due to its own weight as well as the thermal deformation of the mask are reduced. This reduces image curvature and lateral displacement of the pattern due to the mask sagging, as well as image curvature and deformation due to thermal distortion, Precise and stable images of the mask pattern can therefore be obtained.

Next, a ninth embodiment of the present invention will be explained, with reference to FIG. 18. Parts of this embodiment that are equivalent to parts of the eighth embodiment will have the same reference numerals. In the eighth embodiment, the mask was held to the top surface of the mask holder by vacuum suction, whereas in the ninth embodiment, it is drawn against the bottom.

Figure 18:
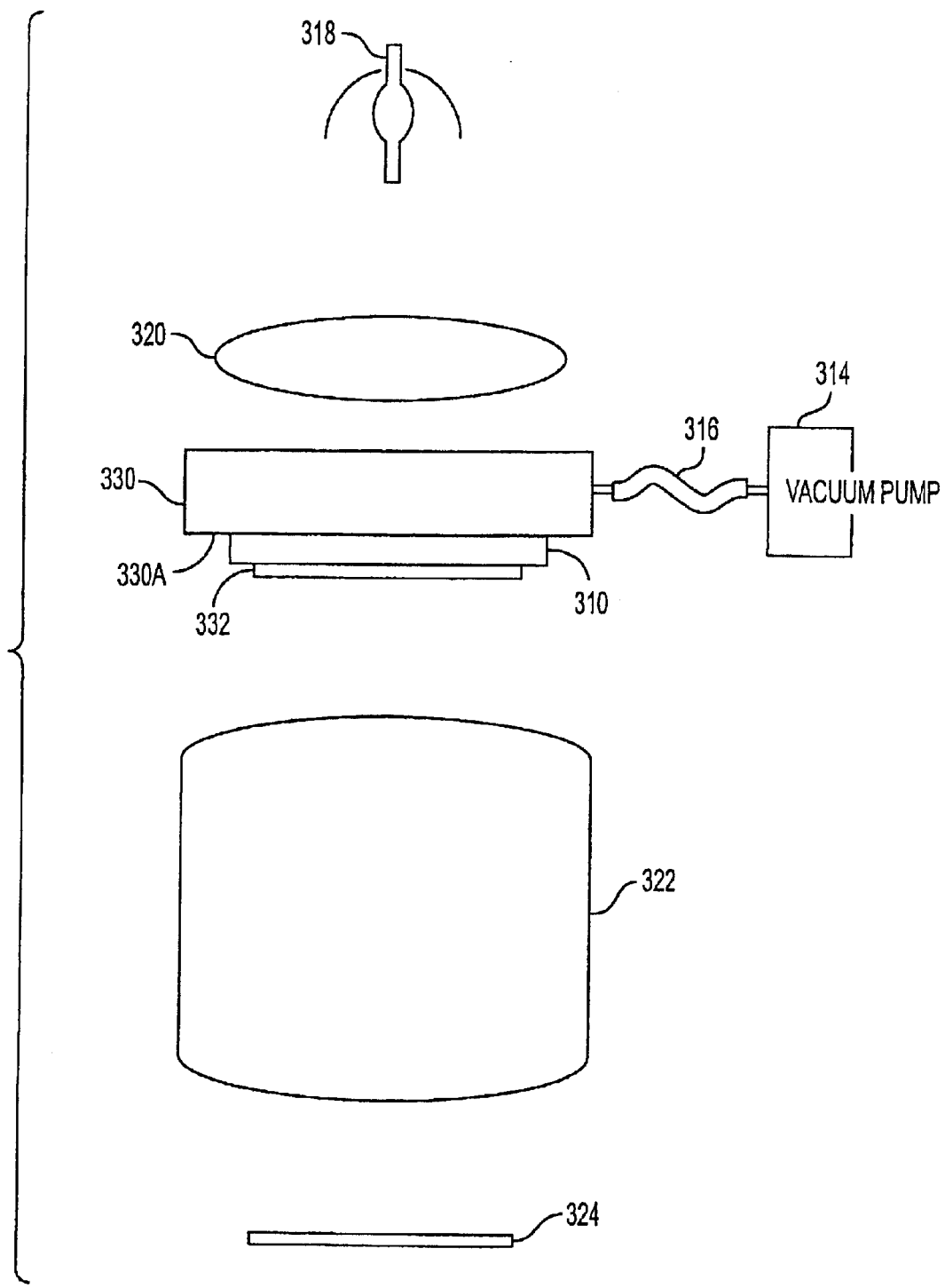
FIG. 18 is a simplified schematic elevational view of a projection exposure apparatus of a ninth embodiment of the present invention.

In FIG. 18, the configuration of a mask holder 330 is inverted top-to-bottom from the corresponding configuration of the mask holder 312 of the eighth embodiment. Suction grooves (not illustrated) are formed in the bottom surface 330A of the mask holder 330. The mask 310 is drawn fast to the bottom end (the projection optical system 322 end) of the mask holder 330 by the vacuum pump 314. In addition, since in this embodiment, the mask holder 330 is on the top end (the illumination optical system 320 end), a pellicle 332 is added over the mask 310 for protection.

In this embodiment, too, the mask holder 330 is made of a material having the same coefficient of thermal expansion as the mask 310. This provides the same reduction of heat-related distortions and image curvature to satisfactory levels realized in the eighth embodiment. Holding the perimeter of the mask 310 in tight vacuum contact with the mask holder 330 also prevents penetration of gas between the pattern surface of the mask 310 and the contact surface of the mask holder 330, thereby reducing the sagging of the mask 310 due to its own weight.

Next, a tenth embodiment of the present invention will be described with reference to FIG. 19. In this embodiment, as in the above, the mask-holder is made of the same material as the mask (quartz, for example). Accordingly, the holder can be formed to function as an optical element, such as a lens. That is the case in this tenth embodiment, in which the mask holder performs a dual function as part of the illumination optics.

Figure 19:
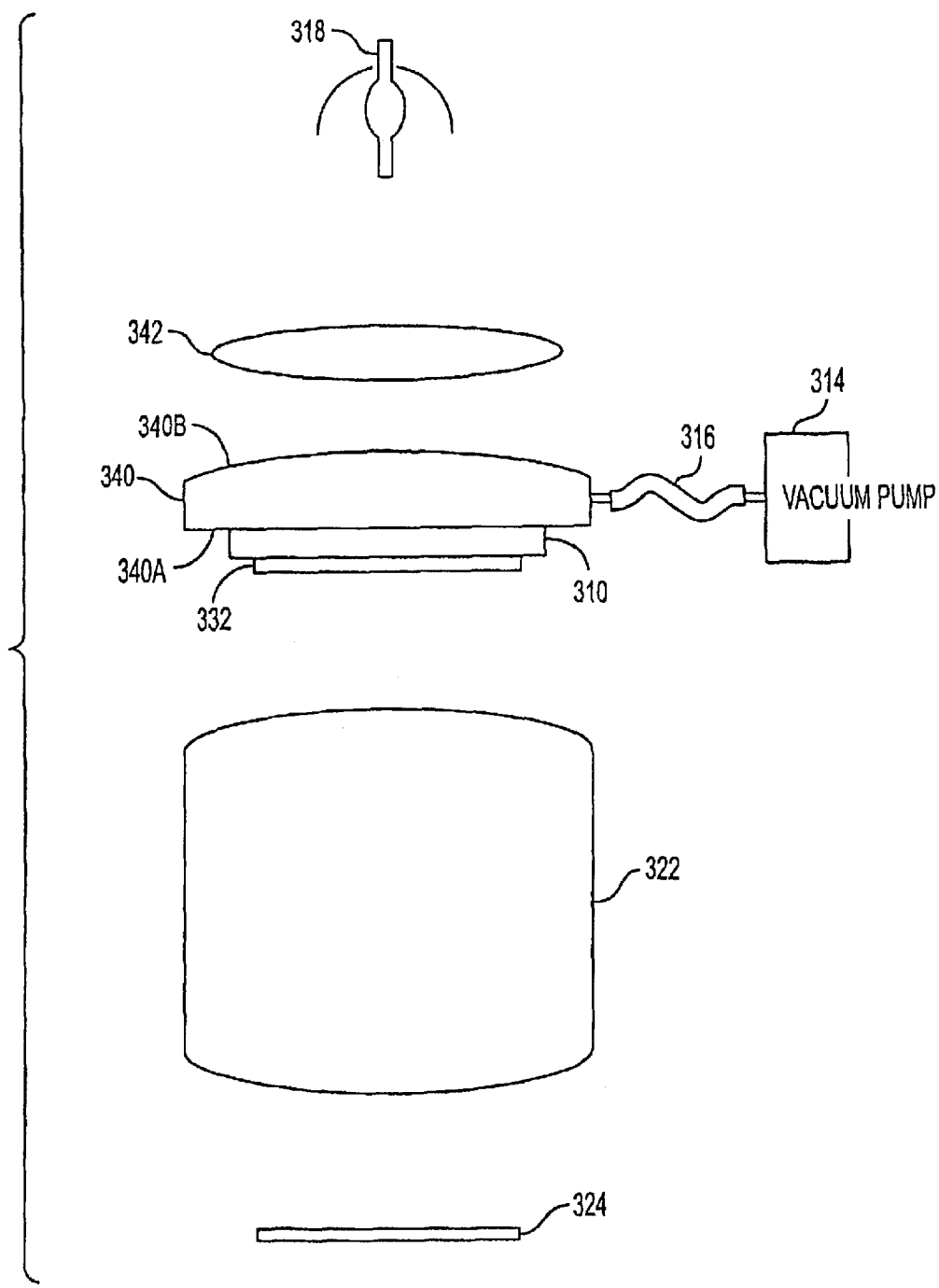
FIG. 19 is a simplified schematic elevational view of a projection exposure apparatus of a tenth embodiment of the present invention.

In FIG. 19, a bottom surface 340A of a mask holder 340, constructed the same as the corresponding element of the ninth embodiment, described above, with the mask 310, with the pellicle 332 installed on it, held fast to it by vacuum suction. A top surface 340B of the mask holder 340, however, is formed as a curved surface, to make the mask holder 340 a lens that functions as part of the illumination optical system 342. This configuration simplifies the construction of the illumination optical system 342. In addition, whereas the eighth and ninth embodiments actually added one more optical element in the form of the mask holder, in the tenth embodiment, due to the fact that the mask holder serves a dual function, also serving as part of the illumination optical system, the mask can be held without adding any optical elements to the configuration.

Next, an eleventh embodiment of the present invention will be described with reference to FIG. 20. In the eighth, ninth, and tenth embodiments described above, the entire mask pattern surface made contact with the mask holder. Reduction in the amount oˆ mask sag due to the weight of the mask, however, can also be achieved in a configuration in which only a portion of the pattern surface makes contact with the mask holder.

Figure 20A:
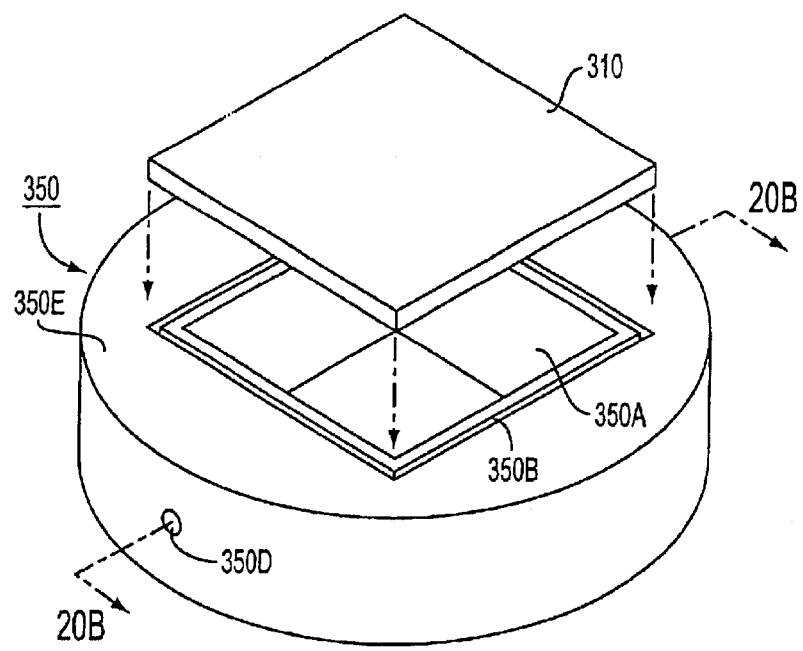
FIGS. 20(A), 20(B), and 20(C), shows a projection exposure apparatus of an eleventh embodiment of the present invention, where
Figure 20B:
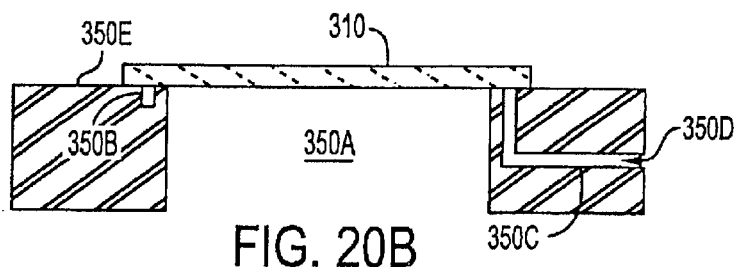

FIG. 20(B), is an end view looking in the direction of the arrows, along the line XX—XX of FIG. 20(A). In this embodiment, as shown in FIG. 20(B), a mask holder 350 has a square through-hole 350A formed at its center. Formed around the lip of the through-hole 350A is a vacuum suction groove (recess) 350B, which is connected through an airway 350C to a suction port 350D formed in the side of the mask holder 350. As in the embodiments described above, the mask holder 350 is made of a material having the same coefficient of thermal expansion as the mask 310.

Unlike these other embodiments, however, in which the entire pattern surface is in contact with the mask holder, in this embodiment, only a portion of the pattern surface of the mask 310 touches the top surface 350E of the mask holder 350. While this does allow the mask 310 to sag somewhat under its own weight, the amount of sag is greatly reduced in comparison to that experienced in the prior art arrangements. Also, because the materials used for the mask 310 and the mask holder 350 have the same coefficient of thermal expansion, any heat in the mask 310 is transferred to the mask holder 350. For this reason, as in the embodiments described earlier, thermal distortion and image curvature are reduced to satisfactory levels.

Figure 20C:
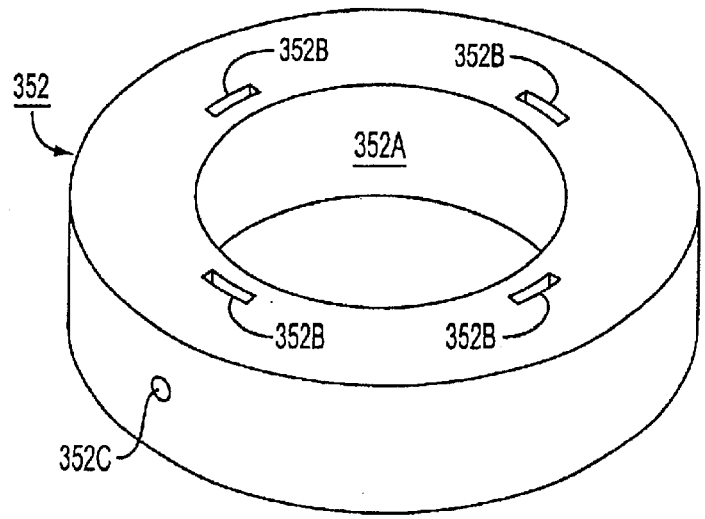

FIG. 20(C) shows a modified version of the eleventh embodiment. In this example, the mask holder 352 has a cylindrical through-hole 352A. Also, a vacuum suction groove 352B around the lip of the through-hole 352A is not a continuous groove as it was in the other version of this embodiment. Each groove 352B in the mask holder 352 is connected to the others, and to a suction port 352C. As in the other version, the material used to make the mask holder 352 has the same coefficient of thermal expansion as the mask 310.

In the above eighth, ninth, tenth, and eleventh embodiments, the same material (quartz, for example) was used for the mask holders and the masks. They need not necessarily be made of the same material, however, as long as the materials are similar, and in particular, as long as they have about the same coefficients of thermal expansion.

In the tenth embodiment, shown in FIG. 19, the mask holder was constructed so that it could also serve as part of the illumination optics. The mask holder could also have been inverted, bottom-to-top, however, and used as part of the projection optics. This also applies to the eleventh embodiment.

The shape and dimensions of the mask holders in the eighth, ninth, tenth, and eleventh embodiments are not confined to those shown here. The mask holders in the eighth, ninth, tenth, and eleventh embodiments, for example, are all cylindrical, but they could also be other shapes, such as square blocks. The shape and placement of the vacuum slots may also be changed as desired.

Figure 21:
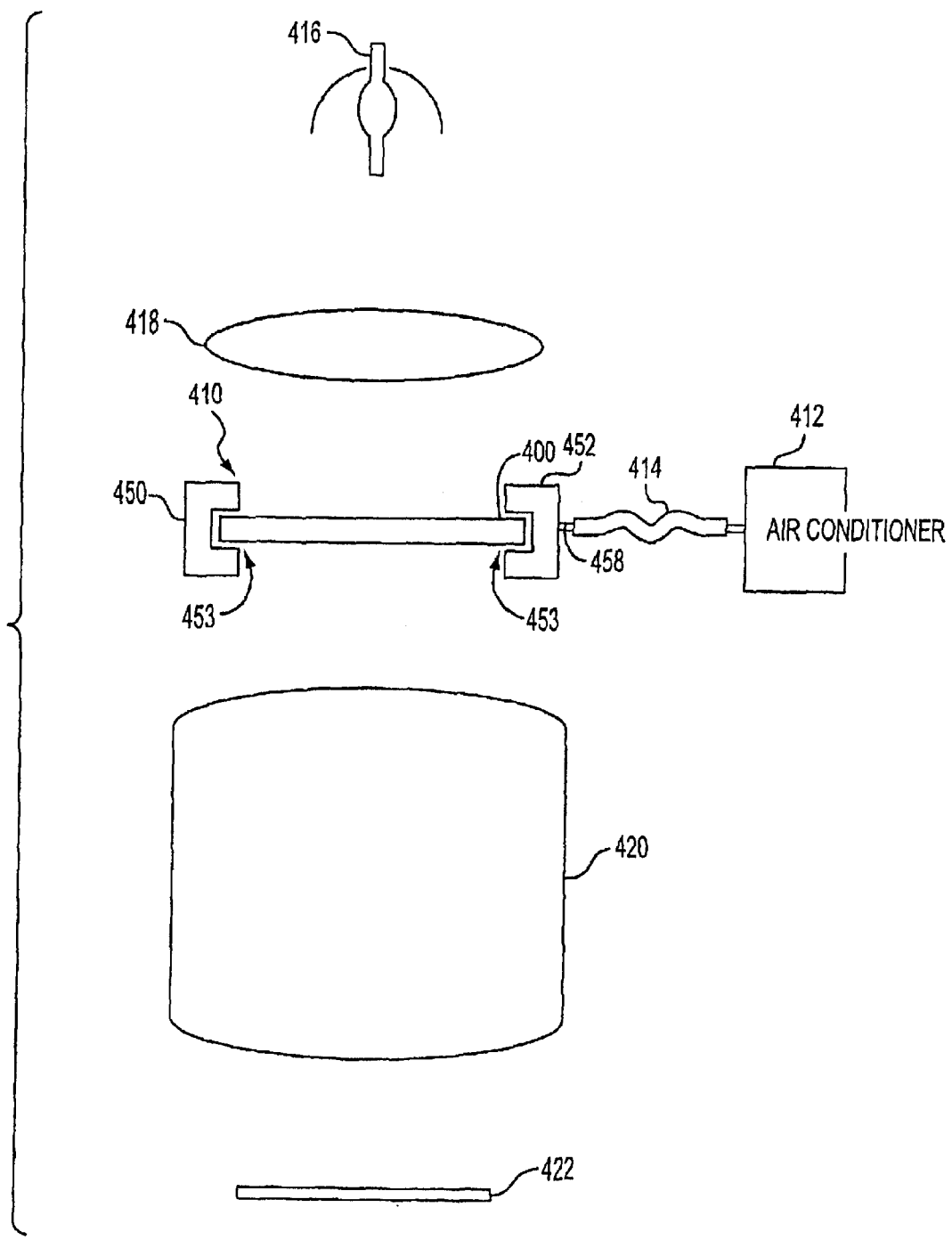
FIG. 21 is a simplified schematic elevational view of a projection exposure apparatus of a twelfth embodiment of the present invention.

Next, a twelfth embodiment of the present invention will be explained, with reference to the drawings. FIG. 21 shows the main parts of the projection exposure apparatus of a twelfth embodiment of the present invention. As shown in FIG. 21, a mask 400 is held by a mask holder 410. Connected to the mask holder 410 through a conduit 414 is an air conditioner 412. Provided above the mask 400 is a light source 416, which emits the exposure light. Provided between the light source 416 and the mask 400 is an illumination optical system 418. A wafer 422 is placed below the exposure-light-transparent side of the mask 400, with a projection optical system 420 sandwiched therebetween.

Exposure in this embodiment works the same as in most common exposure systems. That is, exposure light from the light source 416 passes through the illumination optical system 418, and illuminates the mask 400. The pattern printed on the mask 400 is projected through the projection optical system 420 onto the wafer 422 by the exposure light.

Figure 22:
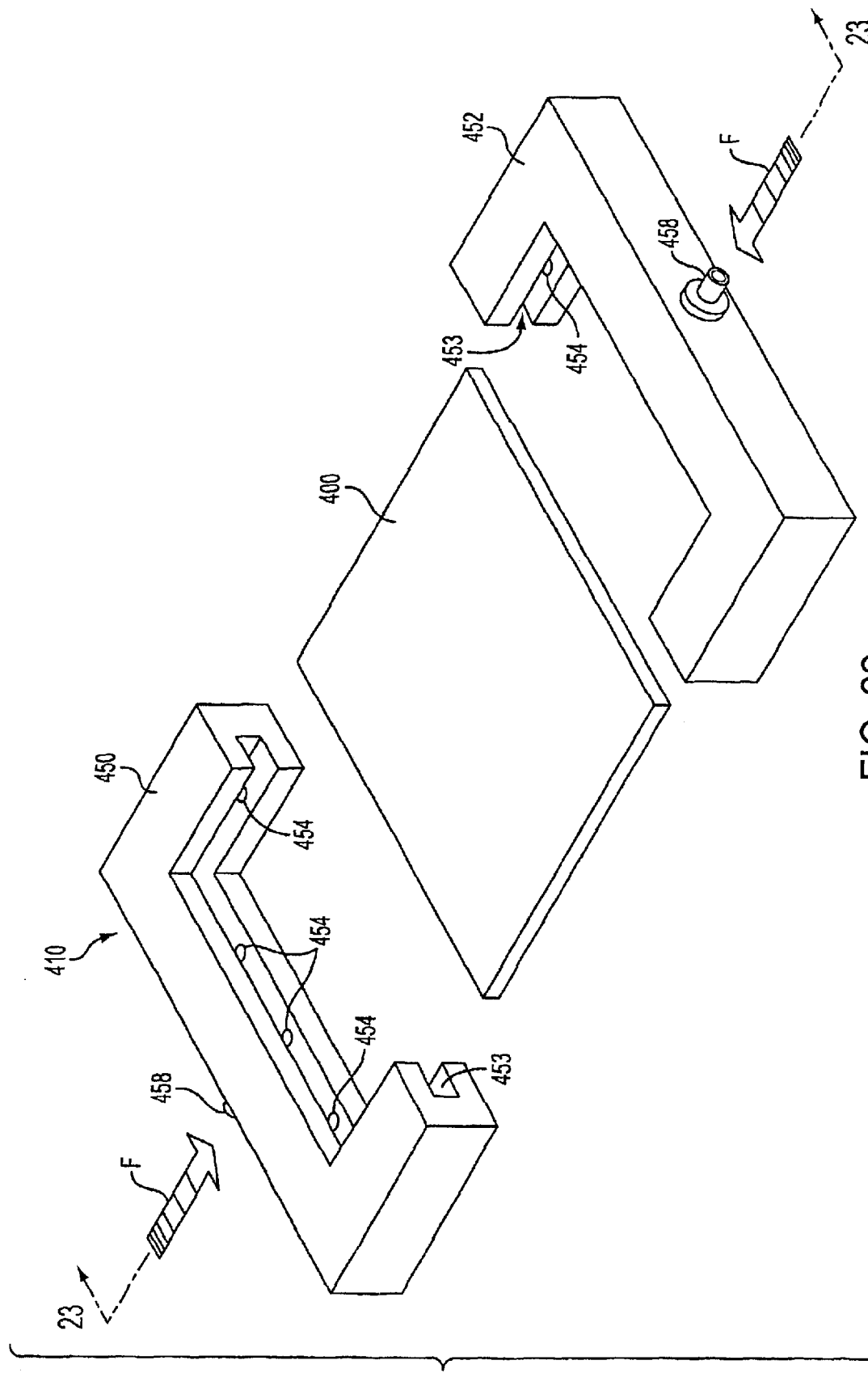
FIG. 22 is an exploded oblique view showing the mask holder of the twelfth embodiment.
Figure 23:
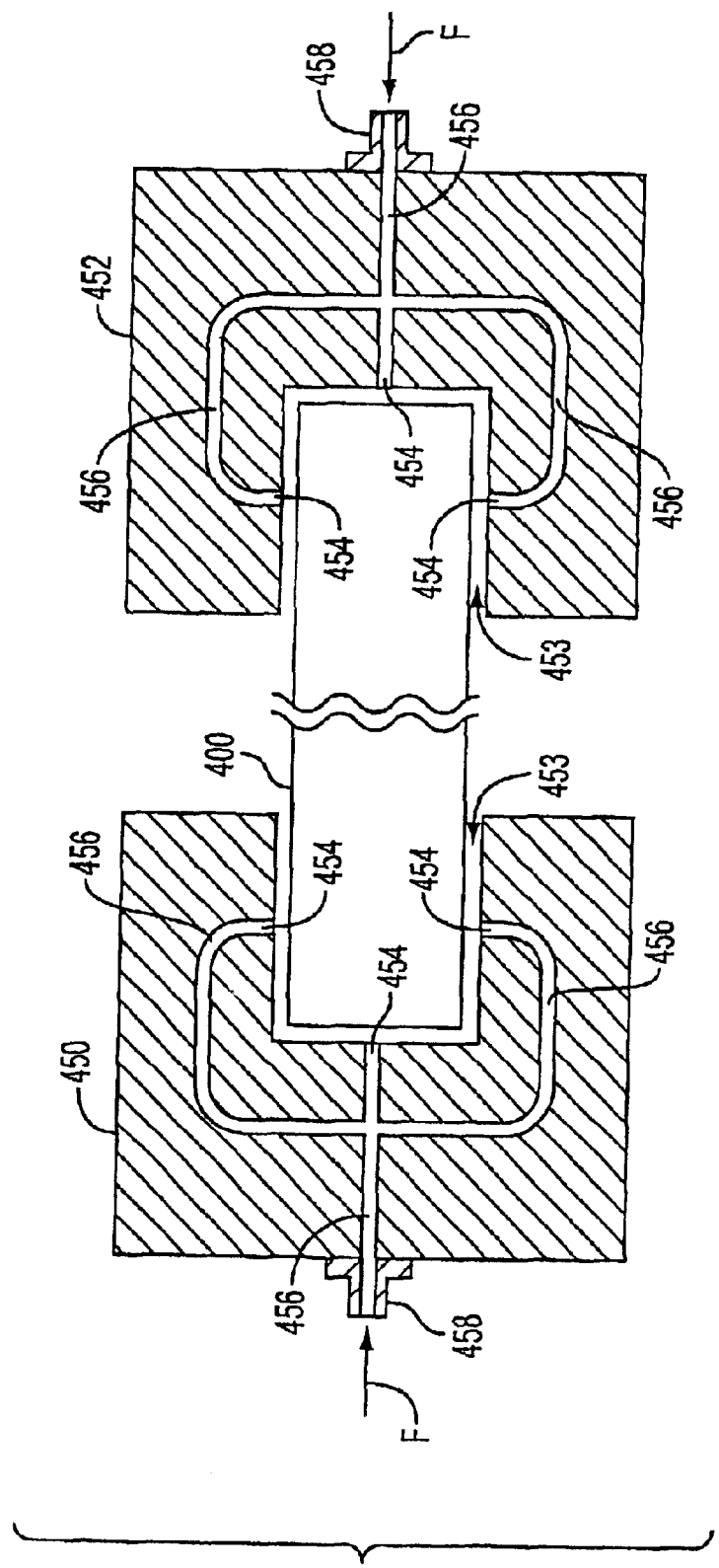
FIG. 23 is a cross-sectional view taken along the line XXIII—XXIII of FIG. 22.

Next, the mask-holding means of this embodiment will be described in detail, with reference to FIGS. 22 and 23. FIG. 22 is an oblique exploded view of the mask holder 410, and FIG. 23 shows a cross-sectional view taken along the line XXIII—XXIII of FIG. 22. As shown in these drawings, the structure of the mask holder 410 is divided into two holder frames, 450 and 452, formed so as to enclose the outer edge of the mask 400. The holder frames 450 and 452 have slots 453, formed to have substantially U-shaped cross-sections, as shown in FIG. 23. In other words, these holder frames 450 and 452 are shaped so that they surround the mask 400 from three directions: top, bottom, and ends.

Also formed in the holder frames 450 and 452 are air jets for blowing out air to push on the mask 400. More specifically, multiple tiny exhaust ports 454 are symmetrically placed along the surfaces of the slots 453 of the holder frames 450 and 452 for supplying and, expelling air. Inside the holder frames 450 and 452, all exhaust ports 454 are connected to each other and to intake ports 458 (shown on only one side in FIG. 21) by airways 456. It is these exhaust ports 454, airways 456, and intake ports 458, that together form the air jets.

The above intake ports 458 are connected through the conduit 414 to the air conditioner 412. The purpose of the air conditioner 412 is to supply air at the prescribed temperature and flow rate. This air is supplied through the conduit 414 to the mask holder 410.

Next, the operation of a holding means configured as described above will be explained. The mask 400 is placed inside the slots 453 of the holder frames 450 and 452 of the mask holder 410. During this step, the mask 400 is placed so that a slight gap is formed between the edge of the mask 400 and the slots 453. In this state, air is supplied by the air conditioner 412, at a constant temperature and flow rate, flowing in the direction of the arrows F shown in FIG. 22. This causes air to flow through the conduit 414, the intake port 458, and the airway 456, in sequence, to be blown at the mask 400 from the exhaust ports 454. As stated above, the exhaust ports 454 are symmetrically placed along the surfaces of the slots 453. This creates pressure that pushes against the edges of the mask 400 symmetrically from three directions, thus pushing the mask 400 away from the surfaces of the slots 453. This enables the mask 400 to be held in place without touching the holder frames 450 or 452. Also, because the air being blown from the exhaust ports 454 is maintained at a constant temperature and flow rate by the air conditioner 412; the mask 400 can beheld at a constant attitude.

Thus in this embodiment, the mask 400 is held in the mask holder 410 without touching it. For this reason, even if the mask 400 heats up during exposure, this heat will not be transferred to the mask holder 410. Accordingly, distortion changes caused by the mask 400 warping due to thermal shape distortion of the mask holder 410, as well as offset and rotation due to mispositioning of the mask 400 can be controlled to a satisfactory level, thus enabling accurate and stable projection exposures to be performed. As an additional advantage, it can also be expected that changes in the image reduction ratio due to thermal expansion of the mask 400 can be reduced by using the constant-temperature air to cool the mask 400.

In the twelfth embodiment described above, the present invention is applied in the exposure apparatus for fabricating integrated circuits. Of course, the invention could also be applied, in other exposure apparatus, such as exposure apparatus for liquid crystal display elements, or exposure apparatus of the type that exposes by scanning the mask.

Although the above twelfth embodiment used air, other gases could also be used. Magnetic fields could also be used to hold the mask in place without touching it. The mask could be held without touching it, for example by providing opposing magnetic poles across from each other on the mask and the holder. Similarly, opposing electrostatic fields could be used to hold the mask.

Next, a thirteenth embodiment of the present invention will be described, with reference to the drawings.

Figure 24:
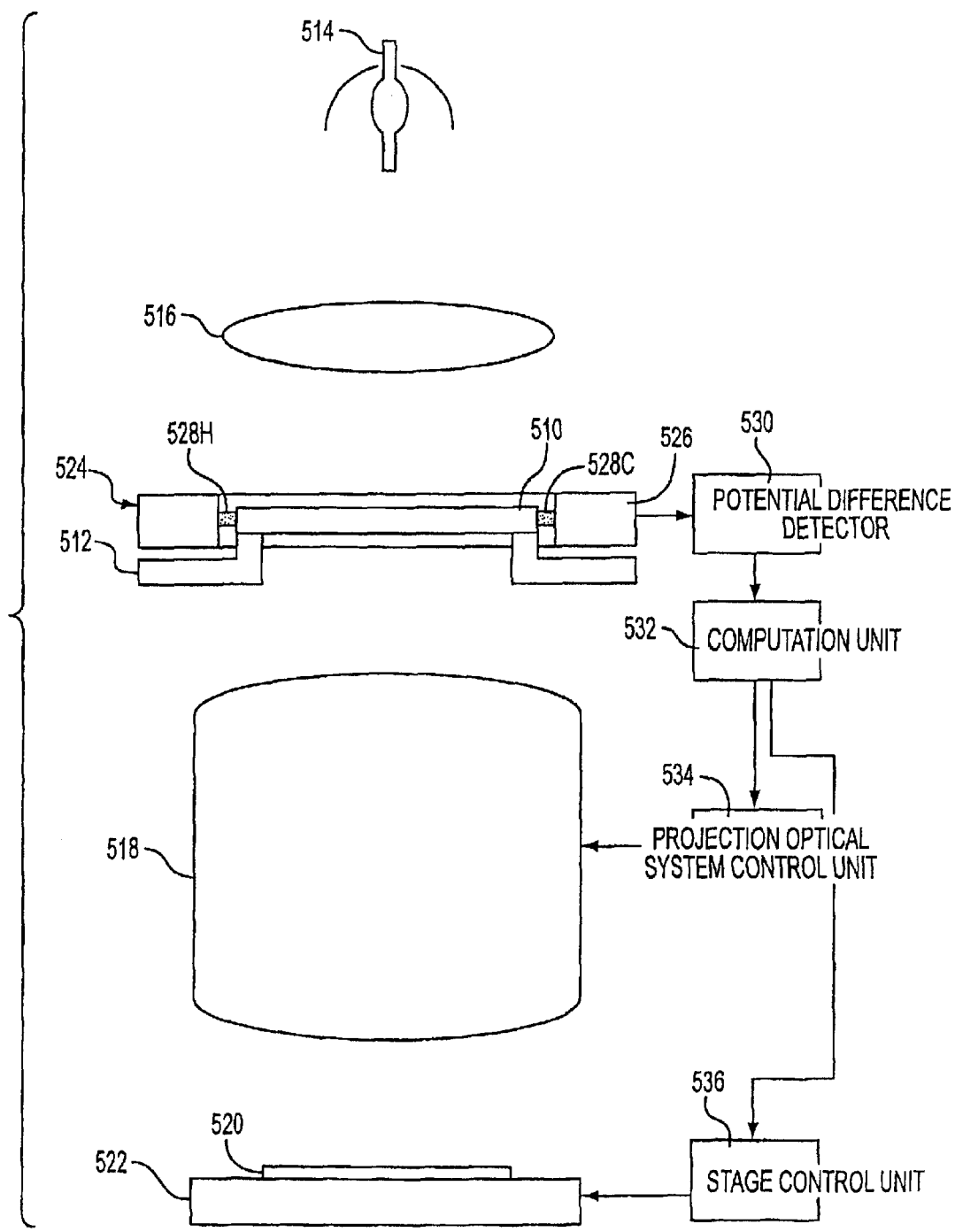
FIG. 24 is a simplified schematic elevational view of a projection apparatus of a thirteenth embodiment of the present invention.

FIG. 24 shows the main parts of the projection exposure apparatus of a thirteenth embodiment of the present invention. In this drawing, a mask 510 is held by a mask holder 512. Provided above the mask 510 is a light source 514, which emits exposure fight. Provided between the light source 514 and the mask 510, is an illumination optical system 516. A wafer 520 is placed on the side of the mask 510 that is transparent to the exposure light, with the projection optical system 518 sandwiched therebetween. The wafer 520 is set on a wafer stage 522. The above components are all the same as in conventional projection exposure systems.

Figure 25:
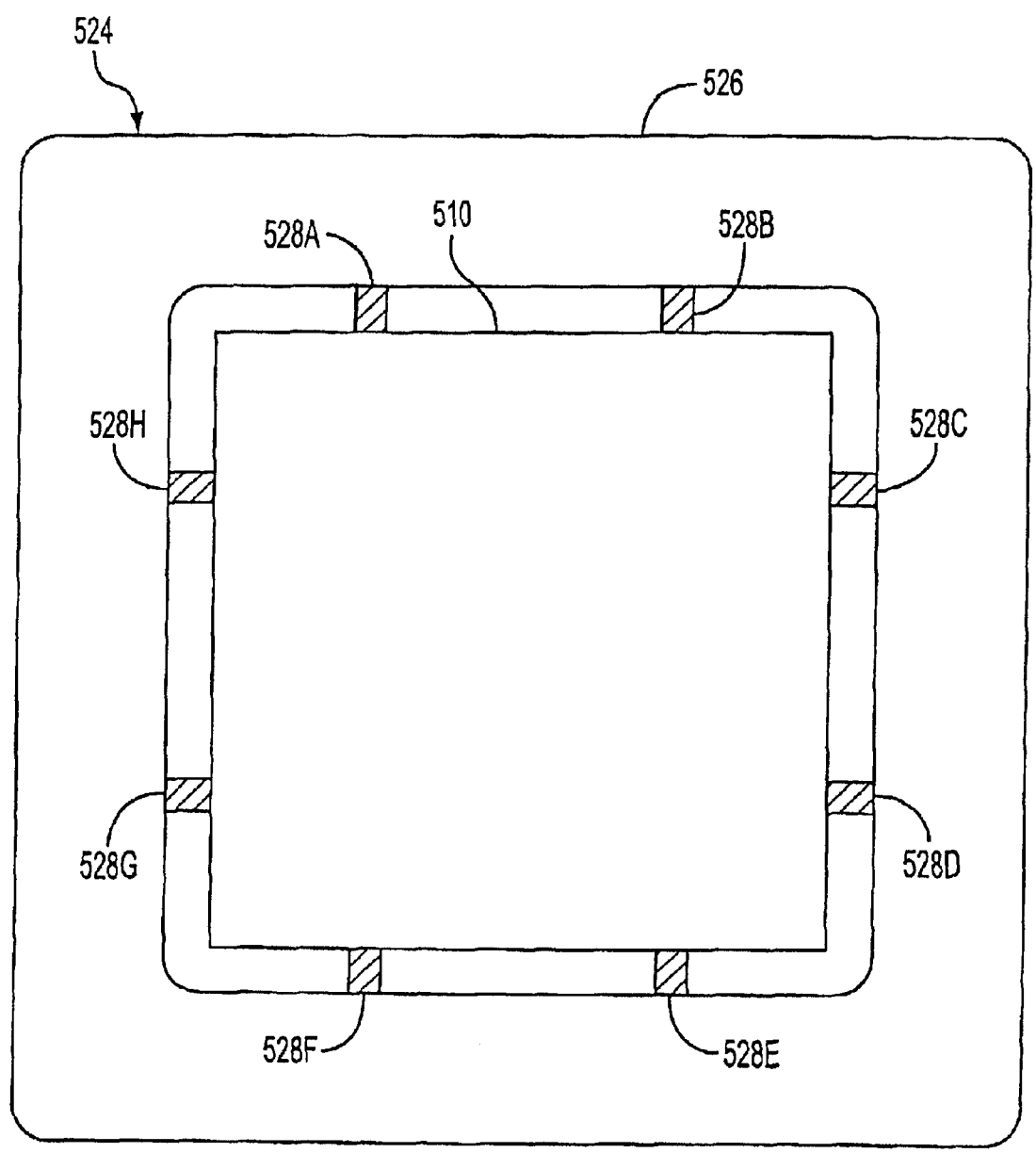
FIG. 25 is a plan view showing the mask and mask displacement detector of the thirteenth embodiment.

In this embodiment, a mask displacement detector 524 is provided around the outer edge of the mask 510. FIG. 25 is a plan view of the mask displacement detector 524. As shown in this drawing, the mask displacement detector 524 comprises a fixed frame 526 and a plurality of piezoelectric elements 528A through 528H inserted between the mask 510 and the fixed frame 526. These piezoelectric elements 528A through 528H are inserted between the fixed frame 526 and the mask 510 in a symmetrical arrangement with respect to the mask 510. The configuration is such that if the mask 510 experiences displacement with respect to the fixed frame 526, there will be a change in potential in the potential difference output from each of the piezoelectric elements 528A through 528H, due to the expansion and contraction of the mask 510 at the various points at which the piezoelectric elements 528A through 528H are provided. The voltage output electrodes (not illustrated) of each of these piezoelectric elements 528A through 528H are independently connected, through the fixed frame 526, to a potential difference detector 530.

The detected output of the potential difference detector 530 is connected to a computation unit 532. The computation result output from the computation unit 532 is connected to both a projection optical system control unit 534 and a stage control unit 536. Of these, the potential difference detector 530 independently monitors the potential difference of each of the piezoelectric elements 528A through 528H. From the potential differences of the piezoelectric elements 528A through 528H, the computation unit 532 computes (through a statistical process, for example) the extent of the displacement from the initial state of the mask 510, from which it derives the extent of change, with the displacement of the mask 510 seen in terms of changes in the pattern image. The system used as the projection optical system control unit 534, for example, could be one such as that disclosed in U.S. Pat. No. 5,117,255, in which some of the lenses that make up the projection optical system 518 are shifted back and forth along the optical axis; or tilted with respect to it, to adjust for distortion in the pattern image, or to adjust the image reduction ratio. As an alternative, this system could also be one such as disclosed in U.S. Pat. No. 4,666,273, in which the pressure in the airtight spaces formed between some of the projection lenses is changed to adjust the pattern image projection reduction ratio. When the presence of linear expansion of the pattern image is indicated in the computation results received from the computation unit 532, the projection optical system control unit 534 controls the projection reduction ratio of the projection optical system 518 to correct for it. As for the stage control unit 536, when shifting or rotation of the pattern image is indicated in the computation results received from the computation unit 532, the stage control unit 536 controls the wafer stage 522 to correct for it.

Next, the operation of this embodiment will be described. Basic exposure operation is the same as in conventional exposure apparatus. That is, exposure light emitted by the light source 514 passes through the illumination optics 516 to illuminate the mask 510. The pattern printed on the mask 510 is projected by the illumination light, through the projection optical system 518 onto the wafer 520. While this is going on, the potential difference output of each of the piezoelectric elements 528A through 528H is detected by the potential difference detector 530, and the detection results fed to the computation unit 532.

At the start of the exposure process, in the initial mask state, the potential difference values being output by the piezoelectric elements 528A through 528H (the initial potential difference values) are measured, and the measurements saved in the computation unit 532. These initial values will serve as baseline values for determining displacement of the mask 510. In other words, subsequent correction operations will seek to restore the mask 510 state represented by these initial values.

Figure 26A:
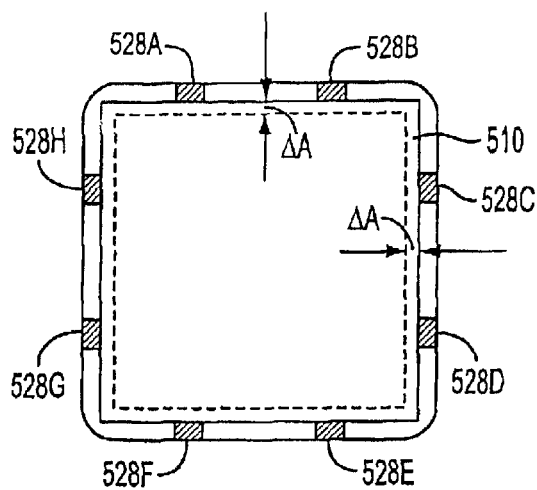
FIGS. 26(A), 26(B), and 26(C), is a plan view showing the nature of mask mispositioning and piezoelectric element distortion in the thirteenth embodiment.

As exposure operation proceeds from this initial state, displacement and distortion of the mask 510 will occur due to a rise in the temperature of the mask 510. FIG. 26(A), for instance, shows an example of mask expansion. The dotted line in this figure indicates the initial state of the mask 510. As its temperature rises, the mask 510 experiences equi-multiple expansion $\Delta A$ in all four directions, to the state indicated by the solid line. When this happens, each of the piezoelectric elements 528A through 528H of the mask displacement detector 524 will experience compression between the mask 510 and the fixed frame 526, causing the potential difference detector 530 to detect a potential difference corresponding to this compression. From the data it receives from the potential difference detector 530 and the above baseline values, the computation unit 532 computes $\Delta A$, the extent of mask 510 expansion.

For the purpose of making corrections, this kind of mask 510 expansion can be viewed as a magnification of the pattern image in the projection optical system 518. Therefore, from data on pattern expansion, the computation unit 532 computes $\Delta a$, the apparent change in the pattern image reduction ratio for that amount of expansion, and outputs this value to the projection optical system control unit 534. The projection optical system control unit 534 then controls the reduction ratio of the projection optical system 518 so as to cancel out this apparent change in pattern image, reduction ratio $\Delta a$. In other words it increases the reduction ratio so as to reduce the pattern image size by enough to cancel out the apparent change in the image reduction ratio $\Delta a$ corresponding to the expansion of the mask ($\Delta A$).

Figure 26B:
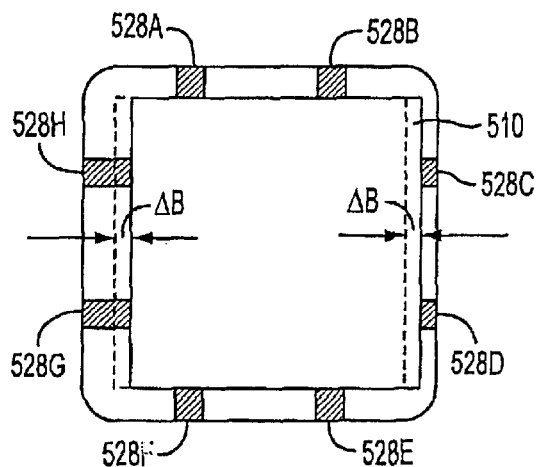

FIG. 26(B) shows an example of a mask mispositioning. In this case, the mask 510 is shifted to the right, away from its initial state (dotted line), by a displacement $\Delta B$ (solid line). When this happens, of the piezoelectric elements 528A through 528H of the mask displacement detector 524, the potential difference outputs of the elements 528A, 528B, 528E, and 528F will not change. The piezoelectric elements 528C and 528D, however, will be compressed, and the piezoelectric elements 528G and 528H will expand, and their potential difference outputs will change from their initial values by a corresponding amount. From these changes, the computation unit 532 computes $\Delta B$, the lateral shift of the mask 510.

For correction purposes, this kind of lateral shifting of the mask 510 can be viewed as a lateral shift of $\Delta b$ in the position of the pattern image on the wafer 520. Accordingly, the computation unit 532 outputs $\Delta b$, the lateral shift computation result, to the stage control unit 536. The stage control unit 536, in turn, controls the position of the wafer 520 so as to cancel out lateral shift $\Delta B$ of the mask. In other words, it controls the wafer stage 522 to move it just enough to cancel out the $\Delta b$ lateral shifting of the pattern image, corresponding to the $\Delta B$ lateral shift in the mask.

Figure 26C:
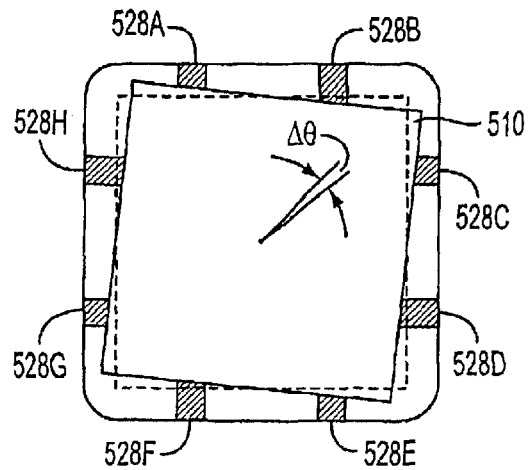

FIG. 26(C) shows an example of mask rotation, where the mask 510 has rotated out of its initial state, indicated by the dotted lines, to the position indicated by the solid lines. When this happens, of the piezoelectric elements 528A through 528H of the mask displacement detector 524, the elements 528A, 528C, 528I, and 528G are compressed, while the elements 528B, 528D, 528F, and 528H expand. Each element outputs a potential difference output change corresponding to its compression or expansion. From these changes, the computation unit 532 computes the rotation of the mask 510.

For correction purposes, this kind of mask 510 rotation can be viewed as a $\Delta\theta$ rotation of the projected pattern image on the wafer 520. Accordingly, the computation unit 532 computes this $\Delta\theta$ rotation, and outputs the result to the stage control unit 536. The stage control unit 536 responds by controlling the wafer stage 522 to rotate it just enough to cancel out this Δθ pattern image rotation.

In reality, displacement of the mask 510 is a combination of expansion, contraction, shift, and rotation displacement, along with nonuniform expansion of portions of the mask. The control units 534 and 536 make corrections to cancel out image variations that accompany these kinds of mask displacement, based on the results of computations by the computation unit 532.

As described above, in this thirteenth embodiment, mask displacement can be detected through the use of a plurality of piezoelectric elements. Then, based on these mask displacement detection results, projection optics reduction ratio corrections and wafer position corrections can be performed. Variations in the projected pattern image, more specifically, scaling, offset, and rotation, etc. of the projected image, can be effectively corrected, to realize highly precise pattern overlay accuracy.

Next, a fourteenth embodiment of the present invention will be described, with reference to FIG. 27. Elements of this embodiment that have corresponding elements in the thirteenth embodiment—will use the same reference numerals. In the thirteenth embodiment, mask displacement is interpreted in terms of variations in the projected pattern image, and these variations are then effectively corrected to project a satisfactory image. In the fourteenth embodiment, however, the mask displacement itself is corrected.

Figure 27:
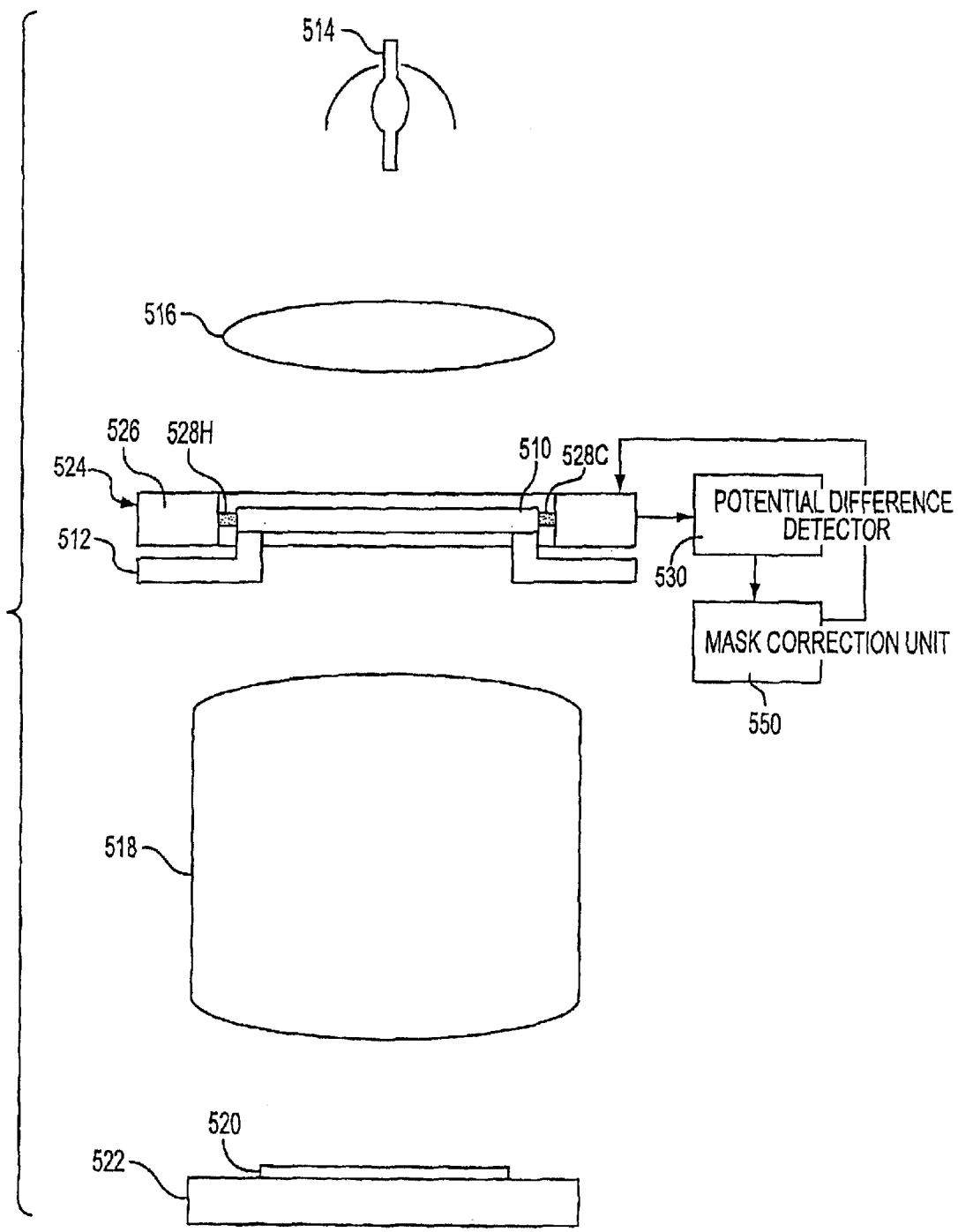
FIG. 27 is a simplified schematic elevational view of a projection apparatus of a fourteenth embodiment of the present invention.

In FIG. 27, the output side of the above potential difference detector 530 is connected to a mask correction unit 550, and the output side of the mask correction unit 550 is connected to the respective output electrodes of the piezoelectric elements 528A through 528H. It is commonly known that the piezoelectric elements can be used as actuators. This embodiment utilizes this feature.

As described earlier, the potential difference detector 530 detects the potential difference of each individual element of the piezoelectric elements 528A through 528H, and supplies its detection results to the mask correction unit 550. Like the above computation unit 532, the mask correction unit 550 also stores the initial potential difference values of the piezoelectric elements 528A through 528H (values obtained at the start of exposure). If, as the exposure proceeds, mask 510 displacement starts to occur, the potential difference values of the piezoelectric elements 528A through 528H start to change from their initial values as described above. In response, the mask correction unit 550 outputs correction voltages to the applicable piezoelectric elements as necessary to return their potential differences to the initial values.

If lateral shifting such as shown in FIG. 26(B) occurs, correction voltages to cause the elements to expand will be applied to the piezoelectric elements 528C and 528D, and correction voltages to cause the elements to contract will be applied to the piezoelectric elements 528G and 528H. The correction voltages will be such as to cancel out the deviation of the potential differences from, their initial values. Operation is the same for the cases shown in FIGS. 26(A) and 26(C). Application of correction voltages in this manner will correct for the displacement of the mask 510 thus restoring it to its initial state, and a satisfactory image of the pattern will be projected onto the wafer 520.

Next, a fifteenth embodiment of the present invention will be described with reference to FIG. 28. In the above thirteenth and fourteenth embodiments, two-dimensional mask displacement in the pattern plane, such as illustrated in FIG. 26, was detected and corrected. This embodiment, however, detects mask displacement in three dimensions, including the direction perpendicular to the mask pattern plane.

Figure 28A:
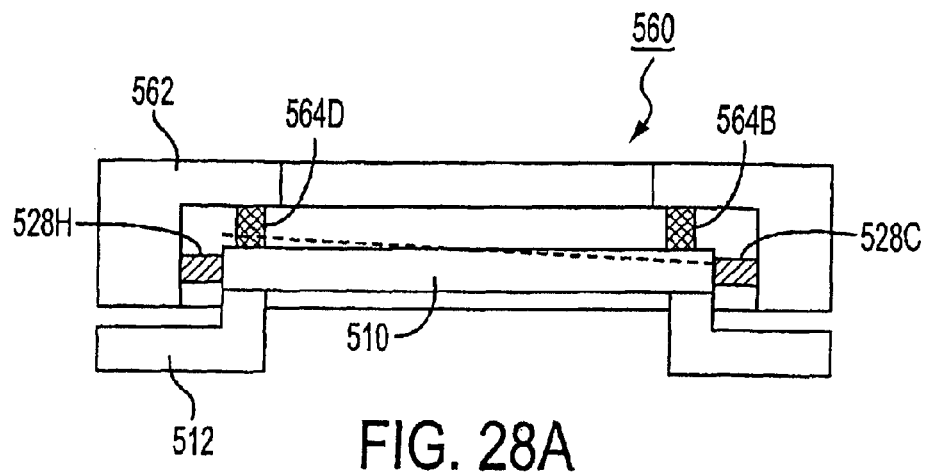
FIG. 28 includes FIG. 28(A) showing a side view partially in cross-section.
FIG. 28(B) showing a plan view of a mask holder of a fifteenth embodiment of the present invention.
Figure 28B:
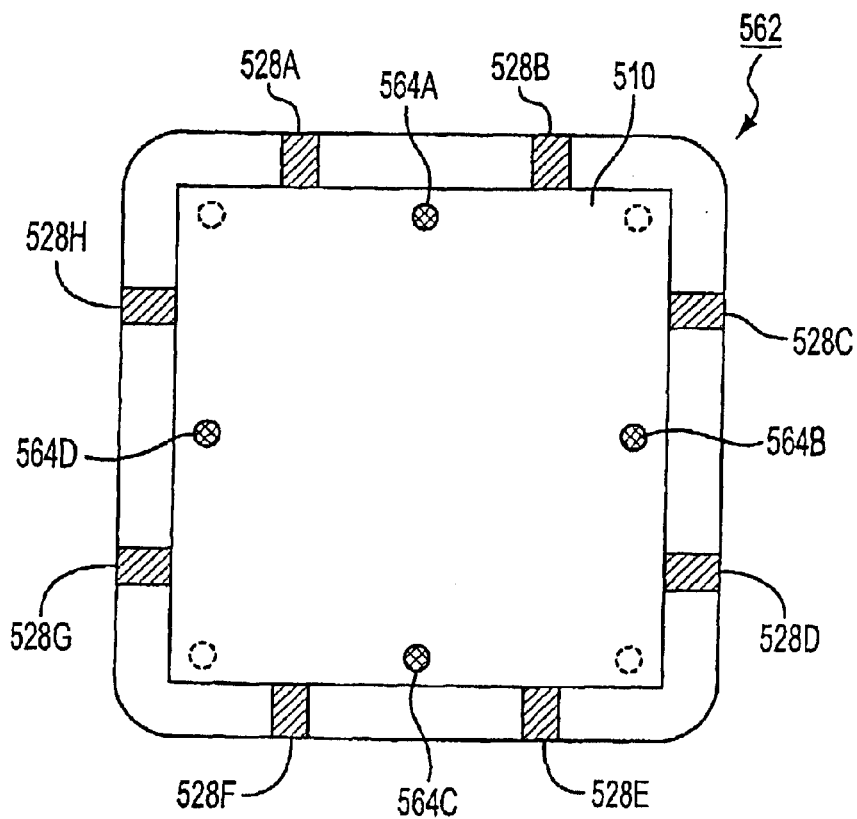
Figure 29:
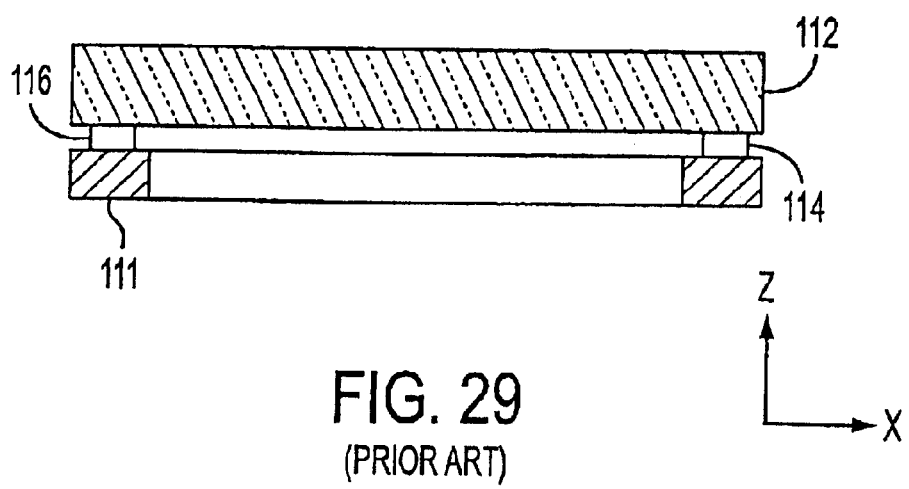
FIG. 29 is a cross-sectional view of a prior art reticle support mechanism.
Figure 30A:
FIGS. 30(A), 30(B), and 30(C), shows the nature of reticle sag in a reticle support of a prior art reticle support mechanism.
Figure 30B:
Figure 30C:
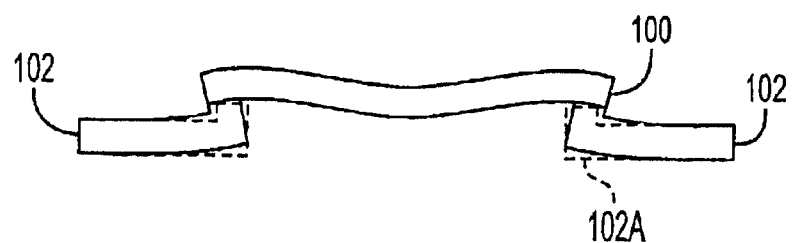
Figures 31, 32:
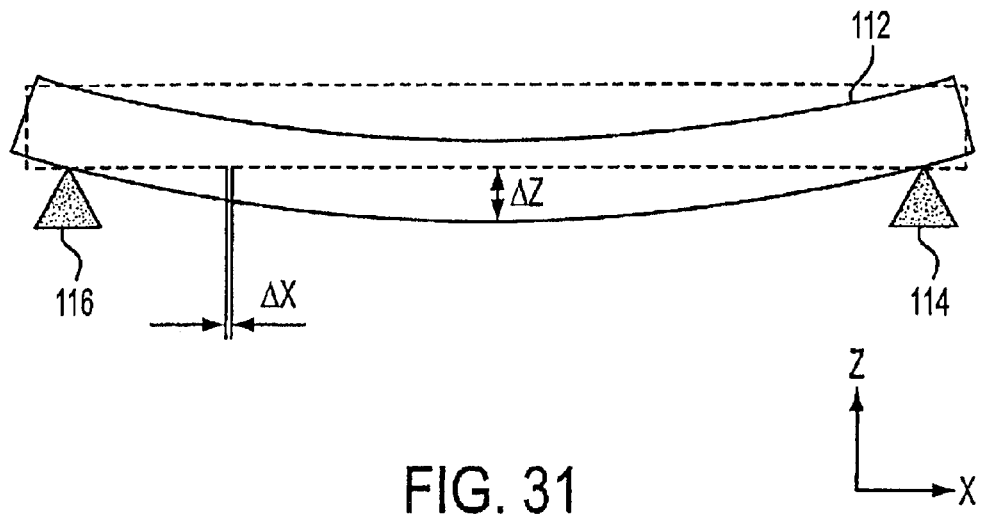
FIG. 31 is a schematic diagram used to explain the operation of a prior art reticle support mechanism.
FIG. 32 is a table showing reticle sag due its own weight in a prior art reticle support mechanism.

FIG. 28(A) is a cross-section view of a mask displacement detector 560 of the present embodiment. FIG. 28(B) is a plan view of the detector shown in FIG. 28(A), showing the placement of the piezoelectric elements with respect to the mask. As shown in these drawings, a fixed frame 562 has an L-shaped cross section with the short leg of the L fitting over the front of the mask 510 and the long leg around its sides. The placement of the piezoelectric elements 528A through 528H in the plane of the mask 510 is the same as in the embodiments described earlier. In the present embodiment, however, additional piezoelectric elements 564A through 564D are symmetrically placed around the front of the pattern surface of the mask 510, but may also be placed as indicated by the dotted lines in FIG. 28(B).

Next, the operation of this embodiment will be described. Its operation with respect to the piezoelectric elements 528A through 528H is the same as that of the thirteenth and fourteenth embodiments. The dotted line in FIG. 28(A) indicates the position of the front surface of a mask 510 that has been tilted out of position. If the mask 510 were tilted like this, the piezoelectric elements 564A through 564D would output voltages corresponding to the expansion and contraction corresponding to the tilting of the mask 510. Thus the extent of the tilting of the mask 510 can be determined from the voltages output by these piezoelectric elements 564A through 564D. This data on the tilt of the mask 510 can then be viewed in terms of the tilt of the pattern image plane at the wafer 520, and corrected as in the thirteenth embodiment. As an alternative, the piezoelectric elements 564A through 564D can be used as actuators to make the required corrections at the mask 510, as in the fourteenth embodiment.

Also, the number of piezoelectric elements placed around the edge of the mask can be varied as necessary. In general, increasing the number of elements provides a more detailed picture of the mask displacement, enabling finer displacement corrections to be made. Also, in the fourteenth and fifteenth embodiments, separate piezoelectric elements could be provided to detect mask displacement and to correct it. Various kinds of actuators other than piezoelectric elements could also be used.

In the above thirteenth, fourteenth, and fifteenth embodiments, piezoelectric elements were used as the mask displacement detection means. Any means could, however, be used, as long, as it operates similarly. Instead of piezoelectric elements, for example, capacitors or inductors could be used, and changes in their capacitance or inductance detected.

Also, things such as the shape of the mask and configuration of the exposure apparatus need not be limited to those of the above embodiments. The present invention can also be applied, for example, to scan-type exposure systems used for the fabrication of liquid crystal display elements.

The principles of the present invention can be applied in general to a specimen-holding technology for holding a flat-panel-type specimen such as a mask on a movable specimen table.

As noted above in conventional holding methods, the reticle, mask, or specimen is held against the specimen table by vacuum-induced suction. In exposure apparatus for transferring a pattern formed on a mask onto a photosensitive substrate, the mask is held fast to a mask stage by vacuum-induced suction. A vacuum pad is provided on the upper surface of a mask stage, where the mask is in contact with the stage. A vacuum pump or compressor is used to evacuate the air from the upper part of the vacuum pad, making the air pressure between the mask and mask stage less than the outside air pressure. This causes the mask to be drawn tightly against the mask-stage.

The sixteenth through nineteenth embodiments are directed more specifically to the mask-holding problems.

Figure 33:
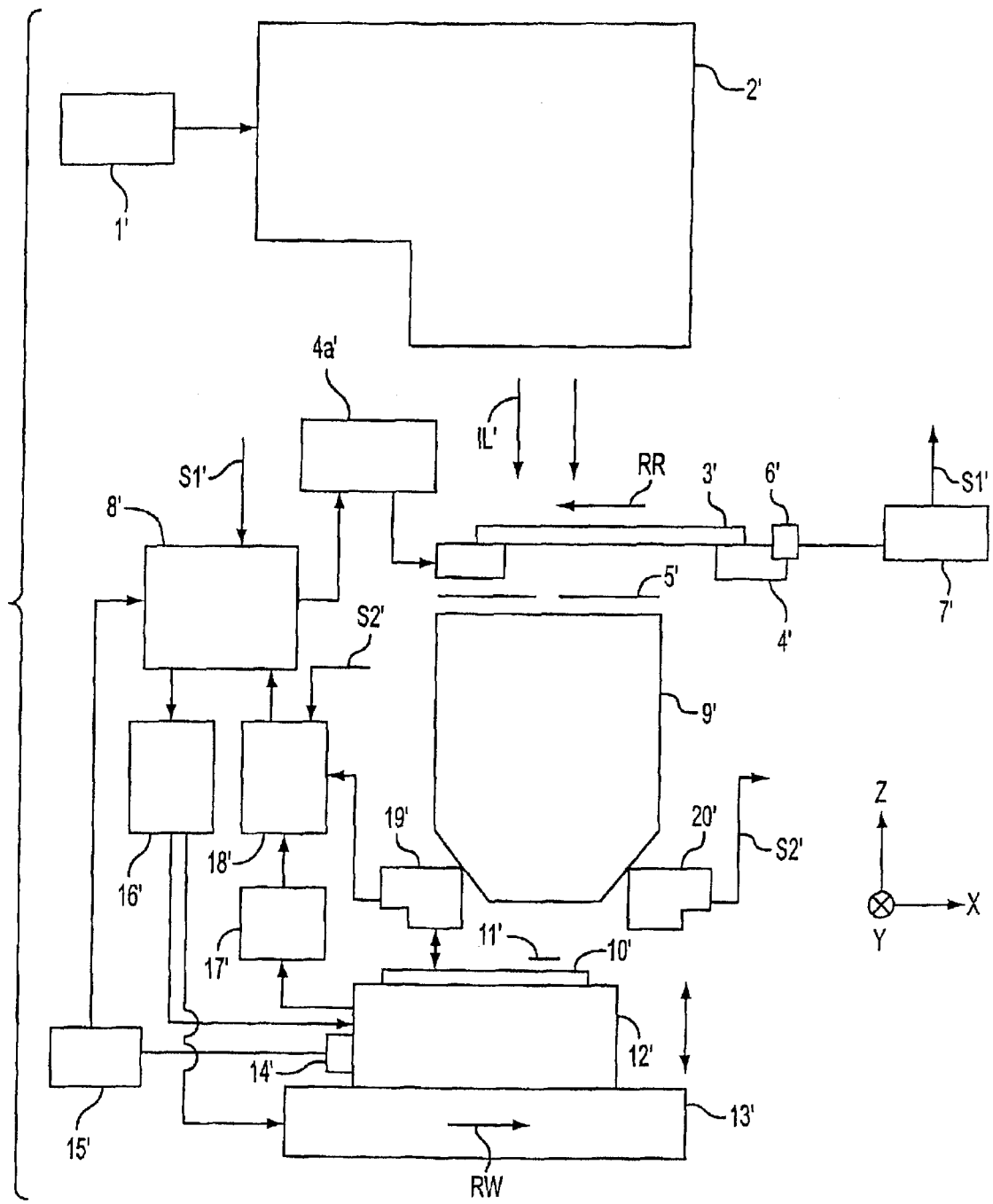
FIG. 33 is a simplified schematic elevational view showing the configuration of the projection exposure apparatus used for the sixteenth through nineteenth embodiments of the present invention.

FIG. 33 shows the projection exposure apparatus of the sixteenth through nineteenth embodiments, through which the image of a pattern formed on mask, specimen, or reticle 3' is transferred to a wafer 10'. Pulsed light from pulsed laser light source 1' (an excimer laser, etc.) is injected into illumination optical system 2'. The timing of light pulses emitted from pulsed laser light source 1' can be set as desired through a trigger control section (not illustrated). Illumination optical system 2' contains components such as beam-forming optics, fight-reduction optics, an optical integrator, a field stop, and a condenser lens. Light pulses applied to illumination optical system 2' are transformed thereby into pulsed exposure light IL', of substantially uniform illumination, which illuminates reticle 3'.

Reticle 3' is held to reticle stage 4' by a reticle holder to be described later (items 30' and 32' in FIG. 34). Reticle stage 4' is made so that it can be moved by reticle stage control unit 4'a, in a plane perpendicular to the optical axis of a projection optical system 9'. In other words, reticle stage 3' is positioned by moving it in the X (or −X) direction (a direction parallel to the page in FIG. 33), and the Y direction (the direction perpendicular to the page in FIG. 33, and perpendicular to the X direction). During exposure, exposure light IL' scans the moving reticle 3' in the X (and −X) direction. The peripheral configuration of reticle stage 4' will be explained in detail later.

Placed below reticle stage 4' is reticle blind 5', which has a rectangular aperture or slit formed therein. This rectangular aperture in reticle blind 5' effectively defines a rectangular slit-shaped illumination area on reticle 3'. An interferometer movement mirror 6', which is affixed to reticle stage 4', reflects a laser beam emitted from the reticle-end interferometer 7', which is installed external to the system. The X and Y coordinates of reticle stage 4' are constantly measured using the light emitted from reticle-end interferometer 7' and reflected by mirror 6'. Coordinate data S1' measured in this manner is supplied to main control system 8', which controls the operation of the entire apparatus.

Projection optical system 9' is positioned under reticle blind 5'. Through projection optical system 9', the image of that portion of the pattern inscribed on reticle 3' that is within the limits defined by the aperture of reticle blind 5', is projected onto photoresist-coated wafer 10' (the photosensitive substrate). Rectangular exposure area 11' is an area that, relative to projection optical system 9', is conjugate to the area on reticle 3', the limits of which are defined by the aperture of reticle blind 5'. Wafer 10' is held on Z leveling stage 12', and Z leveling stage 12' is mounted on wafer-end XY stage 13'. Z leveling stage 12' is made up of components that include a Z stage and a leveling stage. The Z stage positions wafer 10' in the Z direction (i.e., along the optical axis of projection optical system 9'), and the leveling stage tilts wafer 10' as required to position its exposure surface at the desired tilt angle. Wafer-end XY stage 13' is made up of components such as an X stage, which positions wafer 10' in the X direction, and a Y stage, which positions wafer 10' in the Y direction.

An interferometer movement mirror 14' is installed on the side of Z leveling stage 12', positioned to reflect a laser beam emitted from wafer-end interferometer 15', installed external to the system. These components are configured so that the X and Y coordinates of wafer-end XY stage 13' are constantly being measured by wafer-end interferometer 15', based on light reflected by mirror 14'. Coordinate data measured in this manner are supplied to the main control system 8'.

In addition, the currently-set tilt and height (focus position) on Z leveling stage 12' are sensed by Z leveling stage position sensing unit 17', and the tilt and height data thus sensed are supplied to computation unit 18'. Z leveling stage position sensing unit 17' may be configured, for example, to have a rotary encoder installed on the shaft of the drive motor (not shown) used to drive Z leveling stage 12'. Heights may also be sensed directly, using potentiometers.

Multipoint focus position sensor units 19' and 20' are placed at either side, in the X direction, of projection optical system 9'. Multipoint focus position sensor units 19' and 20' measure the height of the wafer 10' surface. Focusing signals S2' output by each of the multipoint focus position sensor units 19' and 20' are supplied to computation unit 18'. From previously acquired focus position data, computation unit 18' computes the height and tilt angle to which Z leveling stage 12' needs to be set (the target height and target tilt angle) for the next exposure area within exposure area 11' to be exposed, and sends this target height and target tilt data to main control system 8'. Through wafer stage control, unit 16', main control system 8' then controls the operation of Z leveling stage 12' in accordance with this data. Through reticle stage control unit 4'a, main control system 8' also causes reticle stage 4' to move, while at the same time controlling the operation of wafer-end XY stage 13' (through wafer stage control unit 16) to cause wafer-end XY stage 13' to scan in synchronization with reticle stage 4'.

In the present embodiment, to perform an exposure by the slit scan method, wafer 10' is scanned in scan direction RW' (the X direction) by XY stage 13', in sync with the scanning of reticle 3' in scan direction RR' (the X direction) by reticle stage 4'. At this time, if the projection size-reduction ratio of projection optical system 9' is β, and the scan rate of reticle 3' is VR, then the scan rate of wafer 10' will be β•VR. Through this scanning process, the entire pattern of reticle 3' will be exposed portion-by-portion on wafer 10'. The scan may also be performed in the reverse direction, in which case reticle 3' would be scanned in the X direction, and wafer 10' would be scanned in the −X direction in sync with the scanning of reticle 3'.

For slit scan exposure, the actual rate of travel of reticle stage 4', and consequently, that of XY stage 13', on the wafer-end of the system, are determined by the amount of light energy with which reticle 3' is illuminated by pulsed exposure light IL', the width of the reticle blind 5' aperture, and the sensitivity of the photoresist applied to wafer 10'. That is, the scan rate is determined by the amount of time required for the photoresist to be adequately exposed as the pattern on reticle 3' is moved past the aperture of reticle blind 5' by the movement of reticle stage 4'.

Next, the configuration of the reticle stage of the sixteenth embodiment of the present invention will be described, with reference to FIGS. 34, 35, 36, and 37. FIG. 34 shows the peripheral configuration of reticle stage 4', and FIG. 35 shows the construction of a reticle 3' that mounts on reticle stage 4'. Reticle stage 4' is made in the shape of a flat rectangular panel. Formed in the center portion of reticle stage 4' is a passage 28', which passes light that has passed through pattern area 3'a, the portion of reticle 3' in which the pattern is formed. The mirror 6' has been omitted from FIG. 34. Reticle holders 30' and 32', which hold reticle 3', are attached to reticle stage 4' at the rims of the side edges of passage 28' (one holder at each edge of passage 28' in the X direction). Reticle holders 30' and 32' might be formed, for example, of ceramic. Chrome layers 42', 44', 46', and 48' are formed by a vacuum deposition process on the bottom of reticle 3' near the four corners, as shown in FIG. 35. Attraction portions 34', 36', 38', and 40' are formed on the top surfaces of reticle holders 30' and 32', where they make contact with chrome layers 42', 44', 46', and 48', respectively, of reticle 3'. Dielectric layers 34'; 36', 38', and 40' are formed on the top surfaces of these attraction portions.

Figure 36:
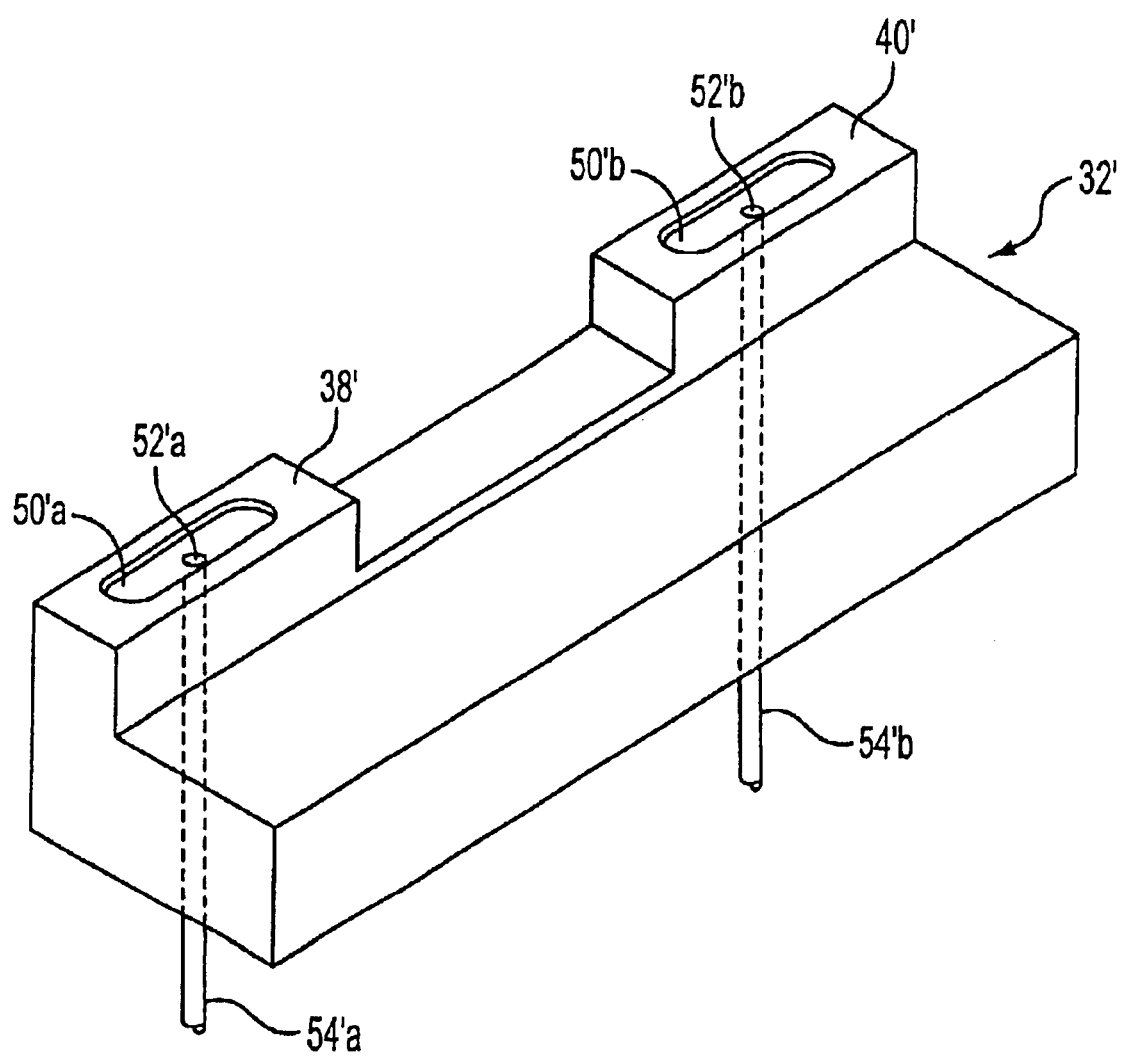
FIG. 36 is an oblique view showing the construction of a reticle holder used in the sixteenth embodiment.

FIG. 36 shows the construction of reticle holder.32'. Formed in the attraction portions on top of reticle holder 32' are elliptical recesses 50'a and 50'b, in the centers of which are formed suction holes 52'a and 52'b, respectively. Suction holes 52'a and 52'b are connected through conduits 54'a and 54'b to pressure control unit 58', shown in FIG. 37. Pressure control unit 58', which contains a compressor (not illustrated), is configured to draw air from suction holes 52'a and 52'b at a prescribed pressure. Pressure control unit 58'is controlled by reticle stage control unit 4'a. The drawing shows conduits 54'a and 54'b being routed to the outside of reticle holder 32' as separate conduits; but the two conduits may also be connected together inside reticle holder 32', or inside reticle stage 4', and routed to the outside as one conduit. The construction of reticle holder 30' is similar to that of reticle holder 32', and will not be described.

Figure 34:
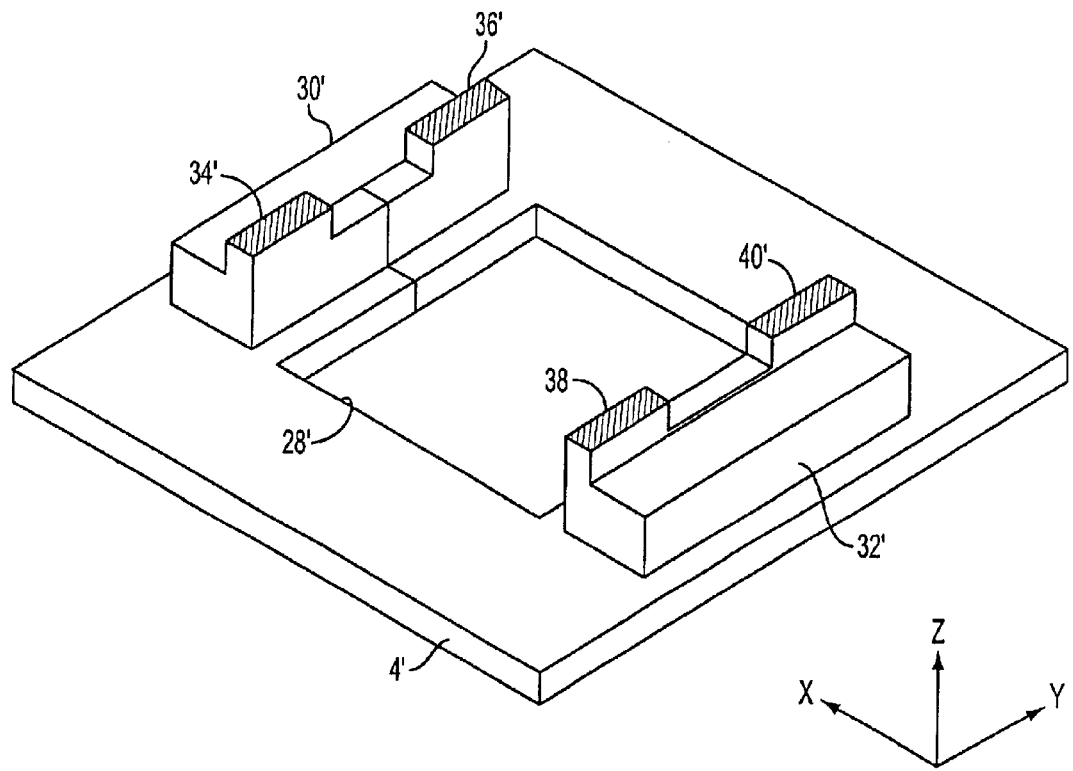
FIG. 34 is an oblique view showing the peripheral configuration of the reticle stage of the exposure apparatus in the sixteenth embodiment of the present invention.
Figure 35:
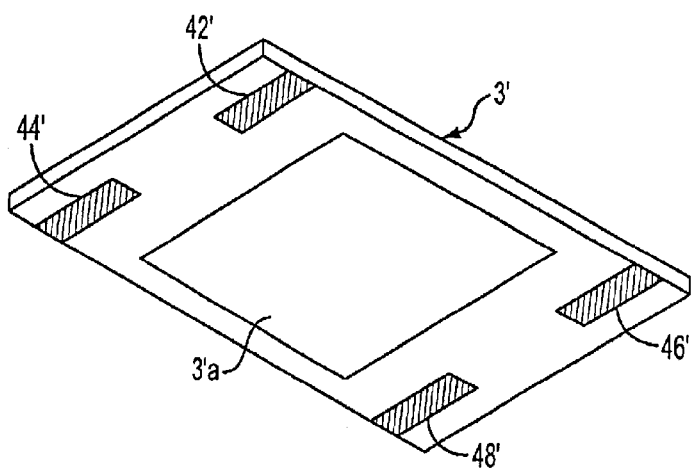
FIG. 35 is an oblique view showing the construction of the reticle used in the sixteenth embodiment.
Figure 37:
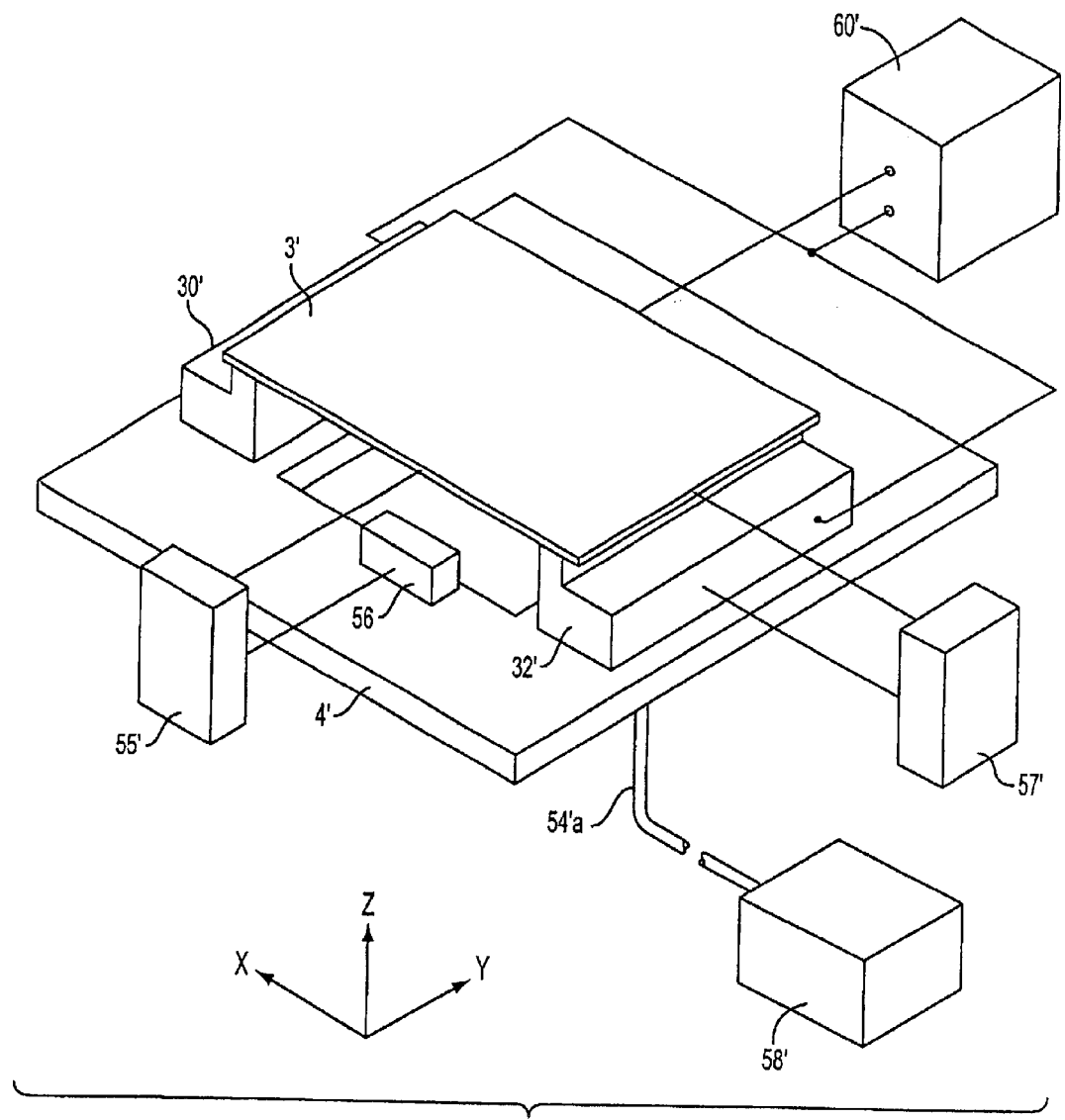
FIG. 37 is an oblique view showing the peripheral configuration of the reticle stage of the sixteenth embodiment mounted in the exposure apparatus of FIG. 33.

FIG. 37 shows reticle 3' loaded on the reticle holders shown in FIG. 34 (30' and 32'), along with its control system (55', 56', 57', 58', and 60'). Voltage control section 60' is connected to reticle holders 30' and 32', and to reticle 3', so as to apply prescribed voltages to the chrome layers on the back of reticle 3' (42', 44', 46', and 48'), and to the dielectric layers (34', 36', 38', and 40'). Application of voltage in this way creates static electricity between chrome layers 42', 44', 46', and 48' and dielectric layers 34', 36', 38', and 40', in a manner so as 'to attract reticle 3' to reticle holders 30' and 32'. Reticle 3' is additionally drawn to reticle holders 30' and 32' by suction created by the vacuum system described earlier (50'a, 50'b, 52'a, 52'b, 54'a, 54'b, 58', etc.).

As shown in FIG. 37, mirror 56' is affixed to reticle stage 4' at the outer rim (m the Y direction) of passage 28', so as to enable the Y-axis position of reticle 3', relative to reticle stage 4', to be measured by interferometer 55'. In interferometer 55', laser light is divided into two beams prior to being emitted. One of these beams (the upper one in FIG. 37) is directed at the side surface of reticle 3', and the other beam (the lower one), is directed at mirror 56'. The light reflected from the side of reticle 3' and mirror 56' is combined in interferometer 55', and the Y-axis position of reticle 3' relative to reticle stage 4' then determined, based on the state of interference between the two beams.

Similarly, an interferometer 57' is placed on the X side (–X side) of reticle stage 4' to measure the X axis position of reticle 3' relative to reticle stage 4'. In interferometer 57', laser light is divided into two beams and emitted. One of these beams (the upper one in FIG. 37) is directed at the side surface of reticle 3', and the other beam (the lower one), is directed at the side surface of reticle holder 32'. The light beams reflected from the side surfaces of reticle 3' and reticle holder 32' are combined in interferometer 57', and the X-axis position of reticle 3' relative to reticle stage 4' (reticle holder 32') then determined, based on the interference between the two beams. Because the applicable side surfaces of reticle 3' and reticle holder 32' are made to reflect a measurement laser, as described above, each of these surfaces must be processed to give them an extremely high degree of flatness.

When a reticle 3' is loaded on the reticle holders 30' and 32' of the sixteenth embodiment of the present invention configured as described above, reticle stage control unit 4' a controls pressure control section 58' and voltage control section 60' so as to cause reticle 3' to be held tightly against reticle holders 30' and 32' by vacuum-induced suction as well as by electrostatic attraction. That is, the compressor in pressure control section 58' draws air from between reticle 3' and reticle holders 30' and 32', into suction holes 52'a and 52'b of reticle holders 30' and 32', and through conduits 54'a and 54'b.

Also, voltage control section 60' applies the prescribed voltages to chrome layers 42', 44', 46', and 48', and dielectric layers 34', 36', 38', and 40', to create static electricity between chrome layers 42', 44', 46', and 48', and dielectric layers 34", 36', 38', and 40', such as to cause reticle 3' to be attracted to reticle holders 30' and 32' by static electricity. Thus in the present embodiment, because the conventional vacuum suction used to hold reticle 3' is augmented by electrostatic attraction, the holding force on reticle holders 30' and 32' is increased by that amount, and reticle 3' can therefore be held more tightly. The vacuum suction pressure can be reduced by the amount of the electrostatic attraction holding force, to thereby reduce the deformation of reticle 3' due to the force of the vacuum suction.

Figure 38:
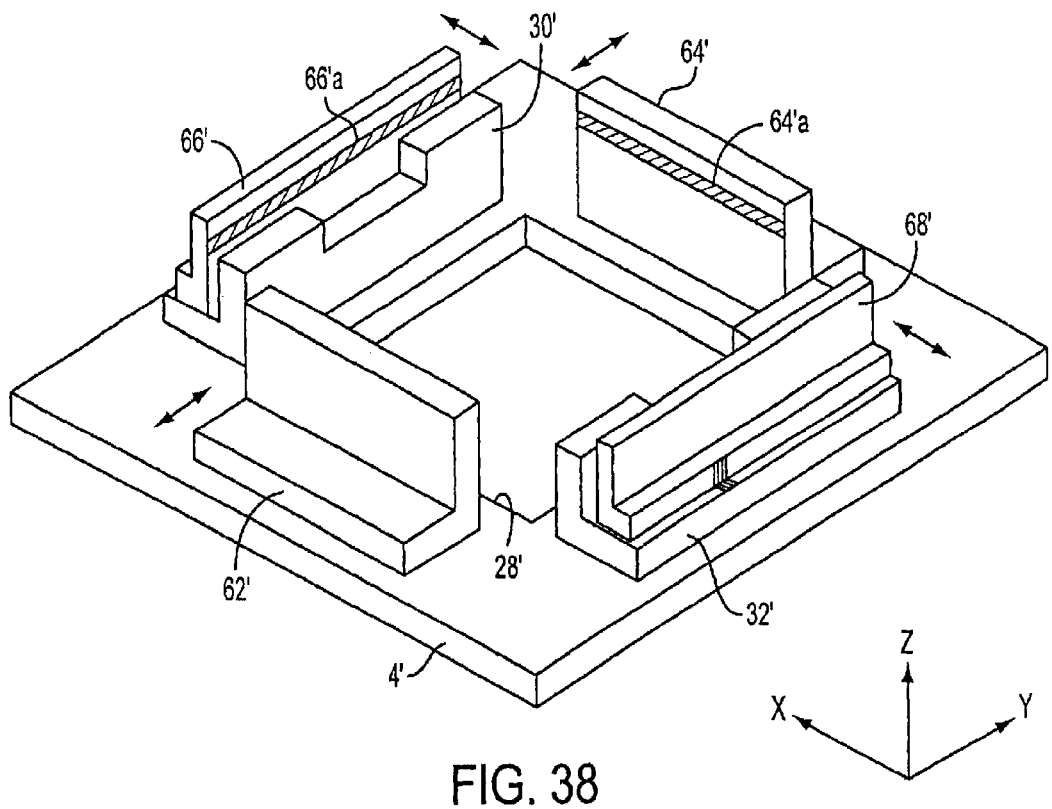
FIG. 38 is an oblique view showing the peripheral configuration of the reticle stage of the exposure apparatus in a seventeenth embodiment of the present invention.
Figure 39:
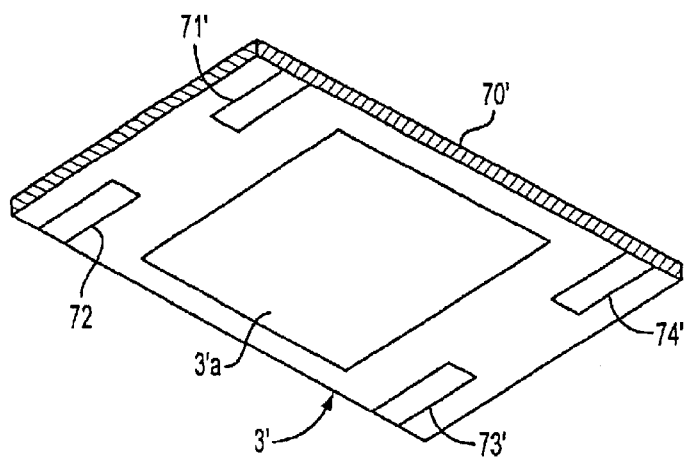
FIG. 39 is an oblique view showing the construction of the reticle used in the seventeenth embodiment.
Figure 40:
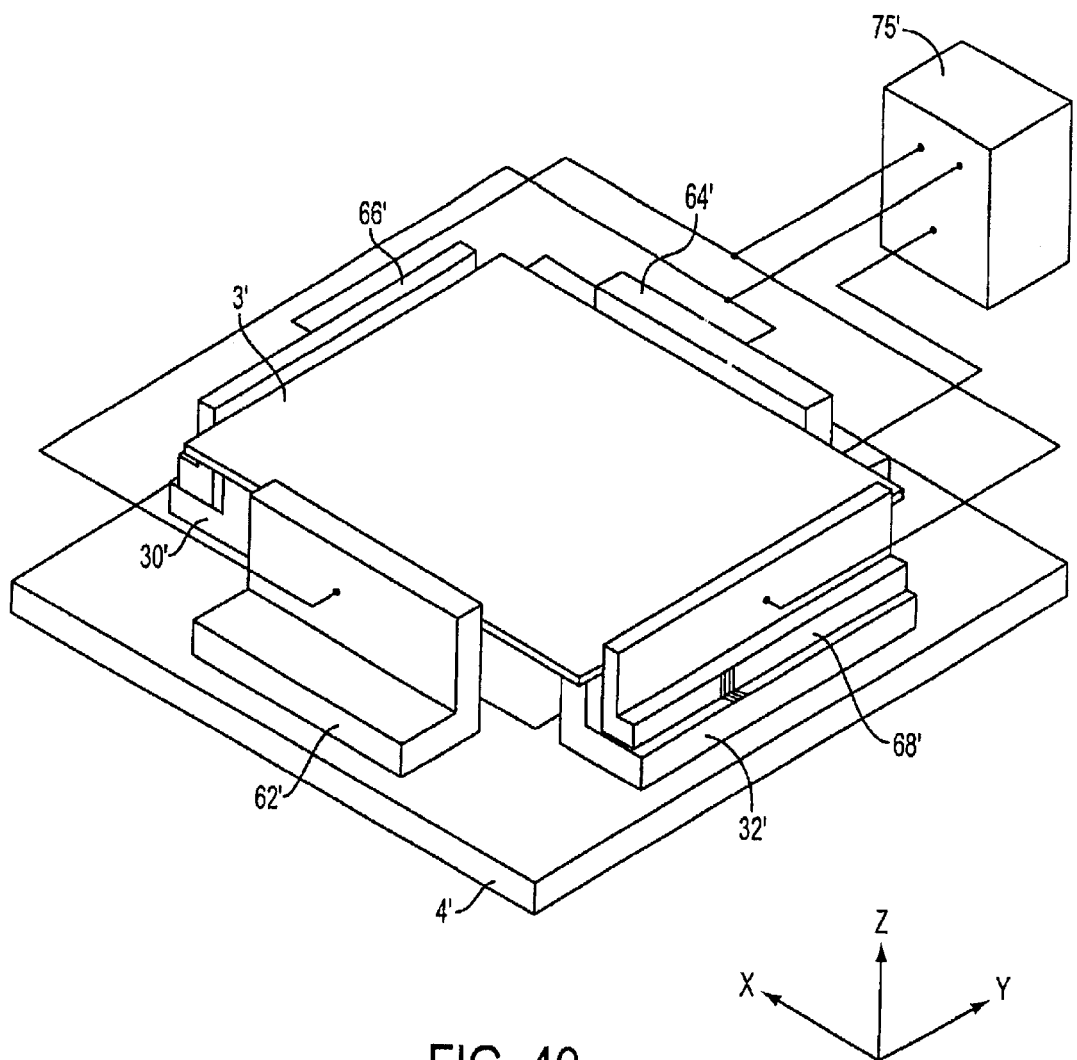
FIG. 40 is an oblique view showing the peripheral configuration of the reticle stage of the seventeenth embodiment mounted in the exposure apparatus of FIG. 33.

Next, the configuration of the reticle stage of a seventeenth embodiment of the present invention will be described, with reference to FIGS. 38, 39, and 40. FIG. 38 shows the peripheral configuration of reticle stage 4', and FIG. 39 shows the construction of a reticle 3' to be loaded on reticle stage 4'. In these drawings, the constituent elements of the configuration that are the same as, or correspond to, elements of the sixteenth embodiment, described above, will bear the same reference numbers, and will not be described again.

Four attraction members, 62', 64', 66', and 68' are placed on reticle stage 4' so as to surround passage 28'. Of these four, attraction members 62' and 64' are installed directly on reticle stage '4' in a manner so as to be movable in the Y-axis direction. The other two attraction members 66' and 68' are installed on the rear surfaces of reticle holders 30' and 32', respectively, in a manner so as to be movable in the X-axis direction.

Formed on the inner wall portions of attraction members 62', 64', 66', and 68', in positions corresponding to the side surfaces of reticle 3', are elongated dielectric layer strips. Two of these four dielectric layer strips, 64'a and 66'a, are shown in FIG. 38. Two similar dielectric strips, which are formed on attraction members 62' and 68', are not shown in FIG. 38.

A chrome layer 70' is formed over the entire area of the side surface of reticle 3', as shown in FIG. 39, for making contact with the dielectric layer strips (64'a, 66'a, etc.) on attraction members 62', 64', 66', and 68'. Formed on the bottom of, reticle 3', one in each corner, are contact areas 71' 72', 73', and 74', for making contact with reticle holders 30' and 32'. FIG. 40 shows a reticle 3' set in place on reticle holders 30' and 32'. A voltage control section 75' is connected to reticle 3' and attraction members 62', 64', 66", and 68' for applying prescribed voltages thereto.

In this embodiment, in order to set reticle 3' in place on reticle holders 30' and 32', first, with attractive members 62', 64', 66', and 68' retracted outward, reticle 3' is loaded onto reticle holders 30' and 32' by a given transport system. Next, attraction members 62', 64', 66', and 68' are moved inward until they contact the sides of reticle 3'. Then, voltage from control section 75' is applied to chrome layer 70' on the sides of reticle 3', and to the dielectric strips (including 64'a and 66'a) formed on attraction members 62', 64', 66', and 68'.

This creates static electricity between contact areas 71', 72', 73' and 74' and dielectric layers 34', 36', 38', and 40' (on reticle holders 30' and 32'), thus holding reticle 3', through reticle holders 30' and 32', on reticle stage 4'. The output voltage of voltage control section 75' can be adjusted according to the rate of movement of reticle stage 4'.

In the present embodiment, because the side surfaces of reticle 3' are held by electrostatic attraction, as described above, slipping of reticle 3' during exposure, due to the effect of its own inertia when reticle stage 4' is moved in the X-axis direction, can effectively be prevented. Also, the prevention of reticle 3' slippage during movement of reticle stage 4' can still be quite effective, even if Y-axis attraction members 62' and 64' are omitted, because the motion of reticle stage 4' is in the X-axis direction. Note that this embodiment may also be used in conjunction with the vacuum-suction mechanism of the above sixteenth embodiment.

Figure 41:
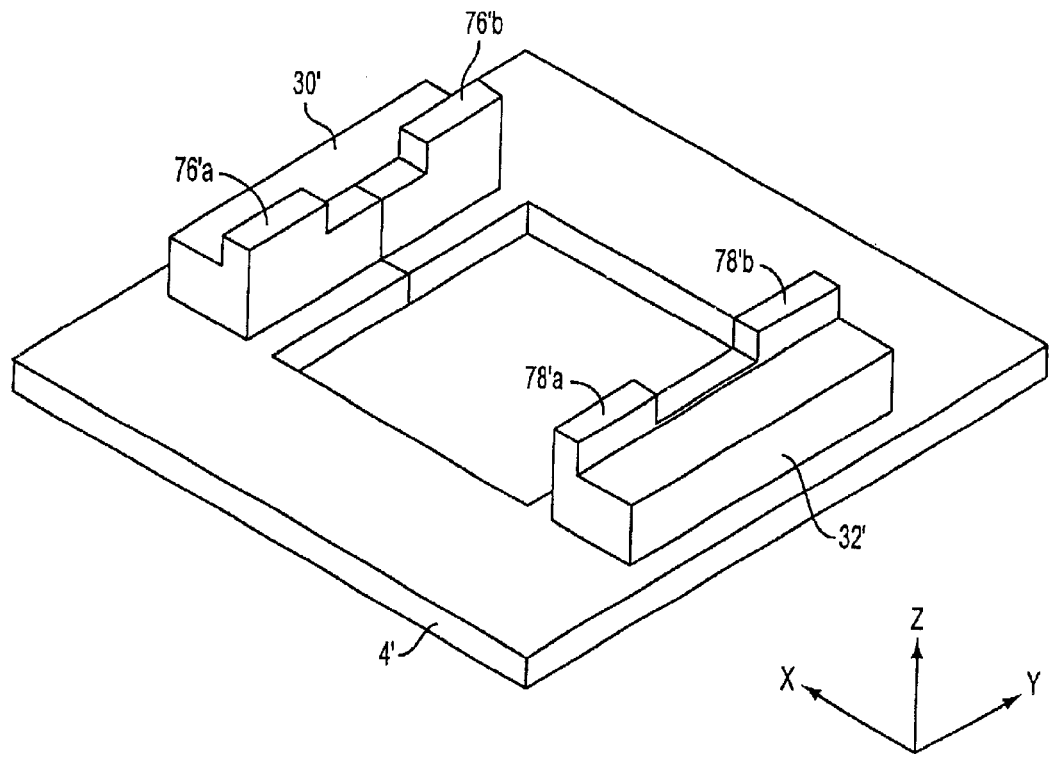
FIG. 41 is an oblique view showing the peripheral configuration of the reticle stage of the exposure apparatus in an eighteenth embodiment of the present invention.
Figure 42:
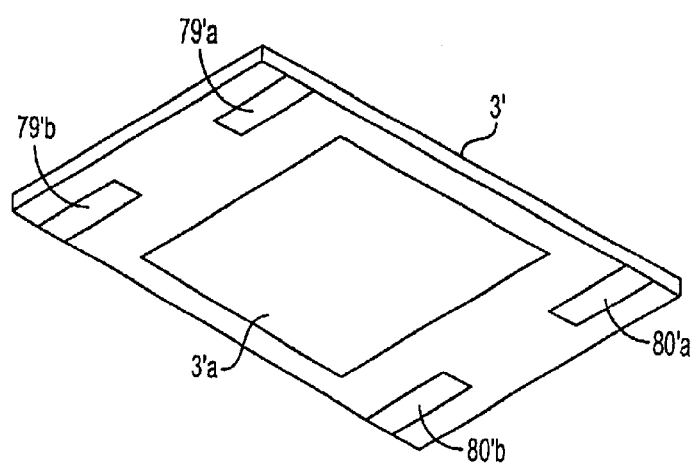
FIG. 42 is an oblique view showing the construction of the reticle used in the eighteenth embodiment.

Next, the configuration of the reticle stage of an eighteenth embodiment of the present invention will be described, with reference to FIGS. 41, 42, and 43. FIG. 41 shows the peripheral configuration of reticle stage 4', and FIG. 42 shows the construction of a reticle 3' to be loaded on reticle stage 4'. In these drawings, the constituent elements of the configuration that are the same as, or correspond to, elements of the previous embodiments described above will bear the same reference numbers, and will not be described again.

Formed on reticle holders 30' and 32' installed on reticle stage 4', are attraction surfaces 76'$a$, 76'$b$, 78'$a$, and 78'$b$, which have been subjected to a prescribed surfacing process. Also, formed on the bottom of reticle 3', in positions corresponding to those of attraction surfaces 76'$a$, 76'$b$, 78'$a$, and 78'$b$, on reticle holders 30' and 32', are attraction portions 79'$a$, 79'$b$, 80'$a$, and 80'$b$, which have also been subjected to a prescribed surfacing process. A ringing phenomenon occurs between attraction surfaces 76'$a$, 76'$b$, 78'$a$, and 78'$b$ of reticle holders 30' and 32' and attraction portions 79'$a$, 79'$b$, 80'$a$, and 80'$b$, of reticle 3'. The prescribed surfacing process is such that, for example, the coefficient of friction between corresponding surfaces is at least 0.25.

Figure 43:
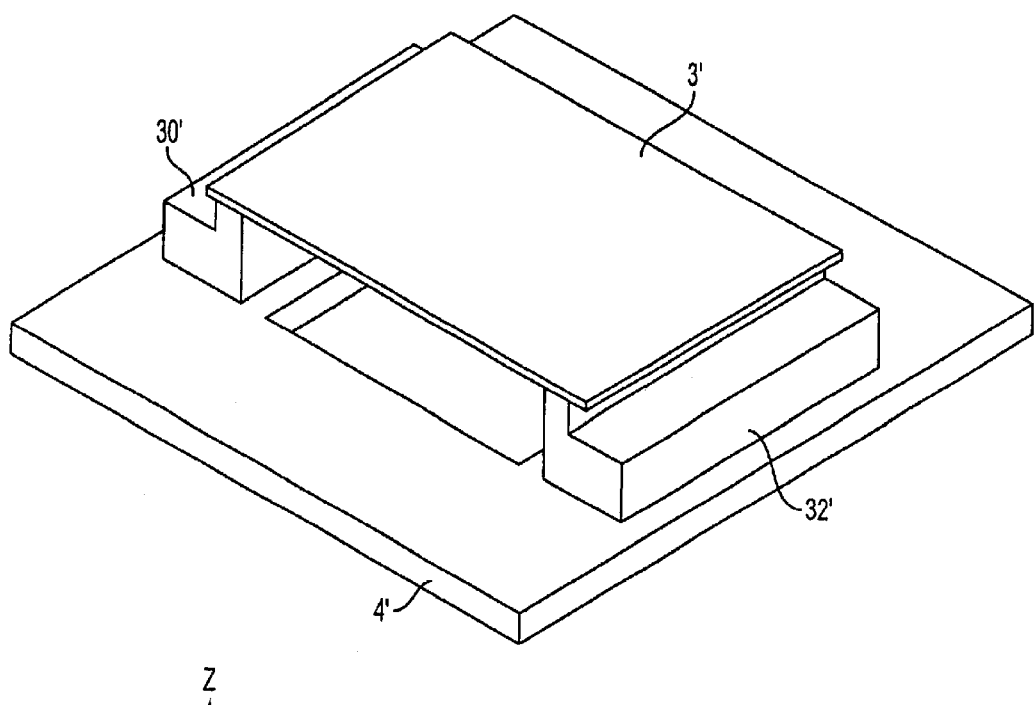
FIG. 43 is an oblique view showing the peripheral configuration of the reticle stage of the eighteenth embodiment mounted in the exposure apparatus of FIG. 33.
Figure 43:
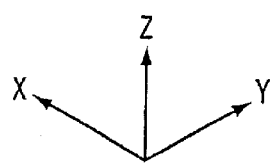

When reticle 3' is set in place on reticle holders 30' and 32', as shown in FIG. 43, reticle 3' is pressed down on holders 30' and 32' in a sliding motion, thus giving rise to a ringing phenomenon between the reticle and the holders. This action affixes reticle 3' to reticle holders 30' and 32'. According to this embodiment, the holding force acting on reticle 3' can be increased without adding anything in particular to the configuration. In this embodiment, it is preferable for the areas and coefficient of friction of attraction surfaces 76'$a$, 76'$b$, 78'$a$, and 78'$b$ of reticle holders 30' and 32', and of attraction portions 79'$a$, 79'$b$, 80'$a$, and 80'$b$, of reticle 3', to be adjusted as required.

Figure 44:
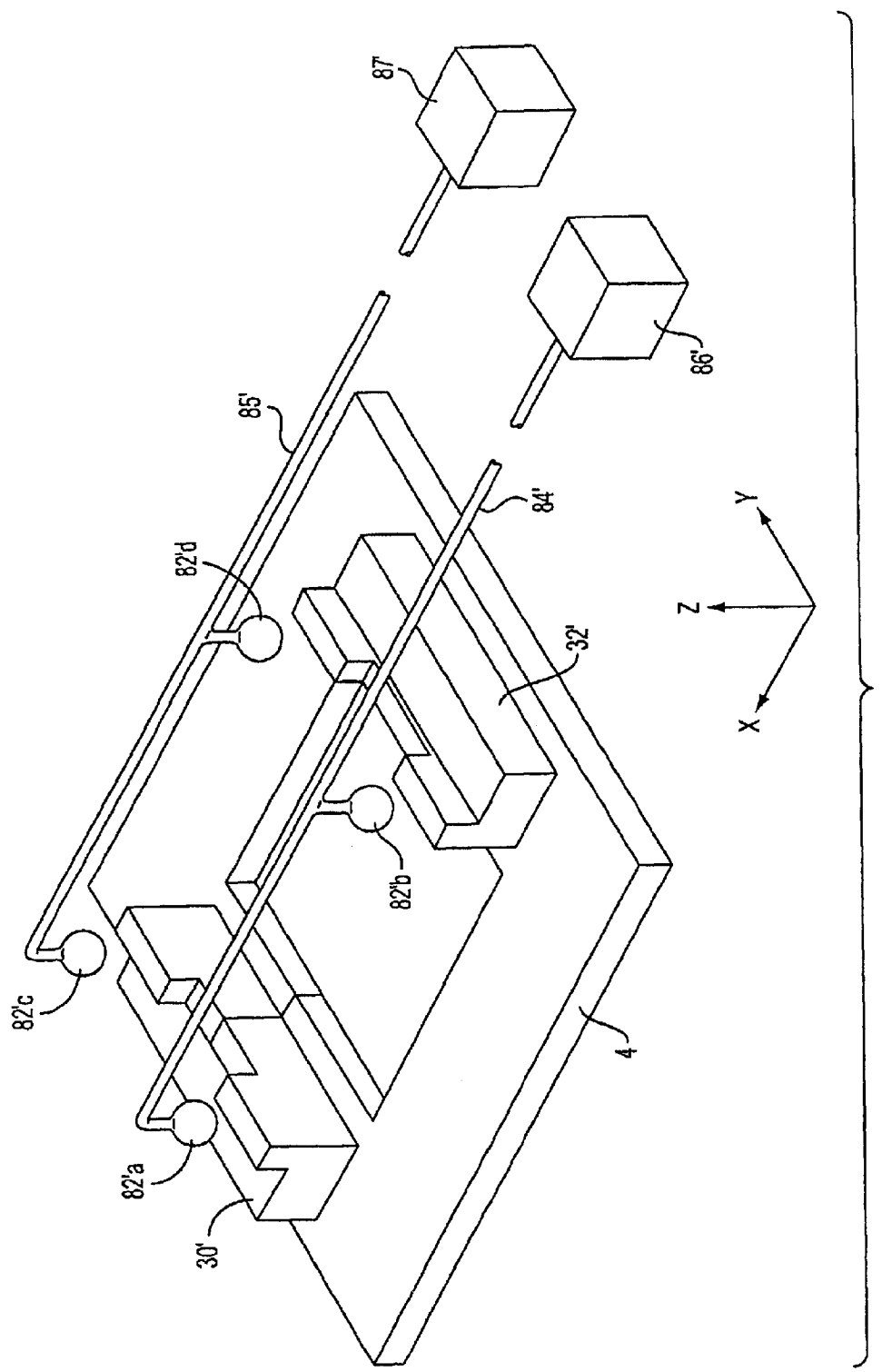
FIG. 44 is an oblique view showing the peripheral configuration of the reticle stage of the exposure apparatus in a nineteenth embodiment of the present invention.
Figure 45:
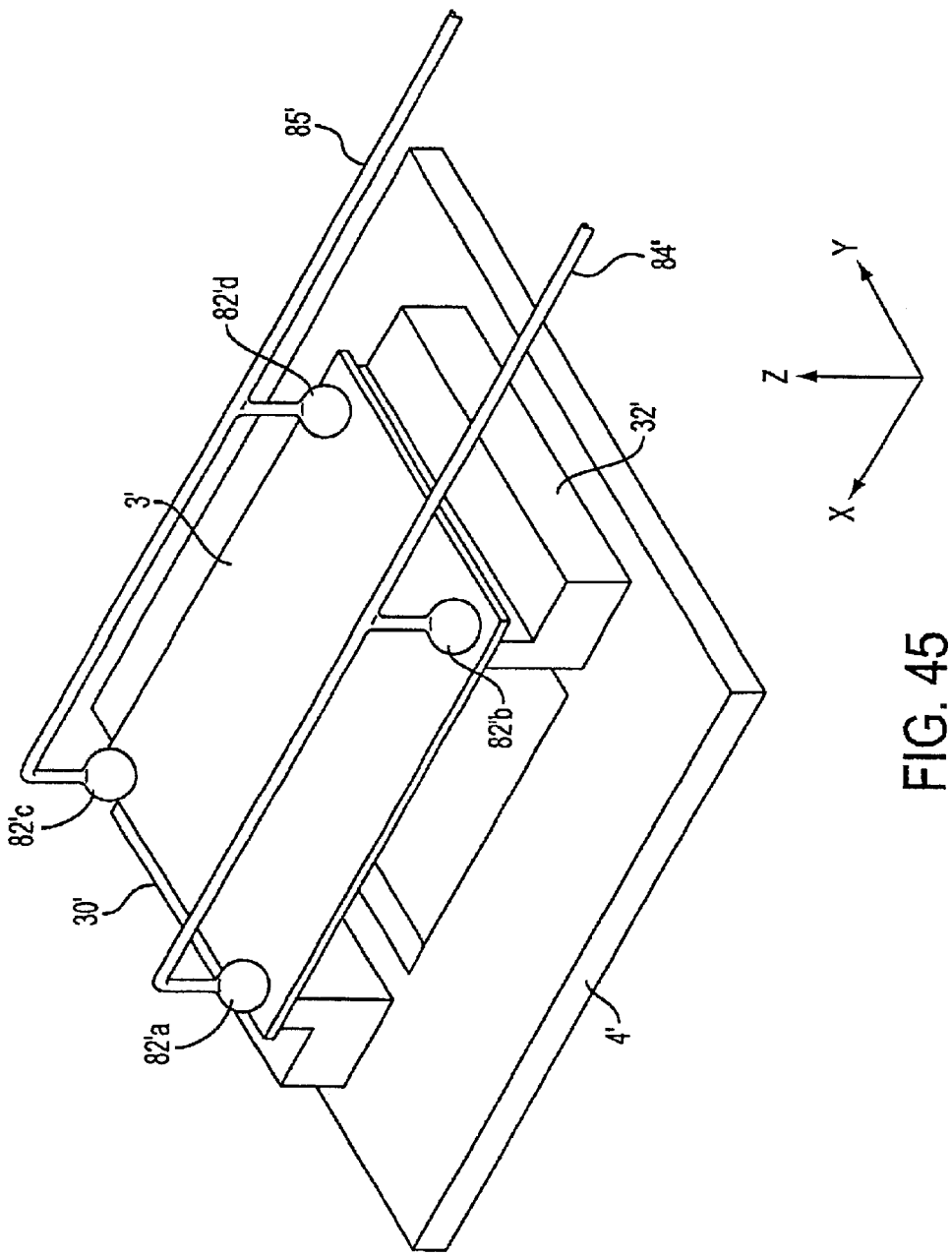
FIG. 45 is an oblique view showing the peripheral configuration of the reticle stage of the nineteenth embodiment mounted in the exposure apparatus of FIG. 33.

Next, the configuration of the reticle stage of a nineteenth embodiment of the present invention will be described, with reference to FIGS. 44 and 45. FIG. 44 shows the peripheral configuration of reticle stage 4' before it has a reticle 3' loaded thereon, while FIG. 45 shows the peripheral configuration of reticle stage 4' with. a reticle 3' already loaded. In these drawings, the constituent elements of the configuration that are the same as, or correspond to, elements of the previous embodiments described above, will bear the same reference numbers, and will not be described again.

Placed above reticle holders 30' and 32', are rubber balloons 82'$a$, 82'$b$, 82'$c$ and 82'$d$, which are used to hold reticle 3'. Of the four rubber balloons 82'$a$, 82'$b$, 82'$c$, and 82'$d$, rubber balloons 82'$a$ and 82'$b$ are connected through conduit 84' to pressure control section 86', while rubber balloons 82'$c$ and 82'$d$ are connected through conduit 85' to pressure control section 87'. Pressure control sections 86' and 87' adjust the pressure of the air (gas) supplied to their respective rubber balloons (82'$a$, 82'$b$, 82'$c$, and 82'$d$), so as to control the gas pressure according to the rate of movement of reticle stage 4'. Conduits 84' and 85' are configured to be movable in the Z-axis direction.

As shown in FIG. 45, in order to set reticle 3' in place on reticle holders 30' and 32', first, with conduits 84' and 85' raised above reticle holders 30' and 32' in a standby state, reticle 3' is loaded onto reticle holders 30' and 32'. Next, conduits 84' and 85' are lowered until rubber balloons 82'$a$, 82'$b$, 82'$c$, and 82'$d$ make good contact with reticle 3'. Then air, at a prescribed pressure, is supplied to rubber balloons 82'$a$, 82'$b$, 82'$c$, and 82'$d$ from pressure control sections 86' and 87', to form rubber balloons 82'$a$, 82'$b$, 82'$c$, and 82'$d$ into a condition in which they are pressing down from above onto reticle 3'. In this condition, control over the force being applied to reticle 3' is performed by adjusting the pressure of the air being supplied by pressure control sections 86' and 87', as well as the vertical positioning of conduits 84' and 85'.

According to this embodiment as described above, it is possible to control the reticle 3' holding force as a gradient (rather than in steps) according to the thickness of reticle 3' and the rate of movement of reticle stage 4'. Also, although rubber balloons are used in this embodiment, other means such as air cylinders could be substituted for the balloons. Also, instead of a gas such as air, reticle 3' could also be held utilizing the pressure of a fluid (liquid).

Figure 46:
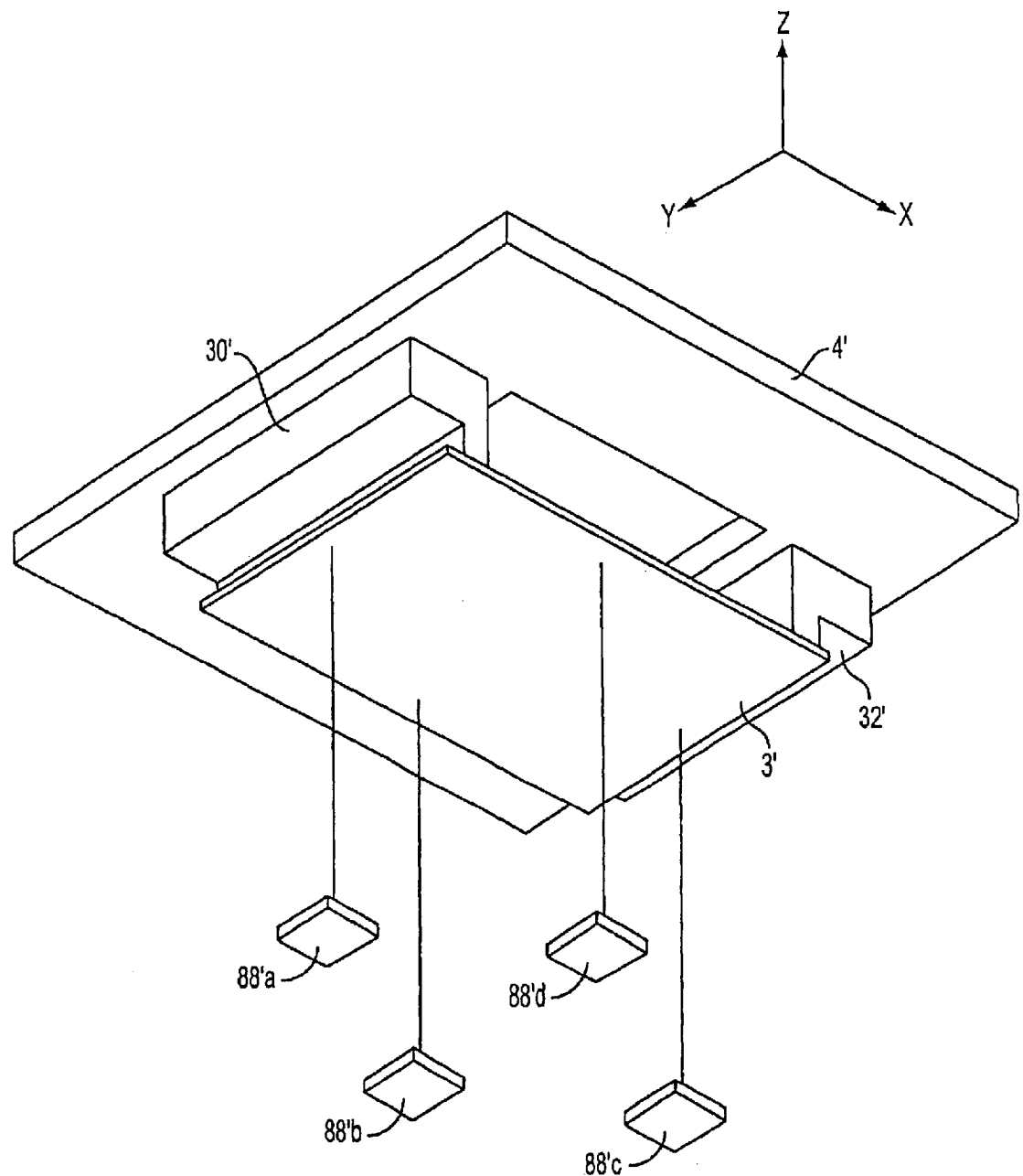
FIG. 46 is an oblique view showing the configuration of a measurement system capable of being used in the sixteenth through nineteenth embodiments.

FIG. 46 shows a sensor arrangement, capable of being used in any of the above embodiments, for measuring variations in the shape of reticle 3'. Constituent elements of the configuration shown in this drawing that are the same as, or correspond to, elements of any of the above embodiments bear the same reference numbers, and will not be described again. FIG. 46 shows a reticle 3' being held to reticle stage 4' from below. In. this drawing, items 88'$a$, 88'$b$, 88'$c$, and 88'$d$ are sensors used to measure the position, in the Z-axis direction, of prescribed locations on the rear surface of reticle 3'.

Prior to performing an exposure, the reticle 3' is placed and held in position on reticle holders 30' and 32' using any one of the methods of the embodiments described above. Then sensors 88'$a$, 88'$b$, 88'$c$, and 88'$d$ are placed on the rear surface of reticle 3' and, as mentioned above, the distance between each of the sensors and its corresponding location on the rear surface of reticle 3' is measured by sensors 88'$a$, 88'$b$, 88'$c$ and 88'd. Next, based on these measurements, the change in position in the X, Y, and Z directions of each reticle 3' measurement point is computed.

Once the measurement is finished, sensors 88'$a$, 88'$b$, 88'$c$, and 88'$d$ are retracted outside the perimeter of reticle 3'. Then after an alignment of reticle 3' is performed, based on the reticle 3' X, Y, and Z position data computed earlier, reticle 3' is illuminated with exposure light IL', to start the exposure. Thus the accuracy of reticle 3' alignment can be improved by measuring the change in the position of reticle 3' in the loaded and held state, using sensors 88'$a$, 88'$b$, 88'$c$, and 88'$d$, and then performing the reticle 3' alignment based on those measurements.

Figure 47:
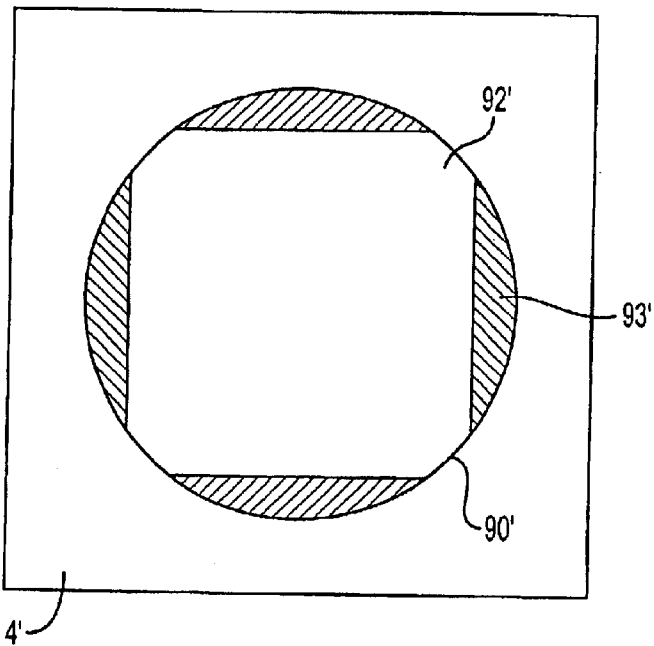
FIG. 47 is a plan view showing an example of another reticle specimen capable of being used in the apparatus incorporating the principles of the present invention.
Figure 48:
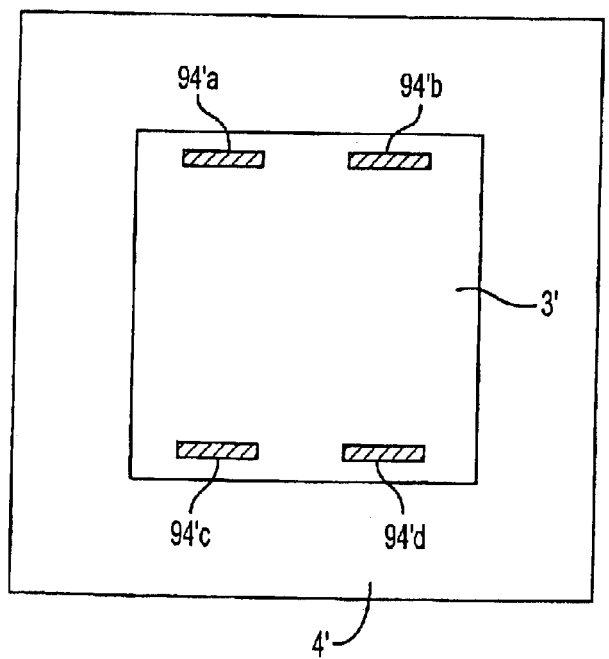
FIG. 48 is a plan view showing the configuration of a reticle specimen capable of being used in the apparatus incorporating the principles of the present invention and also in the past.

FIG. 47 shows the configuration of a circular reticle 90' that may be used in the apparatus incorporating the principles of the present invention. With circular reticle 90', the area of contact between the reticle holder and the reticle can be much larger than with the rectangular reticle 3' as shown in FIG. 48. Provided in circular reticle 90', are a pattern area 92', the center portion of the reticle, in which the pattern is formed, and attraction area 93', the area outside of pattern area 92'. On the other hand, in the rectangular reticle 3' of FIG. 48, it is difficult to devote much area to attraction areas 94'a, 94'b, 94'c, and 94'd, because they are formed in the corners of reticle 3'. By using the circular reticle 90' shown in FIG. 47 in the sixteenth embodiment shown in FIGS. 34 through 37, for example, the reticle-holding force can be increased by electrostatic attraction alone, thus eliminating the need for the vacuum-suction mechanism.

Although various embodiments of the present invention have been described above, the invention is not limited to these examples, but can be embodied in a variety of variations without departing from the scope of the technical concepts that form the gist of the invention as recited in the claims.

What is claimed is:

1. A holding apparatus which holds a mask in a light exposure apparatus, the mask containing a pattern to be transferred onto a substrate by illuminating the pattern with an illumination light, and the light exposure apparatus being a scanning-type apparatus that moves the mask in a scanning direction of travel perpendicular to an optical axis of the illumination light while the mask pattern is illuminated by the illumination light, the holding apparatus comprising:
   a mask holder which holds the mask, wherein the mask holder travels in a direction perpendicular to the optical axis;
   a vacuum adhesion device which generates a vacuum adhesion force between the mask and the mask holder, wherein the mask is adhered to the mask holder by the vacuum adhesion force; and
   an external force supplying system, which supplies an external force to the mask in order to maintain a predetermined positional relationship between the mask and the mask holder, wherein the external force is different from the vacuum adhesion force, wherein the external force effects to the mask in a direction perpendicular to the scanning direction to a formation surface of the mask pattern formed on the mask, and wherein the mask is held on the mask holder by a holding force including the vacuum adhesion force and the external force.

2. The apparatus as set forth in claim 1, wherein said external force supplying system is electrically activated.

3. The apparatus as set forth in claim 2, wherein the force applied by said external force supplying system is an electrostatic attractive force that secures the mask to said mask holder by applying a predetermined voltage there between.

4. The apparatus as set forth in claim 3, further including a chrome portion provided on a surface of the mask and contacting said mask holder.

5. The apparatus as set forth in claim 4, wherein said chrome portion is provided on a side of the mask making contact with said mask holder.

6. The apparatus as set forth in claim 4, further including an electric portion provided on said mask holder making contact with said chrome portion.

7. The apparatus as set forth in claim 1, wherein the force applied by said external force supplying system is a compressive force applied, from above, to an upper side portion of the mask.

8. The apparatus as set forth in claim 7, further including an airtight member to form an airtight space between the mask and said mask holder.

9. The apparatus as set forth in claim 8, wherein said external force supplying system applies the force to the mask by controlling the air pressure within said airtight member.

10. The apparatus as set forth in claim 9, wherein said external force supplying system applies the force to the mask as a compressing force as a fluid to a portion of the mask other than a portion in which the pattern is formed.

11. The apparatus as set forth in claim 10, wherein the fluid is a gas and the compressive force is adjusted by controlling pressure of the gas.

12. A scanning exposure apparatus which exposes the substrate with the pattern formed on the mask, wherein the scanning exposure apparatus has the holding apparatus according to claim 1.

13. The apparatus as set forth in claim 1, wherein said external force effects to said mask from an upper side of the surface of the mask.

14. The apparatus as set forth in claim 1, wherein said external force is able to be controlled based on information regarding a mask thickness or information regarding a moving velocity of the mask holder.

15. The apparatus as set forth in claim 14, wherein said external force is a compressive force, and the compressive force is able to be controlled by adjusting a pressure of the air.

16. The apparatus as set forth in claim 14, wherein said external force is able to be controlled by adjusting a position of said external force supplying system in a direction of the optical axis of the illumination light.

17. A scanning-exposure method for transferring a pattern formed on a mask onto a substrate by illuminating the pattern with an illumination light, and for moving the mask in a scanning direction of travel perpendicular to an optical axis of the illuminating light, the scanning exposure method comprising:
   generating a vacuum adhesion force between the mask and a mask holder that holds the mask;
   applying an external force to the mask, wherein the external force is different from the vacuum adhesion force, and wherein the external force effects to the mask in a direction perpendicular to the scanning direction to a formation surface of the mask pattern formed on the mask; and
   moving the mask holder in the scanning direction of travel perpendicular to the optical axis when the mask is held on the mask holder by a holding force including the vacuum adhesion force and the external force.

18. The method as set forth in claim 17, further including generating the external force by electrical activation from an external force generating member disposed on the mask holder.

19. The method as set forth in claim 17, wherein said applying an external force applies the external force as an electrostatic attraction force.

20. The method as set forth in claim 17, wherein said applying an external force applies the external force as a compressive force.

21. A method for manufacturing a device including transferring a device-pattern formed on a mask onto a substrate of the device using the scanning-exposure method as set forth in claim 17.

22. The method as set forth in claim 17, wherein said external force is able to be controlled based on information regarding a mask thickness or information regarding a moving velocity of the mask holder.

23. The method as set forth in claim 22, wherein said external force is a compressive force, and the compressive force is able to be controlled by adjusting a pressure of the air.

24. A holding apparatus which holds a mask in an exposure apparatus, the mask containing a pattern to be transferred onto a substrate by illuminating the pattern with an illumination beam, and the exposure apparatus being a scanning-type apparatus that moves the mask in a scanning direction of travel perpendicular to an optical axis of the illumination beam while the mask pattern is illuminated by the illumination beam, the holding apparatus comprising:

a mask holder which holds the mask, wherein the mask holder travels in a direction perpendicular to the optical axis;

an electrostatic attraction device which generates an electrostatic attraction force between the mask and the mask holder, wherein the mask is adhered to the mask holder by the electrostatic attraction force; and an external force supplying system, which supplies an external force to the mask in order to maintain a predetermined positional relationship between the mask and the mask holder, wherein the external force is different from the electrostatic attraction force and the mask is held on the mask holder by a holding force including the electrostatic attraction force and the external force.

25. The apparatus as set forth in claim 24, wherein said external force effects to the mask in a direction perpendicular to the scanning direction to a formation surface of the mask pattern on the mask.

26. The apparatus as set forth in claim 25, wherein said external force effects to said mask from an upper side of the surface of the mask.

27. The apparatus as set forth in claim 25, wherein said external force is a compressive force applied, from above, to an upper side portion of the mask.

28. The apparatus as set forth in claim 24, wherein said external force is able to be controlled based on information regarding a mask thickness or information regarding a moving velocity of the mask holder.

29. The apparatus as set forth in claim 28, wherein said external force is a compressive force, and the compressive force is able to be controlled by adjusting a pressure of the air.

30. The apparatus as set forth in claim 28, wherein said external force is able to be controlled by adjusting a position of said external force supplying system in a direction of the optical axis of the illumination beam.

31. A scanning exposure apparatus which exposes a substrate with a pattern formed on a mask, wherein the scanning exposure apparatus has a holding apparatus according to claim 24.

32. A scanning-exposure method for transferring a pattern formed on a mask onto a substrate by illuminating the pattern with an illumination beam, and for moving the mask in a scanning direction of travel perpendicular to an optical axis of the illuminating beam, the scanning exposure method comprising:

generating an electrostatic attraction force between the mask and a mask holder that holds the mask;

applying an external force to the mask, wherein the external force is different from the electrostatic attraction force; and moving the mask holder in the scanning direction of travel perpendicular to the optical axis when the mask is held on the mask holder by a holding force including the electrostatic attraction force and the external force.

33. The method as set forth in claim 32, wherein said external force effects to the mask in a direction perpendicular to the scanning direction to a formation surface of the mask pattern on the mask.

34. The method as set forth in claim 32, wherein said external force is a compressive force applied, from above, to an upper side portion of the mask.

35. The method as set forth in claim 32, wherein said external force is able to be controlled based on information regarding a mask thickness or information regarding a moving velocity of the mask holder.

36. A holding apparatus which holds a mask in an exposure apparatus, the mask containing a pattern to be transferred onto a substrate by illuminating the pattern with an illumination beam, and the exposure apparatus being a scanning-type apparatus that moves the mask in a scanning direction of travel perpendicular to an optical axis of the illumination beam while the mask pattern is illuminated by the illumination beam, the holding apparatus comprising:

a mask holder which holds the mask, wherein the mask holder travels in a direction perpendicular to the optical axis;

a adhesion device which generates an adhesion force between the mask and the mask holder, wherein the mask is adhered to the mask holder by the adhesion force; and an external force supplying system, which supplies an external force to the mask in order to maintain a predetermined positional relationship between the mask and the mask holder, wherein the external force is different from the adhesion force, wherein the external force effects to the mask in a direction perpendicular to the scanning direction to a formation surface of the mask pattern formed on the mask, and wherein the mask is held on the mask holder by a holding force including the adhesion force and the external force.

37. A scanning-exposure method for transferring a pattern formed on a mask onto a substrate by illuminating the pattern with an illumination beam, and for moving the mask in a scanning direction of travel perpendicular to an optical axis of the illuminating beam, the scanning exposure method comprising:

generating an adhesion force between the mask and a mask holder that holds the mask;

applying an external force to the mask, wherein the external force is different from the adhesion force, and wherein the external force effects to the mask in a direction perpendicular to the scanning direction to a formation surface of the mask pattern formed on the mask; and moving the mask holder in the scanning direction of travel perpendicular to the optical axis when the mask is held on the mask holder by a holding force including the adhesion force and the external force.

* * * * *